US 006728129B2

(12) United States Patent
Lindsey et al.

(10) Patent No.: US 6,728,129 B2
(45) Date of Patent: Apr. 27, 2004

(54) MULTISTATE TRIPLE-DECKER DYADS IN THREE DISTINCT ARCHITECTURES FOR INFORMATION STORAGE APPLICATIONS

(75) Inventors: Jonathan S. Lindsey, Raleigh, NC (US); David F. Bocian, Riverside, CA (US); Karl-Heinz Schweikart, Nevbulach (DE); Werner G. Kuhr, Oak Hills, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/079,938

(22) Filed: Feb. 19, 2002

(65) Prior Publication Data

US 2003/0169618 A1 Sep. 11, 2003

(51) Int. Cl.[7] .............................................. G11C 11/00
(52) U.S. Cl. ...................................... 365/151; 365/173
(58) Field of Search ................................ 365/151, 106, 365/153, 173

(56) References Cited

U.S. PATENT DOCUMENTS

| | | |
|---|---|---|
| 3,637,581 A | 1/1972 | Horiguchi et al. |
| 3,833,894 A | 9/1974 | Aviram et al. |
| 4,618,509 A | 10/1986 | Bulkowski |
| 4,663,270 A | 5/1987 | Potember et al. |
| 4,670,860 A | 6/1987 | Wilson |
| 4,728,724 A | 3/1988 | Jones et al. |
| 4,781,443 A | 11/1988 | Giles |
| 5,010,451 A | 4/1991 | Ueyama et al. |
| 5,016,063 A | 5/1991 | Beratan et al. |
| 5,035,835 A | 7/1991 | Asakawa et al. |
| 5,063,417 A | 11/1991 | Hopfield |
| 5,075,738 A | 12/1991 | Matsuda et al. |
| 5,091,502 A | 2/1992 | Narang et al. |
| 5,135,537 A | 8/1992 | Lamb |

(List continued on next page.)

FOREIGN PATENT DOCUMENTS

| | | |
|---|---|---|
| EP | 0 272935 A3 | 6/1988 |
| EP | 0 307210 A2 | 3/1989 |
| EP | 0 307211 A2 | 3/1989 |
| EP | 0 363147 A2 | 4/1990 |
| WO | WO 99/24527 A1 | 5/1999 |
| WO | WO 01/03126 A2 | 1/2001 |

OTHER PUBLICATIONS

"Ferrocene—Molecule of the Month" Jun. 1996, University of Oxford Web Page, http://www.ncl.ox.ac.uk/mom/ferrocene/ferrocene2.html.

"Ferrocene—Synthesis", Jun. 1996, University of Oxford Web Page, http://www.ncl.ox.ac.uk/mom/ferrocene/synthesis.html.

Ball et al. (2000) "Electrochemistry in Nanovials Fabricated by Combining Screen Printing and Laser Micromachining" Anal. Chem. 72: 497–501.

(List continued on next page.)

Primary Examiner—Thong Q. Le
(74) Attorney, Agent, or Firm—Tom Hunter; Quine Intellectual Property Law Group, P.C.

(57) ABSTRACT

This invention provides novel high density memory devices that are electrically addressable permitting effective reading and writing, that provide a high memory density (e.g., $10^{15}$ bits/cm$^3$), that provide a high degree of fault tolerance, and that are amenable to efficient chemical synthesis and chip fabrication. The devices are intrinsically latchable, defect tolerant, and support destructive or non-destructive read cycles. In a preferred embodiment, the device comprises a fixed electrode electrically coupled to a storage medium having a multiplicity of different and distinguishable oxidation states wherein data is stored in said oxidation states by the addition or withdrawal of one or more electrons from said storage medium via the electrically coupled electrode. The storage medium typically comprises a storage molecule that is a triple-decker sandwich heterodimer. Such dimers can provide 8 or more oxidation states and permit the storage of at least 3 bits per molecule.

99 Claims, 33 Drawing Sheets

U.S. PATENT DOCUMENTS

| | | | |
|---|---|---|---|
| 5,222,060 A | 6/1993 | Kuroda et al. | |
| 5,252,698 A | 10/1993 | Bhardwaj et al. | |
| 5,264,876 A | 11/1993 | Kawade et al. | |
| 5,280,183 A | 1/1994 | Batzel et al. | |
| 5,312,896 A | 5/1994 | Bhardwaj et al. | |
| 5,432,379 A | 7/1995 | Eguchi et al. | |
| 5,434,842 A | 7/1995 | Weiss et al. | |
| 5,463,014 A | 10/1995 | Epstein et al. | |
| 5,475,075 A | 12/1995 | Brant et al. | |
| 5,506,420 A | 4/1996 | Kossovsky et al. | |
| 5,525,811 A | 6/1996 | Sakurai et al. | |
| 5,539,100 A | 7/1996 | Wasielewski et al. | |
| 5,547,774 A | 8/1996 | Gimzewski et al. | |
| 5,707,845 A | 1/1998 | Ueyama et al. | |
| 5,744,598 A | 4/1998 | Skalkos et al. | |
| 5,804,850 A | 9/1998 | Evans, Jr. et al. | |
| 5,814,420 A | 9/1998 | Chu | |
| 5,840,443 A | 11/1998 | Gregg et al. | |
| 5,844,055 A | 12/1998 | Brandt et al. | |
| 5,858,666 A | 1/1999 | Weiss | |
| 6,013,170 A | 1/2000 | Meade | |
| 6,031,756 A | 2/2000 | Gimzewski et al. | |
| 6,128,214 A | 10/2000 | Kuekes et al. | |
| 6,208,553 B1 | 3/2001 | Gryko et al. | |
| 6,212,093 B1 * | 4/2001 | Lindsey | 365/151 |
| 6,272,038 B1 | 8/2001 | Clausen et al. | |
| 6,324,091 B1 | 11/2001 | Gryko et al. | |
| 6,381,169 B1 | 4/2002 | Bocian et al. | |
| 6,451,942 B1 * | 9/2002 | Li et al. | 526/258 |

OTHER PUBLICATIONS

Bansal et al. (1998) "Electrochemical Properties of (111)–Oriented n–Si Surfaces Derivatized and Covalently–Attached Alkyl Chains" J. Phys. Chem. 102:7:1067–1070.

Bateman et al. (1998) Alkylation of Porous Silicon by Direct Reaction with Alkenes and Alkynes Angew. Chem. Int. Ed. 37:19:2683–2685.

Boukherroub et al. (1999) "Controleed Functionalization and Multistep Chemical Manipulation of Covalently Modified Si(111) Surfaces" J. Am. Chem. Soc. 21: 11513–11515.

Bratten et al. (1997) Micromachining Sensors for Electrochemical Measurement in Subnanoliter vols. Anal. Chem. 69: 253–259.

Buchler and Ng (2000) In *The Porphyrin Handbook, vol. 3*, pp. 245–294, Eds. K. M. Kadish, K. M. Smith, R. Guilard, Academic Press, San Diego, CA.

Buriak et al. (1998) "Lewis Acid Mediated Functionalization of Porous Silicon with Substituted Alkeses and Alkynes" J. Am. Chem. Soc. 120: 1339–1340.

Chabach et al. (1996) "Mixed–Metal Triple–Decker Sandwich Complexes with the Porphyrin/Phthalocynine/Porphyrin Ligand System" Angew. Chem. Int. Ed. Engl., 35: 898.

Clausen et al. (2000) Investigation of Tightly Coupled Porphyrin Arrays Comprised of Identical Monomers for Multibit Information Storage J. Org. Chem. 65: 7371–7378.

Cleland et al. (1995) "Direct Functionalization of Silicon via the Self–Assembly of Alchols" J. Chem. Soc. Faraday Trans. 91(21) 4001–4003.

Clark et al. (1997) "Electrochemical Analysis in Picoliter Microvials" Anal. Chem. 69: 259–263.

Clark et al. (1998) "Characterization of Electrochemical Responses in Picoliter vols." Anal. Chem. 70: 1119–1125.

Collier et al. (1999) "Electronically Configurable Molecular–Based Logic Gates" Science 265: 391–394.

Cotton et al (1976) Basic Inorganic Chemistry, pp. 125, 497, 518.

Coulter et al. (2000) "Reactions of Substituted Aromatic Hydrocarbons with the Si(001)Surface" J. Vac. Sci. Technol. A 18(4) 1965–1970.

Duchowski et al. (1990) Spectroscopic Characterization of Triple Decker Lanthanide Porphyrin Sandwich Complexes. Effects of Strong $\pi\pi$ Interactions in Extended Assemblies J Am. Chem. Soc. 112: 8807–8811.

Gavin et al. (1996) "Continuous Separations with Microfabricated Electrophoresis–Electrochemical Array Detection" J. Am Chem. Soc. 118: 8932–8936.

Gorman (1997) "Encapsulated Electroactive Molecules" Adv. Mater. 9(14) 1117–1119.

Gorman (1999) "Molecular Structure–Property Relationships for Electron–Transfer Rate Attenuation in Redox–Active Core Dendrimers" J. Am. Chem. Soc. 121: 9958–9966.

Gross (2001) "Investigation of Rational Synthesis of Heteroleptic Porphyrinic Lanthanide (Europium, Cerium) Triple–Decker Sandwich Complexes" Inorg. Chem. 40: 4762–4774.

Gryko (2000) "Synthesis of Porphyrin–Linker–Thiol Molecules with Diverse Linkers for Studies of Molecular–Based Information Storage" J. Org. Chem. 65: 7345–7355.

Gryko (2000) "Synthesis of Thiol–Derivatized Ferrocene–Porphrins for Studies of Multibit Information Storage" J. Org. Chem. 65: 7356–7362.

Gryko (2001) "Studies Related to the Design and Synthesis of a Molecular Octal Counter" J. Mater. Chem. 11: 1162–1180.

Hyde (1985) "Ellipsometric Measurements of the Pt–Aqueous Electrolyte Interface, in the Absence and in the Presence of Specific Anionic Adsorption" J. Electroanal. Chem. 186: 267–286.

Jiang et al. (1998) "Heteroleptic Triple–Decker (Phthalocyaninato)–Porphyrinato) Europium (III) Complexes: Synthesis and Electrochemical Study" Inorganica Chimica Acta 268: 49–53.

Kovach et al. (1985) "Faradaic Electrochemistry at Microcylinder, Band, and Tubular Band Electrodes" 185: 285–295.

Li et al. (2000) "Synthesis of Thiol–Derivatized Europium Porphyrinic Triple–Decker Sandwich Complexes for Multibit Molecular Information Storage" J. Org. Chem. 65: 7379–7390.

Nagale et al. (1998) "Individually Addressable, Submicrometer Band Electrode Arrays. 1. *Fabrication from Multilayered Materials*" Anal. Chem. 70: 2902–2907.

Roth (2000) "Molecular Approach Toward Information Storage Based on the Redox Properties of Porphyrins in Self–Assembled Monolayers" J. Vac. Sci. Technol. B. 18(5) 2359–2364.

Ruben et al. (2000) "Multilevel Molecular Electronic Species: Electrochemical Reduction of a [2X2] Co4 Grid Type Complex by 11 Electrons in 10 Reversible Steps" Angew. Chem. Int. Ed. 39(22) 4139–4142.

Sommerauer et al. (1996) "Separation of 1(3), 9(10), 16(17), 23(24)–Tetrasubstituted Phthalycyanines with Newly Developed HPLC Phases" J. Am Chem. Soc. 118: 10085–10093.

Wong et al. (1974) "Lanthanide Porphyrin Complexes, A Potential New Class of Nuclear Magnetic Resonance Dipolar Probe" J. Am. Chem. Soc. 96(22) 7149–7150.

Zhu et al. (1999) "Chemical Vapor Deposition of Organic Momolayers on Si(100) via Si–N Linkages" Langmuir 15: 8147–8154.

* cited by examiner (Pc)M(Pc)

(Por)M(Pc)

(Por)M(Por)

type a type b type c

Scheme 1

Scheme 2

| Precursors | R¹ | R² | Porphyrin |
|---|---|---|---|
| 8 + 2 | —≡—TIPS | —≡—TMS | 11 (20%) |
| 9 + 2 | I | —≡—TMS | 12 (21%) |
| 10 + 3 | CH₃ | I | 13 (21%) |

Scheme 4

TD8  R = TMS  ⎤  K₂CO₃,
              ⎥  CHCl₃/THF/MeOH, rt
TD8' R = H    ⎦  90%

Chart 1

Type a triple deckers

TD1 $M^1/M^2$ = Eu, $R^1/R^2$ = $CH_3$
TD2 $M^1/M^2$ = Ce, $R^1/R^2$ = $CH_3$
TD3 $M^1$ = Eu, $M^2$ = Ce, $R^1$ = I, $R^2$ = —≡—TMS

Type c triple deckers

TD4 $M^1/M^2$ = Eu, R = p-tolyl
TD5 $M^1$ = Eu, $M^2$ = Ce, R = p-tolyl
TD6 $M^1/M^2$ = Eu, R = n-pentyl Scheme 5

| Porphyrin | R¹ | R² | Triple Decker | Yield |
|---|---|---|---|---|
| 12 | CH₃ | I | TD11 | 54% |
| 14 | I | CH₃ | TD3 | 46% |

Scheme 9

MULTISTATE TRIPLE-DECKER DYADS IN THREE DISTINCT ARCHITECTURES FOR INFORMATION STORAGE APPLICATIONS

STATEMENT AS TO RIGHTS TO INVENTIONS MADE UNDER FEDERALLY SPONSORED RESEARCH AND DEVELOPMENT

This invention was made, in part, with support by DARPA Grant Number MDA-972-01-C-0072, administered by the Office of Naval Research. The Government of the United States of America may have certain rights in this invention.

CROSS-REFERENCE TO RELATED APPLICATIONS

[Not Applicable]

FIELD OF THE INVENTION

This invention relates to memory devices. In particular this invention provides a nonvolatile electronic memory device capable of storing information in extremely high density.

BACKGROUND OF THE INVENTION

Basic functions of a computer include information processing and storage. In typical computer systems, these arithmetic, logic, and memory operations are performed by devices that are capable of reversibly switching between two states often referred to as "0" and "1". In most cases, such switching devices are fabricated from semiconducting devices that perform these various functions and are capable of switching between two states at a very high speed using minimum amounts of electrical energy. Thus, for example, transistors and transistor variants perform the basic switching and storage functions in computers.

Because of the huge data storage requirements of modern computers, a new, compact, low-cost, very high capacity, high speed memory configuration is needed. To reach this objective, molecular electronic switches, wires, microsensors for chemical analysis, and opto-electronic components for use in optical computing have been pursued. The principal advantages of using molecules in these applications are high component density (upwards of $10^{18}$ bits per square centimeter), increased response speeds, and high energy efficiency.

A variety of approaches have been proposed for molecular-based memory devices. While these approaches generally employ molecular architectures that can be switched between two different states, the approaches described to date have intrinsic limitations making their uses in computational devices difficult or impractical.

For example, such approaches to the production of molecular memories have involved photochromic dyes, electrochromic dyes, redox dyes, and molecular machines. Each of these approaches, however, has intrinsic limitations that ultimately render it unsuitable for use in molecular memories. For example, photochromic dyes change conformation in response to the absorption of light (e.g. cis-trans interconversion of an alkene, ring opening of a spiropyran, interconversion between excited-states in bacteriorhodopsin, etc.). Typically, the molecular structure of the dye is interconverted between two states that have distinct spectral properties.

Reading and writing data with such photochromic dyes requires use of light, often in the visible region (400–700 nm). Light-mediated data storage has intrinsic diffraction-limited size constraints. Moreover, most photochromic schemes are limited to scanning and interrogating dyes deposited on a surface and are not amenable to 3-D data storage. Even with near-field optical approaches, which might allow reliable encoding/reading of data elements of 100×100 nm dimensions (Nieto-Vesperinas and Garcia, N., eds. (1996) *Optics at the Nanometer Scale*, NATO ASI Series E, Vol. 319, Kluwer Academic Publishers: Dordrecht) the inherent restricted dimensionality (2-D) limits data density to $10^{10}$ bits/cm$^2$. Strategies for 3-dimensional reading and writing of photochromic systems have been proposed that rely on two-photon excitation of dyes to encode data, and one-photon excitation to read the data (Birge et al. (1994) *Amer. Sci.* 82: 349–355, Parthenopoulos and Rentzepis (1989) *Science*, 245: 843–845), but it is believed that no high-density memory cubes have reached prototype stage in spite of the passage of at least a decade since their initial proposition. In addition, it is noted that these dyes often exhibit relatively slow switching times ranging from microsecond to millisecond durations.

Electrochromic dyes have been developed that undergo a slight change in absorption spectrum upon application of an applied electric field (Liptay (1969) *Angew. Chem., Int. Ed. Engl.* 8: 177–188). The dyes must be oriented in a fixed direction with respect to the applied field. Quite high fields (>$10^7$ V/cm) must be applied to observe an altered absorption spectrum which can result in heat/power dissipation problems. In addition, the change in the absorption spectrum is typically quite small, which can present detection difficulties. The dyes revert to the initial state when the applied field is turned off.

Redox dyes have been developed that undergo a change in absorption spectrum upon chemical or electrochemical reduction (typically a 2-electron, 2-proton reduction) (Otsuki et al. (1996) *Chem. Lett.* 847–848). Such systems afford bistable states (e.g., quinone/hydroquinone, azo/hydrazo). Redox dyes have only been examined in solution studies, where they have been proposed for applications as switches and sensors (de Silva et al. (1997) *Chem. Rev.* 97: 1515–1566). On a solid substrate, electrochemical reduction would need to be accompanied by a source of protons. The latter requirement may be difficult to achieve on a solid substrate. Furthermore, any optical reading scheme would pose the same 2-D limitations as described for photochromic dyes.

Yet another approach involves the design of molecular machines (Anell et al. (1992) *J. Am. Chem. Soc.* 114: 193–218). These elegant molecular architectures have moving parts that can be switched from one position to another by chemical or photochemical means. The chemically induced systems have applications as sensors but are not practical for memory storage, while the photochemically induced systems have the same fundamental limitations as photochromic dyes. Moreover, methods have not yet been developed for delineating the conformation/structure of the molecular machine that are practical in any device applications. $^1$H NMR spectroscopy, for example, is clearly the method of choice for elucidating structure/conformation for molecules in solution, but is totally impractical for interrogating a molecular memory element. None of the current architectures for molecular machines has been designed for assembly on a solid substrate, an essential requirement in a viable device.

In summary, photochromic dyes, electrochromic dyes, redox-sensitive dyes, and molecular machines all have fundamental limitations that have precluded their application as viable memory elements. These molecular architectures are typically limited by reading/writing constraints. Furthermore, even in cases where the effective molecular bistability is obtained, the requirement for photochemical reading restricts the device architecture to a 2-dimensional thin film. The achievable memory density of such a film is unlikely to exceed $10^{10}$ bits/cm$^2$. Such limitations greatly diminish the appeal of these devices as viable molecular memory elements.

SUMMARY OF THE INVENTION

This invention provides novel high density memory devices that are electrically addressable permitting effective reading and writing, that provide a high memory density (e.g., $10^{15}$ bits/cm$^3$), that provide a high degree of fault tolerance, and that are amenable to efficient chemical synthesis and chip fabrication. The devices are intrinsically latchable, defect tolerant, and support destructive or non-destructive read cycles.

In a preferred embodiment, this invention provides an apparatus for storing data (e.g., a "storage cell"). The storage cell includes a fixed electrode electrically coupled to a "storage medium" having a multiplicity of different and distinguishable oxidation states where data is stored in the (preferably non-neutral) oxidation states by the addition or withdrawal of one or more electrons from said storage medium via the electrically coupled electrode. In certain embodiments, the storage medium comprises a storage molecule having a plurality of different and distinguishable oxidation states where the storage molecule comprises a first triple-decker sandwich coordination compound covalently linked to a second triple-decker sandwich coordination compound, and where the first compound and the second compound are different triple-decker sandwich coordination compounds. In various embodiments, the storage molecule comprises a heteroleptic sandwich coordination compound or a homoleptic sandwich coordination compound. Particularly preferred storage molecules comprise a triple decker sandwhich coordination compound having a formula selected from the group consisting of $Por^1M^1Por^2M^2Por^3$, $Por^1M^1Pc^1M^2Por^2$, $Pc^1M^1Pc^2M^2Por^1$, $Pc^1M^1Pc^2M^2Pc^3$, $Pc^1M^1Por^1M^2Por^2$, and $Pc^1M^1Por^1M^2Pc^2$, where $M^1$ and $M^2$ are the same or different and each is a metal, e.g. as described herein; $Por^1$, $Por^2$, and $Por^3$ are the same or different and each is a porphyrinato species; and $Pc^1$, $Pc^2$, and $Pc^3$ are the same or different and each is a phthalocyaninato species. Particularly preferred storage molecules have at least 8 different and distinguishable non-zero oxidation states. In various embodiments, the two triple-decker sandwich molecules comprising a storage molecule of this invention are linked together (directly or indirectly) by a bond or linker joining a porphyrinato species of one triple-decker sandwich molecule to a phthalocyaninato species of another triple-decker sandwich molecule and/or by a bond or linker joining a porphyrinato species of one triple-decker sandwich molecule to a porphyrinato species of another triple-decker sandwich molecule and/or by a bond or linker joining a phthalocyaninato species of one triple-decker sandwich molecule to a phthalocyaninato species of another triple-decker sandwich molecule.

Particularly preferred storage molecules include, but are not limited to the molecules of formulas I–X, XIV–XXI, dyad1 through dyad 5,etc., and particular species identified herein.

The storage medium is electrically coupled to the electrode(s) by any of a number of convenient methods including, but not limited to, covalent linkage (direct or through a linker), ionic linkage, non-ionic "bonding", simple juxtaposition/apposition of the storage medium to the electrode(s), or simple proximity to the electrode(s) such that electron transfer (e.g. tunneling) between the medium and the electrode(s) can occur. The storage medium can contain or be juxtaposed to or layered with one or more dielectric material(s). Preferred dielectric materials are imbedded with counterions (e.g. Nafion). The storage cells of this invention are fully amenable to encapsulation (or other packaging) and can be provided in a number of forms including, but not limited to, an integrated circuit or as a component of an integrated circuit, a non-encapsulated "chip", etc. In some embodiments, the storage medium is electronically coupled to a second electrode that is a reference electrode. In certain preferred embodiments, the storage medium is present in a single plane in the device. The apparatus of this invention can include the storage medium present at a multiplicity of storage locations, and in certain configurations, each storage location and associated electrode(s) forms a separate storage cell. The storage present on a single plane in the device or on multiple planes and said storage locations are present on multiple planes of said device. Virtually any number (e.g., 16, 32, 64, 128, 512, 1024, 4096, etc.) of storage locations and/or storage cells can be provided in the device. Each storage location can be addressed by a single electrode or by two or more electrodes. In other embodiments, a single electrode can address multiple storage locations and/or multiple storage cells.

In preferred storage cells, the storage medium stores data at a density of at least one bit, preferably at a density of at least 2 bits, more preferably at a density of at least 3 bits, and most preferably at a density of at least 5, 8, 16, 32, or 64 bits per molecule. Thus, preferred storage media have at least 2, 8, 16, 32, 64, 128 or 256 different and distinguishable oxidation states. In particularly preferred embodiments, the bits are all stored in non-neutral oxidation states. In a most preferred embodiment, the different and distinguishable oxidation states of the storage medium can be set by a voltage difference no greater than about 5 volts, more preferably no greater than about 2 volts, and most preferably no greater than about 1 volt.

In another embodiment, this invention provides an information storage medium comprising a storage molecule having at least eight different and distinguishable non-zero oxidation states where the storage molecule is a multimeric molecule comprising two or more triple-decker sandwich compounds. Preferred storage molecules include, but are not limted to the molecules of formulas I–X, XIV–XXI, dyad1 through dyad 5, etc.

This invention also provides a method of storing data. The method typically involves providing an apparatus for storing data as described herein and applying a voltage to an electrode comprising such a device at sufficient current to set an oxidation state of the storage medium. In certain embodiments, the voltage ranges up to about 5 volts, preferably up to about 3 volts, more preferably up to about 2 volts, and most preferably up to about 1 volt. The voltage can be the output of an integrated circuit. The method can further involve detecting the oxidation state of said storage medium comprising the apparatus and thereby reading out the data stored therein. Detecting the oxidation state can additionally comprise refreshing the oxidation state of the storage medium. In various embodiments, dececting involves analyzing a readout signal in the time domain or the frequency domain (e.g. by performing a Fourier transform on the readout signal). In various embodiments, the detection method utilizes a voltammetric method (e.g. sinusoidal voltammetry).

This invention also provides a porphyrin half-sandwich complex comprising a cis-$A_2BC$ porphyrin complexed with a metal. The half-sandwich complex can be used to synthesize/assemble a triple-decker sandwich dyad.

Also provided is a method of making a triple-decker sandwich dyad. The method involves providing a metal-porphyrin half-sandwich complex comprising a cis-$A_2BC$ porphyrin complexed with a metal or an ABCD porphyrin complexed with a metal; and reacting the half-sandwich complex with a double-decker sandwich complex to form a triple-decker sandwich compound.

In still another embodiment, this invention provides a computer system comprising a memory device, where the memory device comprises an apparatus for storing data as described herein. In certain embodiments, the computer system comprises a central processing unit, a display, a selector device, and a memory device, where the memory device comprises a data storage molecule as described herein.

Definitions

The terms "sandwich coordination compound" or "sandwich coordination complex" refer to a compound of the formula $L^nM^{n-1}$, where each L is a heterocyclic ligand (as described below), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand. Thus sandwich coordination compounds are not organometallic compounds such as ferrocene, in which the metal is bonded to carbon atoms. The ligands in the sandwich coordination compound are generally arranged in a stacked orientation, i.e., they are generally cofacially oriented and axially aligned with one another, although they may or may not be rotated about that axis with respect to one another (see, e.g., Ng and Jiang (1997) *Chem. Soc. Rev.*, 26: 433–442).

The term "triple-decker sandwich coordination compound" refers to a sandwich coordination compound as described above where n is 3, thus having the formula $L^1$—$M^1$—$L^2$—$M^2$—$L^3$, wherein each of $L^1$, $L^2$ and $L^3$ may be the same or different, and $M^1$ and M2 may be the same or different (see, e.g., U.S. Pat. No. 6,212,093 B1; Arnold et al. (1999) *Chem. Lett.* 483–484).

The term "homoleptic sandwich coordination compound" refers to a sandwich coordination compound as described above wherein all of the ligands L are the same.

The term "heteroleptic sandwich coordination compound" refers to a sandwich coordination compound as described above wherein at least one ligand L is different from the other ligands therein.

The term "heterocyclic ligand" as used herein generally refers to any heterocyclic molecule consisting of carbon atoms containing at least one, and preferably a plurality of, hetero atoms (e.g., N, O, S, Se, Te), which hetero atoms may be the same or different, and which molecule is capable of forming a sandwich coordination compound with another heterocyclic ligand (which may be the same or different) and a metal. Such heterocyclic ligands are typically macrocycles, particularly tetrapyrrole derivatives such as the phthalocyanines, porphyrins, and porphyrazines (see, e.g., Tran-Thi (1997) *Coord. Chem. Rev.*, 160: 53–91).

The term "oxidation" refers to the loss of one or more electrons in an element, compound, or chemical substituent/subunit. In an oxidation reaction, electrons are lost by the element, compound or chemical substituent/subunit(s) involved in the reaction. The charge on these species then becomes more positive. The electrons are lost from the species undergoing oxidation and so electrons appear as products in an oxidation reaction. An oxidation takes place in the reaction $Fe^{2+}(aq) \rightarrow Fe^{3}(aq)+e^-$ because electrons are lost from the species being oxidized, $Fe^{2+}$ (aq), despite the apparent production of electrons as "free" entities in oxidation reactions.

Conversely the term reduction refers to the gain of one or more electrons by an element, compound, or chemical substituent/subunit.

An "oxidation state" refers to the electrically neutral state or to the state produced by the gain or loss of electrons to an element, compound, or chemical substituent/subunit. In a preferred embodiment, the term "oxidation state" refers to states including the neutral state and any state other than a neutral state caused by the gain or loss of electrons (reduction or oxidation).

A "non-zero" or "non-neutral" oxidation state refers to an oxidation state other than an electrically neutral oxidation state.

The term "multiple oxidation states" means more than one oxidation state. In preferred embodiments, the oxidation states may reflect the gain of electrons (reduction) or the loss of electrons (oxidation).

The term "different and distinguishable" when referring to two or more oxidation states means that the net charge on the entity (atom, molecule, aggregate, subunit, etc.) can exist in two or more different states. The states are said to be "distinguishable" when the difference between the states is greater than thermal energy at room temperature (e.g. 0° C. to about 40° C.).

The term "electrode" refers to any medium or material capable of transporting charge (e.g. electrons) to and/or from a storage molecule. Preferred electrodes are metals, conductive organic molecules, or semiconductors. The electrodes can be manufactured to virtually any 2-dimensional or 3-dimensional shape (e.g. discrete lines, pads, planes, spheres, cylinders, etc.).

The term "fixed electrode" is intended to reflect the fact that the electrode is essentially stable and unmovable with respect to the storage medium and/or storage molecule(s). That is, the electrode and storage medium and/or storage molecule(s) are arranged in an essentially fixed geometric relationship with each other. The relationship can alter somewhat due to expansion and contraction of the medium with thermal changes or due to changes in conformation of the molecules comprising the electrode and/or the storage medium. Nevertheless, the overall spatial arrangement remains essentially invariant. In a preferred embodiment this term is intended to exclude systems in which the electrode is a movable "probe" (e.g. a writing or recording "head", an atomic force microscope (AFM) tip, a scanning tunneling microscope (STM) tip, etc.).

The term "working electrode" is used to refer to one or more electrodes that are used to set or read the state of a storage medium and/or storage molecule.

The term "reference electrode" is used to refer to one or more electrodes that provide a reference (e.g. a particular reference voltage) for measurements recorded from the working electrode. In preferred embodiments, the reference electrodes in a memory device of this invention are at the same potential although in some embodiments this need not be the case.

The term "electrically coupled" when used with reference to a storage molecule and/or storage medium and electrode refers to an association between that storage medium or molecule and the electrode such that electrons move from the storage medium/molecule to the electrode or from the electrode to the storage medium/molecule and thereby alter the oxidation state of the storage medium/molecule. Electrical coupling can include direct covalent linkage between the storage medium/molecule and the electrode, indirect covalent coupling (e.g. via a linker), direct or indirect ionic bonding between the storage medium/molecule and the electrode, or other bonding (e.g. hydrophobic bonding). In addition, no actual bonding may be required and the storage medium/molecule can simply be contacted with the electrode surface. There also need not necessarily be any contact between the electrode and the storage medium/molecule where the electrode is sufficiently close to the storage medium/molecule to permit electron transfer (e.g. tunneling) between the medium/molecule and the electrode.

The term "redox-active unit" or "redox-active subunit" refers to a molecule or component of a molecule that is capable of being oxidized or reduced by the application of a suitable voltage.

The term "subunit", as used herein, refers to a component (e.g. a redox-active component) of a molecule.

The terms "storage molecule" or "memory molecule" refer to a molecule having one or more oxidation states that can be used for the storage of information (e.g. a molecule comprising one or more redox-active subunits). Preferred storage molecules have two or more different and distinguishable non-neutral oxidation states. In addition to the compounds illustrated by the formulas herein, a wide variety of additional molecules can be used as storage molecules (see, e.g., U.S. Pat. Nos. 6,272,038, 6,212,093, 6,208,553, and international patent applications WO 01/51188 and WO 01/03126) and hence further comprise the storage medium. Preferred molecules include, but are not limited to a porphyrinic macrocyclce, a metallocene, a linear polyene, a cyclic polyene, a heteroatom-substituted linear polyene, a heteroatom-substituted cyclic polyene, a tetrathiafulvalene, a tetraselenafulvalene, a metal coordination complex, a buckyball, a triarylamine, a 1,4-phenylenediamine, a xanthene, a flavin, a phenazine, a phenothiazine, an acridine, a quinoline, a 2,2'-bipyridyl, a 4,4'-bipyridyl, a tetrathiotetracene, and a peri-bridged naphthalene dichalcogenide. Even more preferred molecules include a porphyrin, an expanded porphyrin, a contracted porphyrin, a ferrocene, a linear porphyrin polymer, and porphyrin array. Certain particularly preferred storage molecules include a porphyrinic macrocycle substituted at a beta-position or at a meso-position. Molecules well suited for use as storage molecules include the molecules described herein.

The term "storage medium" refers to a composition comprising a storage molecule of the invention, preferably juxtaposed to and/or bonded to a substrate.

An "electrochemical cell" typically consists of a reference electrode, a working electrode, a redox-active molecule (e.g. a storage molecule or storage medium), and, if necessary, some means (e.g., a dielectric, a conductive linker, etc.) for providing electrical conductivity between the electrodes and/or between the electrodes and the molecule/medium. In some embodiments, the dielectric is a component of the storage medium.

The terms "memory element", "memory cell", or "storage cell" refer to an electrochemical cell that can be used for the storage of information. Preferred "storage cells" are discrete regions of storage medium addressed by at least one and preferably by two electrodes (e.g. a working electrode and a reference electrode). The storage cells can be individually addressed (e.g. a unique electrode is associated with each memory element) or, particularly where the oxidation states of different memory elements are distinguishable, multiple memory elements can be addressed by a single electrode. The memory element can optionally include a dielectric (e.g. a dielectric impregnated with counterions).

The term "storage location" refers to a discrete domain or area in which a storage medium is disposed. When addressed with one or more electrodes, the storage location can form a storage cell. However if two storage locations contain the same storage media so that they have essentially the same oxidation states, and both storage locations are commonly addressed, they can form one functional storage cell.

Addressing a particular element refers to associating (e.g., electrically coupling) that memory element with an electrode such that the electrode can be used to specifically determine the oxidation state(s) of that memory element.

The term "storage density" refers to the number of bits per volume and/or bits per molecule that can be stored. When the storage medium is said to have a storage density greater than one bit per molecule, this refers to the fact that a storage medium preferably comprises molecules wherein a single molecule is capable of storing at least one bit of information.

The terms "read" or "interrogate" refer to the determination of the oxidation state(s) of one or more molecules (e.g. molecules comprising a storage medium).

The term "refresh" when used in reference to a storage molecule or to a storage medium refers to the application of a voltage to the storage molecule or storage medium to re-set the oxidation state of that storage molecule or storage medium to a predetermined state (e.g. the oxidation state the storage molecule or storage medium was in immediately prior to a read).

The term "$E_{1/2}$" refers to the practical definition of the formal potential ($E°$) of a redox process as defined by $E=E°+(RT/nF)\ln(D_{ox}/D_{red})$ where R is the gas constant, T is temperature in K (Kelvin), n is the number of electrons involved in the process, F is the Faraday constant (96,485 Coulomb/mole), $D_{ox}$ is the diffusion coefficient of the oxidized species and $D_{red}$ is the diffusion coefficient of the reduced species.

A voltage source is any source (e.g. molecule, device, circuit, etc.) capable of applying a voltage to a target (e.g. an electrode).

The term "present on a single plane", when used in reference to a memory device of this invention refers to the fact that the component(s) (e.g. storage medium, electrode (s), etc.) in question are present on the same physical plane in the device (e.g. are present on a single lamina). Components that are on the same plane can typically be fabricated at the same time, e.g., in a single operation. Thus, for example, all of the electrodes on a single plane can typically be applied in a single (e.g., sputtering) step (assuming they are all of the same material).

The phrase "output of an integrated circuit" refers to a voltage or signal produced by one or more integrated circuit(s) and/or one or more components of an integrated circuit.

A "voltammetric device" is a device capable of measuring the current produced in an electrochemical cell as a result of the application of a voltage or change in voltage.

An "amperometric device" is a device capable of measuring the current produced in an electrochemical cell as a result of the application of a specific potential ("voltage").

A potentiometric device is a device capable of measuring potential across an interface that results from a difference in the equilibrium concentrations of redox molecules in an electrochemical cell.

A "coulometric device" is a device capable of measuring the net charge produced during the application of a potential field ("voltage") to an electrochemical cell.

A "sinusoidal voltammeter" is a voltammetric device capable of determining the frequency domain properties of an electrochemical cell.

The term "porphyrinic macrocycle" refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, beta-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, porphyrazines, naphthalocyanines, subphthalocyanines, and porphyrin isomers). Preferred porphyrinic macrocycles comprise at least one 5-membered ring.

The term porphyrin refers to a cyclic structure typically composed of four pyrrole rings together with four nitrogen atoms and two replaceable hydrogens for which various metal atoms can readily be substituted. A typical porphyrin is hemin.

A "porphyrinato species" refers to a porphyrin that has lost any core protons and is complexed to one or more metal cations.

A "phthalocyaninato species" refers to phthalocyanine that has lost any core protons and is complexed to one or more metal cations.

The term "multiporphyrin array" refers to a discrete number of two or more covalently linked porphyrinic macrocycles. The multiporphyrin arrays can be linear, cyclic, or branched.

A linker is a molecule used to couple two different molecules, two subunits of a molecule, or a molecule to a substrate.

A substrate is a, preferably solid, material suitable for the attachment of one or more molecules. Substrates can be formed of materials including, but not limited to glass, plastic, silicon, minerals (e.g. quartz), semiconducting materials (e.g. type IV, type V semiconductors, etc.), ceramics, metals, etc.

The term "aryl" refers to a compound whose molecules have the ring structure characteristic of benzene, naphthalene, phenanthrene, anthracene, etc. (i.e., either the 6-carbon ring of benzene or the condensed 6-carbon rings of the other aromatic derivatives). For example, an aryl group may be phenyl ($C_6H_5$) or naphthyl ($C_{10}H_7$). It is recognized that the aryl, while acting as substituent can itself have additional substituents.

The term "alkyl" refers to a paraffinic hydrocarbon group which may be derived from an alkane by dropping one hydrogen from the formula. Examples are methyl ($CH_3$—), ethyl ($C_2H_5$—), propyl ($CH_3CH_2CH_2$—), isopropyl (($CH_3$)$_2$CH—).

The term "halogen" refers to one of the electronegative elements of group VIIA of the periodic table (fluorine, chlorine, bromine, iodine, astatine).

The term "nitro" refers to the —$NO_2$ group.

The term "amino" refers to the —$NH_2$ group.

The term "perfluoroalkyl" refers to an alkyl group where every hydrogen atom is replaced with a fluorine atom.

The term "perfluoroaryl" refers to an aryl group where every hydrogen atom is replaced with a fluorine atom.

The term "pyridyl" refers to an aryl group where one CR unit is replaced with a nitrogen atom.

The term "cyano" refers to the —CN group.

The term "thiocyanato" refers to the —SCN group.

The term "sulfoxyl" refers to a group of composition RS(O)— where R is some alkyl, aryl, cycloalkyl, perfluoroalkyl, or perfluoroaryl group. Examples include, but are not limited to methylsulfoxyl, phenylsulfoxyl, etc.

The term "sulfonyl" refers to a group of composition $RSO_2$— where R is some alkyl, aryl, cycloalkyl, perfluoroalkyl, or perfluoroaryl group. Examples include, but are not limited to methylsulfonyl, phenylsulfonyl, p-toluenesulfonyl, etc.

The term "carbamoyl" refers to the group of composition $R^1(R^2)NC(O)$— where $R^1$ and $R^2$ are H or some alkyl, aryl, cycloalkyl, perfluoroalkyl, or perfluoroaryl group. Examples include, but are not limited to N-ethylcarbamoyl, N,N-dimethylcarbamoyl, etc.

The term "amido" refers to the group of composition $R^1CON(R^2)$— where $R^1$ and $R^2$ are H or some alkyl, aryl, cycloalkyl, perfluoroalkyl, or perfluoroaryl group. Examples include, but are not limited to acetamido, N-ethylbenzamido, etc.

The term "acyl" refers to an organic acid group in which the OH of the carboxyl group is replaced by some other substituent (RCO—). Examples include, but are not limited to acetyl, benzoyl, etc.

In preferred embodiments, when a metal is designated by "M" or "M'''" where n is an integer, it is recognized that the metal may be associated with a counterion.

The term "substituent" as used in the formulas herein, particularly designated by S or $S^n$ where n is an integer, in a preferred embodiment refer to redox-active groups (subunits) that can be used to adjust the redox potential(s) of the subject compound. Preferred substituents include, but are not limited to, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. In preferred embodiments, a substituted aryl group is attached to a porphyrin or a porphyrinic macrocycle, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. Additional substituents include, but are not limited to, 4-chlorophenyl, 4-trifluoromethylphenyl, and 4-methoxyphenyl. Preferred substituents provide a redox potential range of less than about 5 volts, preferably less than about 2 volts, more preferably less than about 1 volt.

The phrase "provide a redox potential range of less than about X volts" refers to the fact that when a substituent providing such a redox potential range is incorporated into a compound, the compound into which it is incorporated has an oxidation potential less than or equal to X volts, where X is a numeric value.

DETAILED DESCRIPTION

This invention provides novel high density memory devices that are electrically addressable permitting effective reading and writing, that provide a high memory density (e.g., $10^{15}$ bits/cm$^3$), that provide a high degree of fault tolerance, and that are amenable to efficient chemical synthesis and chip fabrication. The devices are intrinsically latchable, defect tolerant, and support destructive or non-destructive read cycles.

Figure 1:
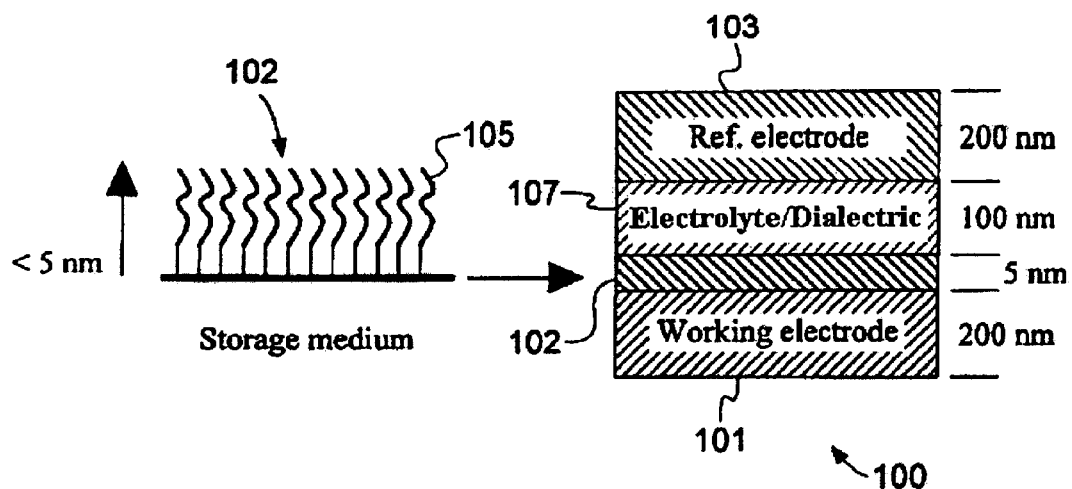
FIG. 1 illustrates a basic molecular memory unit "storage cell" of this invention. The basic memory device, a "storage cell" 100 comprises a working electrode 101 electrically coupled to a storage medium 102 comprising a multiplicity of storage molecules 105. The storage cell optionally includes an electrolyte 107 and a reference electrode 103. The storage medium has a multiplicity of different and distinguishable oxidation states, preferably a multiplicity of different and distinguishable non-neutral oxidation states, and can change oxidation (charge) state when a voltage or signal is applied thereby adding or removing one or more electrons.

One embodiment of this invention is illustrated in FIG. 1. The basic memory device, a "storage cell" 100 comprises a working electrode 101 electrically coupled to a storage medium 102 comprising a multiplicity of storage molecules 105. The storage cell optionally includes an electrolyte 107 and/or a reference electrode 103. The storage medium has a multiplicity of different and distinguishable oxidation states, preferably a multiplicity of different and distinguishable non-neutral oxidation states, and can change oxidation (charge) state when a voltage or signal is applied thereby adding or removing one or more electrons. Each oxidation state represents a particular bit. Where the storage medium supports eight different and distinguishable oxidation states it stores three bits.

The storage medium remains in the set oxidation state until another voltage is applied to alter that oxidation state. The oxidation state of the storage medium can be readily determined using a wide variety of electronic (e.g. amperometric, coulometric, voltammetric) methods thereby providing rapid readout.

The storage medium can remain in the set oxidation state until another voltage is applied to alter that oxidation state, can be refreshed, or the information content can be allowed to dissipate over time. The oxidation state of the storage medium can be readily determined using a wide variety of electronic (e.g. amperometric, coulometric, voltammetric) methods thereby providing rapid readout.

In various embodiments, the storage medium comprises one or more molecules having a single oxidation state and/or one or more molecules having multiple different and distinguishable non-neutral oxidation states. Thus, for example, in one embodiment, the storage medium can comprise eight different species of storage molecules each having one non-neutral oxidation state and thereby store three bits. In another embodiment, the storage medium can comprise one species of molecule that has eight different and distinguishable oxidation states and likewise store three bits in that manner as well. As explained herein, a large number of different molecules having different numbers of oxidation states can be used for the storage medium.

Because molecular dimensions are so small (on the order of angstroms) and individual molecules in the devices of this invention can store multiple bits, the storage devices of this invention therefore offer remarkably high storage densities (e.g. $>10^{15}$ bits/cm$^3$).

Moreover, the devices of this invention are capable of a degree of self-assembly and hence easily fabricated. Because the devices are electrically (rather than optically) addressed, and because the devices utilize relatively simple and highly stable storage elements, they are readily fabricated utilizing existing technologies and easily incorporated into electronic devices. Thus, the molecular memory devices of this invention have a number of highly desirable features.

Because the storage medium of the devices described herein is electrically addressed, the devices are amenable to the construction of a multilayered chip architecture. An architecture compatible with such a three-dimensional structure facilitates the construction of devices having extremely high storage capacity. In addition, because writing and reading is accomplished electrically, many of the fundamental problems inherent with photonic devices are avoided. Moreover, electrical reading and writing is compatible with existing computer technology for memory storage.

In addition, the devices of this invention achieve a high level of defect tolerance. Defect tolerance is accomplished through the use of clusters of molecules (up to several million in a memory cell). Thus, the failure of one or a few molecules will not alter the ability to read or write to a given memory cell that constitutes a particular bit of memory. In preferred embodiments, the basis for memory storage relies on the oxidation state(s) of porphyrins or other porphyrinic macrocycles having defined energy levels (oxidation states).

Preferred storage molecules of this invention molecule have a plurality of different and distinguishable oxidation states and can therefore store multiple bits. In contrast, dyes (photochromic, electrochromic, redox) and molecular machines are invariably bistable elements. Bistable elements exist either in a high/low state and hence can only store a single bit.

Reading can be accomplished non-destructively or destructively as required in different chip applications. The speed of reading is conservatively estimated to lie in the MHz to GHz regime. Oxidation of the porphyrins or other porphyrinic macrocycles can be achieved at relatively low potential (and at predesignated potentials through synthetic design), enabling memory storage to be achieved at very low power. Porphyrins and porphyrin radical cations are stable across a broad range of temperatures, enabling chip applications at low temperature, room temperature, or at elevated temperatures.

Using the teachings provided herein, fabrication of the devices of this invention can be accomplished using known technology. The synthesis of the storage molecules takes advantage of established building block approaches in porphyrin and other porphyrinic macrocycle chemistry. Synthetic routes have been developed to make the porphyrin and porphyrinic macrocycle building blocks, to join them in covalent nanostructures, and to purify them to a high level (>99%).

In preferred embodiments, the storage medium nanostructures are designed for directed self-assembly on various surfaces (e.g. metal surfaces, semiconductor surfaces, etc.). Such self-assembly processes are robust, result in the culling out of defective molecules, and yield long-range order in the surface-assembled cluster.

I. Uses of the Storage Device

One of ordinary skill in the art will appreciate that the memory devices of this invention have wide applicability in specialized and general-purpose computer systems. Of course commercial realization of the device(s) will be facilitated by the adoption of computer architecture standards compatible with this technology. In addition, commercial adoption of this technology will be facilitated by the use of other molecular electronic components that will serve as on-chip buffers and decoders (that is, molecular logic gates), and the like. In addition, commercialization will be facilitated by the development of a full manufacturing infrastructure.

Regardless, prior to the development of a fully integrated design and manufacturing platform for molecular electronic information storage and transfer, even early generation prototype molecular memory devices described herein have utility in a variety of personal or industrial applications. For example, a prototype 1024/512-bit molecular memory device has sufficient capacity to hold a substantial base of personal and/or other proprietary information. This information could be transported anywhere in the world virtually undetected owing to the extremely small size of the device. If detected, the memory device is easily erased by applying a low potential reverse bias current across all memory cells. This protection mechanism can be readily incorporated into any type of transport architecture designed for the memory device.

In certain embodiments, this invention, particularly the storage molecules described herein can be used to fabricate a hybrid molecular-CMOS flash memory device. One such flash memory comprises one or more storage molecules of this invention (preferably with appropriate linkers) attached to the channel region of a Si transistor. The charge stored in the molecules can be easily detected by the source drain current flowing through the transistor (similar to a FLASH transistor). The charge retention and the write/read times of this device will depend on the length and composition of the linker. Therefore, optimization of the memory read/write times and charge retention can be easily attained by altering the linker.

In certain embodiments, the flash memory is based on a standard Si MOSFET, which consists of a source/drain gate and channel regions. However, the gate dielectric of this MOSFET is now replaced by the storage molecule(s) described herein. The storage molecule can be covalently attached to the Si substrate via an intervening linker. A counter electrode, also defined as the control gate, is then placed on top. This device behaves similarly to a FLASH memory device. During the write process, an appropriate voltage is applied to the counter electrode that oxidizes the molecules (electron tunnels out) and stores charge on the molecule. The molecules have discrete oxidation or energy states and when the energy level of one of the discrete states resonates with the Si Fermi level or any lower level, the electron(s) tunnels out. This delocalized net charge can alter the threshold voltage of the MOSFET: a positive charge on the molecules will result in a negative shift in threshold voltage.

Once the molecules are charged, disconnecting the terminals results in a field distribution in the cell that depends on the initial written state (relaxation of the cell). During the read operation, the control gate is subjected to a small gate bias ($V_{CG}$) and the $I_{DS}$ current obtained is used to judge the charge state of the device. If the device is written (charge is stored in the molecules), a transistor current ($I_{DS}$) will be obtained (the transistor is on). If the device is erased (no stored charge in the molecules), a larger $I_{DS}$ current will result at a given gate voltage of $V_{CG}$. As is the case in all FLASH devices, in the low-current range, small changes in voltage result in large changes in current (5–6 orders of magnitude). Thus, this current can be easily sensed. The architecture, fabrication, and use of hybrid molecular flash memories is described in copending application U.S. Ser. No. 10/017,999, filed on Dec. 14, 2001.

In various embodiments, the memory devices of this invention have sufficient capacity to hold information that can be used in a wide assortment of personal digital assistants or "smart cards". Even a memory device that degrades upon multiple read cycles is extremely useful if the number of read cycles is highly limited (perhaps only one). A memory device that degrades upon multiple read cycles or simply with time is also useful in applications where long-term data persistence is not needed. Thus, numerous applications for early generation memory devices present themselves. Successes of the memory devices in these applications will foster even more rapid full-scale commercialization of the technology.

II. Architecture of the Storage Device

Figure 2:
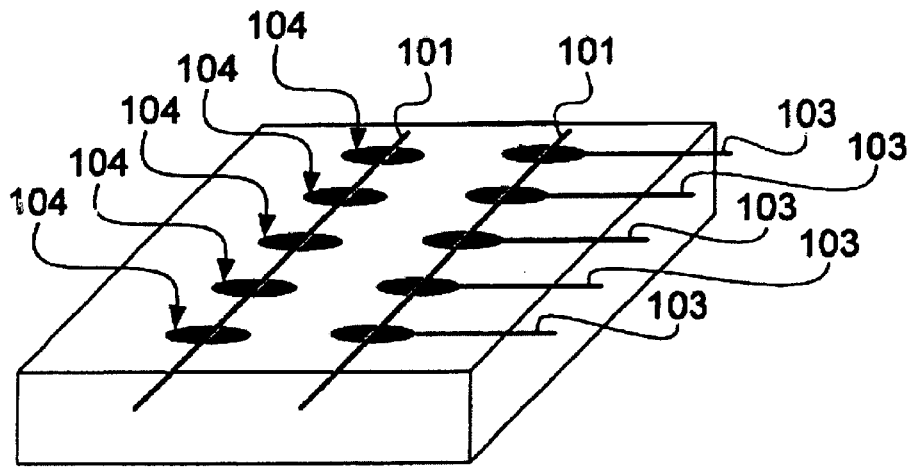
FIG. 2 illustrates the disposition of the storage cell(s) of this invention on a chip. In this illustration, each storage cell comprises a storage location/element 104 and at least one electrode, i.e. a reference electrode 103 and/or a working electrode 101.

The basic storage cell (electrode(s) and storage medium) of this invention can be incorporated into a functional device in a wide variety of configurations. One chip-based embodiment of this invention is illustrated in FIG. 2. As illustrated in FIG. 2 the storage medium 102 is disposed in a number of storage locations 104. In certain embodiments, each storage location is addressed by a working electrode 101 and a reference electrode 103 so that the storage medium 102 combined with the electrodes forms a storage cell 100 at each storage location 104.

Figure 3:
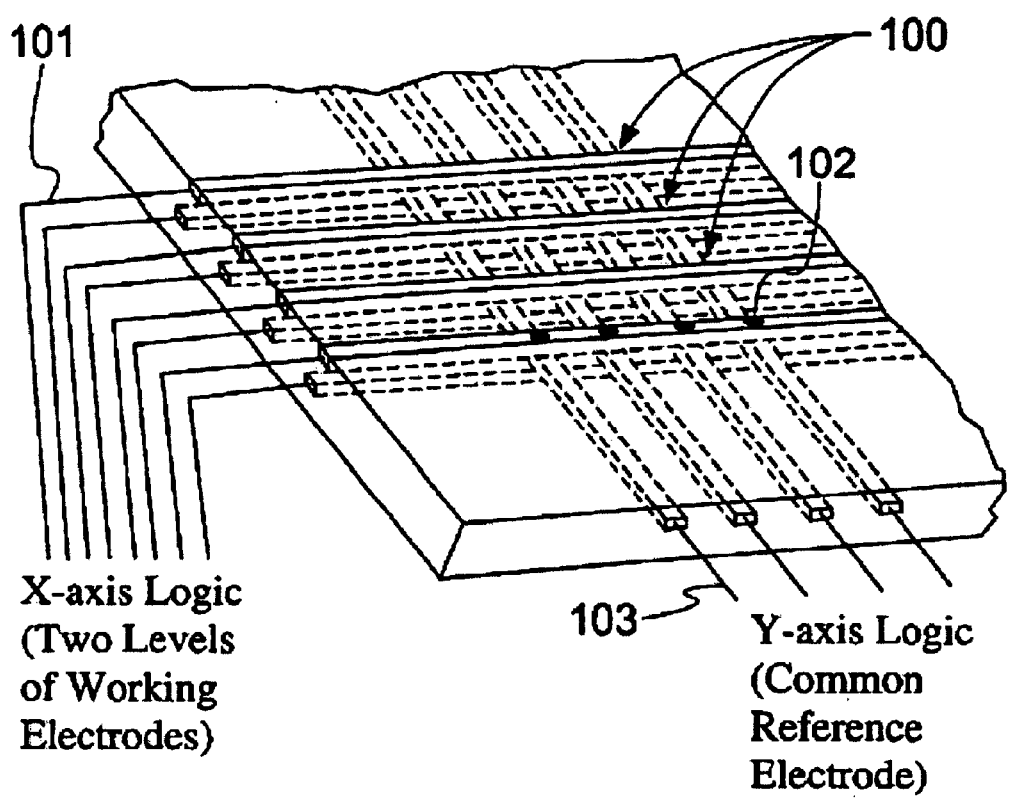
FIG. 3 illustrates a preferred chip-based embodiment of this invention. A two-level chip is illustrated showing working electrodes 101, orthogonal reference electrodes 103, and storage medium 102.

One particularly preferred chip-based embodiment is illustrated in FIG. 3. In the illustrated embodiment, a plurality of working electrodes 101 and reference electrodes 103 are illustrated each addressing storage media 102 localized at discrete storage locations thereby forming a plurality of storage cells 100. Multiple storage cells can be associated with a single addressing electrode as long as oxidation states of the storage cells are distinguishable from each other. It should be noted that this forms a functional definition of a storage cell. Where two discrete areas of storage medium are addressed by the same electrode(s) if the storage media comprise the same species of storage molecule the two discrete areas will functionally perform as a single storage cell, i.e. the oxidation states of both locations will be commonly set, and/or read, and/or reset. The added storage location, however, will increase the fault tolerance of the storage cell as the functional storage cell will contain more storage molecules. In another embodiment, each individual storage cell is associated with a single addressing electrode.

In preferred embodiments, the storage medium comprising the storage cells of a memory device are all electrically coupled to one or more reference electrodes. The reference electrode(s) can be provided as discrete electrodes or as a common backplane.

The chip illustrated in FIG. 3 has two levels of working electrodes and hence two levels of storage cells 100 (with numerous storage cells on each level). Of course, the chip can be fabricated with a single level of electrodes and memory element or literally hundreds or thousands of different levels of storage cell(s), the thickness of the chip being limited essentially by practical packaging and reliability constraints.

In certain embodiments, a layer of dielectric material optionally imbedded with counterions to ensure electrical connectivity between the working and reference electrode(s) and stability of the cationic species in the absence of applied potential (latching) is disposed in the storage cell. In some embodiments, the dielectric material can be incorporated into the storage medium itself.

While, in some preferred embodiments, feature sizes are rather large (e.g. memory elements approximately (10×10× 10 $\mu$m) and electrode thickness ~200 nm, feature size can be reduced at will so that feature sizes are comparable to those in conventional silicon-based devices (e.g., 50 nm–100 nm on each axis).

While, in some preferred embodiments, feature sizes are rather large (e.g. memory elements approximately (10×10× 10 $\mu$m) and electrode thickness ~200 nm, feature size can be reduced at will so that feature sizes are comparable to those in conventional silicon-based devices (e.g., 50 nm–100 nm on each axis).

Figure 4:
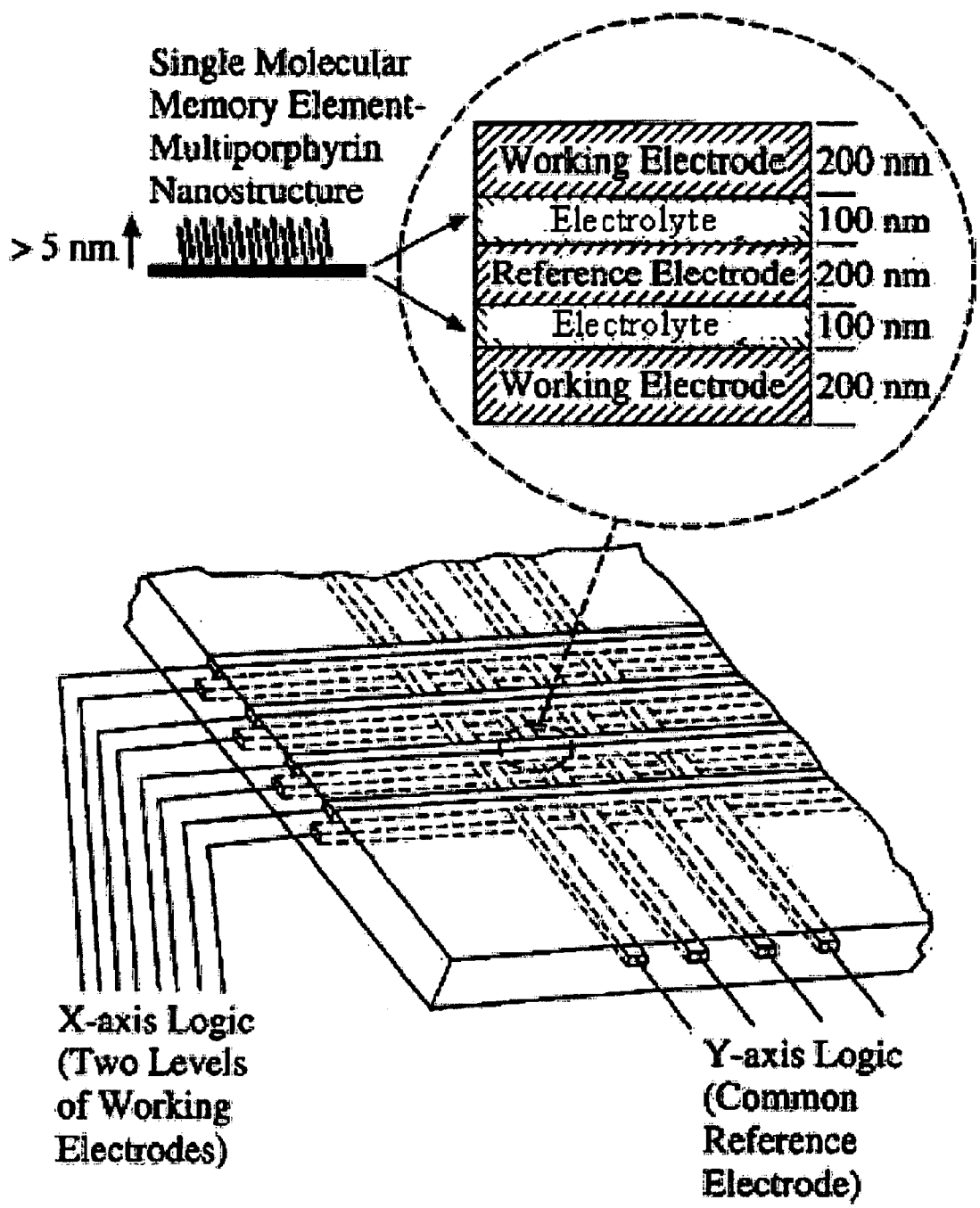
FIG. 4 illustrates the three-dimensional architecture of a single memory storage cell (memory element) on a chip.

In certain embodiments, the storage device includes: (1) A working electrode (e.g., 200 nm thick gold electrode), deposited on a nonconducting base, and line-etched to achieve electrode widths of 10's to 100's of nm. (2) A monolayer of self-assembled porphyrinic nanostructures (storage molecules 105) attached to the gold surface via the sulfur atom of the thiophenol group. (3) A 100-nm thick layer of dielectric material 107 embedded with counterions to ensure electrical connectivity to the reference electrode and stability of the cationic species in the absence of applied potential (latching). (4) A 200-nm thick nonpolarizable reference electrode 103 line-etched in the same fashion as those of the working electrode 101, but assembled with lines orthogonal to the latter electrode. (5) A mirror image construct that utilizes the same reference electrode. Thus, in one embodiment, the three-dimensional architecture of a single memory storage location (memory element) on the chip can look as indicated in FIG. 4.

While the discussion herein of electrodes is with respect to gold electrodes, it will be recognized that numerous other materials will be suitable. Thus, electrode materials include, but are not limited to gold, silver, copper, other metals, metal alloys, organic conductors (e.g. doped polyacetylene, doped polythiophene, etc.), nanostructures, crystals, semiconductors, etc.

Similarly, the substrates used in the fabrication of devices of this invention include, but are not limited to glasses, silicon, minerals (e.g. quartz), plastics, ceramics, membranes, gels, aerogels, semiconductors, type IV materials, type V materials, and the like.

III. Fabrication and Characterization of the Storage Device

A. Fabrication

The memory devices of this invention can be fabricated using standard methods well known to those of skill in the art. In a preferred embodiment, the electrode layer(s) are applied to a suitable substrate (e.g. silica, glass, plastic, ceramic, etc.) according to standard well known methods (see, e.g., Choudhury (1997) *The Handbook of Microlithography, Micromachining, and Microfabrication*, Soc. Photo-Optical Instru. Engineer, Bard & Faulkner (1997) *Fundamentals of Microfabrication*). In addition, examples of the use of micromachining techniques on silicon or borosilicate glass chips can be found in U.S. Pat. Nos. 5,194,133, 5,132,012, 4,908,112, and 4,891,120.

In one embodiment a metal layer is beam sputtered onto the substrate (e.g,. a 10 nm thick chromium adhesion layer is sputtered down followed by a 200 nm thick layer of gold). Then maskless laser ablation lithography (see below), performed e.g., with a Nd:YAG laser, is used to create features with micron dimensions, or with an excimer laser to create features of nanometer dimensions) will create an array of parallel lines of conductor (e.g., gold), that can be used as working electrodes with dimensions ranging between a few microns to a tens of nanometers.

Once the electrode array is formed, the entire array, or portions of the array, or individual electrodes are wetted (e.g. immersed or spotted) with one or more solutions of the appropriate derivatized storage media (e.g. thiol-substituted porphyrin nanostructures), and the constituents of the memory media (e.g., monomeric porphyrin subunits) self-assemble on the micro-sized gold arrays to form the memory elements. It will be appreciated that different solutions can be applied to different regions of the electrode array to produce storage cells comprising different storage medium. Methods of spotting different reagents on surfaces (e.g. on glass surfaces) at densities up to tens of thousands of different species/spots per $cm^2$ are known (see, e.g., U.S. Pat. No. 5,807,522).

Then a suitable electrolyte layer (e.g. a thin layer of Nafion polymer) approximately 1 nm to 1000 nm, preferably about 100 nm to about 500 nm, more preferably about 10 nm to about 100 nm and most preferably about one hundred nanometers thick will be cast over the entire surface of the chip. This polymer serves to hold the electrolyte for electrochemical reaction. Finally, the entire chip can be coated with a layer (e.g., 10 nm to about 1000 nm, more preferably 100 nm to about 300 nm and most preferably about 200) nm of conducting material (e.g. silver) which acts as a reference electrode 103.

The chip is then turned 90 degrees, and maskless laser ablation lithography can be performed again to create a second array of parallel lines that are perpendicular to the original set. This forms a three dimensional array of individual memory elements, where each element is formed by the intersection of these two perpendicular linear arrays (see FIG. 4).

Each individual element can be addressed by selecting the appropriate X and Y logic elements, corresponding to one gold working electrode and one reference electrode separated by the Nafion polymer/electrolyte layer. Since this structure is inherently three dimensional, it should be possible to extend the array into the Z-direction, creating a 3-D array of memory elements as large as it is feasible to connect to.

These structures are initially created on the micron scale. It is possible to decrease the size of these structures to sub-micron dimensions. It is possible to create these structures on a scale similar to silicon microstructures created with conventional nanolithographic techniques (i.e. 100–200 nm). This would allow the interfacing of the memory elements with conventional silicon-based semiconductor electronics.

In the laser-ablation lithography discussed above, coherent light is sent through a beam splitter (50% transmittance) and reflected by a mirror to make two nearly parallel identical beams (Rosenwald et al. (1998) *Anal. Chem.*, 70: 1133–1140). These beams are sent through e.g., a 50 cm focal length lens for ease in focusing to a common point. The placement of the beams is fine-tuned to allow complete overlap of the mode structure of the laser spot. Higher order interference patterns are minimized through the use of high quality optics (1/10 wave surface flatness). This ensures that the variation between intensity maxima and minima in the first order will be several orders of magnitude larger than those formed with second and higher orders. This produces a well-defined pattern of lines across the electrode surface, where the spacing between points of positive interference (D) can be approximated by the Bragg Equation: $n\lambda = 2D \sin(\theta/2)$, where $\lambda$=wavelength, $\theta$=angle between the beams, and n is order. For example, when a Nd:YAG is used at 1064 nm, the recombination of the two beams in this manner generates an interference pattern with ~2 micron spacing when the angle between the 2 beams is 15°. The interference pattern spacing can easily be changed by modifying the angle between the beams. Attenuation of the beam was accomplished by inserting one or more neutral density filters before the beam splitter. In this way, the exposure of the gold layer to the Nd-YAG interference pattern can be performed at different beam attenuations to produce power densities between 1 and 100 $MW/cm^2$.

In certain embodiments, the memory elements comprising the memory devices of this invention are fabricated using "moleholes". In certain embodiments, a "molehole" comprises a two or more arrays of conductors or semiconductors (e.g. electrodes) separated from each other vertically (e.g. by a dialectric, insulator, etc.) so that the conductors overlap each other at least one point. Within one or more intersection point of an upper and lower electrode (e.g. top and bottom interconnect) a well is fabricated. This well penetrates the electrodes, so that the electrodes form a portion of the side and/or bottom of the well.

Storage molecules of this invention are attached to one or more of the exposed conductor surfaces in the wells. Each well can then function as an electrochemical cell permitting electrochemical measurements of the bound molecules. The fabrication and use of such "moleholes" is described in detail in copending application U.S. Ser. No. 10/046,499, filed on Oct. 26, 2001.

B. Electrically Coupling Storage Medium to Electrode.

In the storage devices of this invention, the storage medium is electrically coupled to one or more electrodes. The term "electrical coupling" is used to refer to coupling schemes that permit the storage medium to gain or lose electrons to the electrode. The coupling can be a direct attachment of the storage medium to the electrode, or an indirect attachment (e.g. via a linker). The attachment can be a covalent linkage, an ionic linkage, a linkage driven by hydrogen bonding or can involve no actual chemical attachment, but simply a juxtaposition of the electrode to the storage medium. In some embodiments, the electrode can be some distance (e.g. about 5 Å to about 50 Å) from the storage medium and electrical coupling can be via electron tunneling, or other methods of electron transfer.

In some preferred embodiments, a "linker" is used to attach the molecule(s) of the storage medium to the electrode. The linker can be electrically conductive or it can be short enough that electrons can pass directly or indirectly between the electrode and a molecule of the storage medium (e.g. a storage molecule).

The manner of linking a wide variety of compounds to various surfaces is well known and is amply illustrated in the literature. Means of coupling the molecules comprising the storage medium will be recognized by those of skill in the art. The linkage of the storage medium to a surface can be covalent, or by ionic or other non-covalent interactions. The surface and/or the molecule(s) can be specifically derivatized to provide convenient linking groups (e.g., mercapto, hydroxyl, amino, etc.).

Where a linker is used to couple, e.g. a storage molecule, to a substrate or electrode, the linker can be provided as a component of the storage medium molecule(s) or separately. Linkers, when not joined to the molecules to be linked are often either hetero- or homo-bifunctional molecules that contain two or more reactive sites that may each form a covalent bond with the respective binding partner (i.e. surface or storage medium molecule). When provided as a component of a storage molecule, or attached to a substrate surface, the linkers are preferably spacers having one or more reactive sites suitable for bonding to the respective surface or molecule.

Linkers suitable for joining molecules are well known to those of skill in the art and include, but are not limited to any of a variety of, straight or branched chain carbon linkers, heterocyclic linkers, amino acid or peptide linkers, and the like. In certain embodiments, the linker can be designated as Z—L where Z can be a protected or unprotected reactive site or group on the linker such as a carboxylic acid, alcohol, thiol, selenol or tellurol group. It is understood that attachment to the electrode or other substrate is typically accompanied by loss of a proton (or protecting group) on the reactive site Z. Examples of Z—L— include, but are not limited to 4-carboxyphenyl, 2-(4-carboxyphenyl)ethynyl, 4-(2-(4-carboxyphenyl)ethynyl)phenyl, 4-carboxymethylphenyl, 4-(2-(4-carboxymethylphenyl) ethynyl)phenyl, 4-hydroxyphenyl, 2-(4-hydroxyphenyl) ethynyl, 4-(2-(4-hydroxyphenyl)ethynyl)phenyl, 4-hydroxymethylphenyl, 4-(2-(4-hydroxymethylphenyl) ethynyl)phen 4-mercaptophenyl, 2-(4-mercaptophenyl) ethynyl, 4-(2-(4-mercaptophenyl)ethynyl)phenyl, 4-mercaptomethylphenyl, 4-(2-(4-mercaptomethylphenyl) ethynyl)phenyl, 4-selenylphenyl, 2-(4-selenylphenyl) ethynyl, 4-selenylmethylphenyl, 4-selenylmethylphenyl, 4-(2-(4-selenylphenyl)ethynyl)phenyl, 4-tellurylphenyl, 2-(4-tellurylphenyl)ethynyl, 4-(2-(4-tellurylphenyl)ethynyl) phenyl, 4-tellurylmethylphenyl, 4-(2-(4-tellurylmethylphenyl)ethynyl)phenyl. Other linkers include, but are not limited to 4,4'-diphenylethyne, 4,4'-diphenylbutadiyne, 4,4'-biphenyl, 1,4-phenylene, 4,4'-stilbene, 1,4-bicyclooctane, 4,4'-azobenzene, 4,4'-benzylideneaniline, and 4,4"-terphenyl.

In various embodiments, the linkers comprise one or more reactive groups "Z" that facilitate attachment of the linker to the electrode or other substrate to which the storage molecule is to be coupled. As indicated above, preferred reactive groups include, but are not limited to a carboxylic acid, an amine, a hydroxyl (e.g. alcohol), thiol, selenol or tellurol group, and the like. Linkers and/or reactive groups are often selected so that the molecules will self-assemble on the target substrate. Thus, for example, linkers comprising a sulfur will self-assemble onto a gold substrate.

Where the substrate (e.g. electrode) to which the storage molecule(s) are to be coupled comprises a group IV element (e.g. silicon, germanium, doped silicon, doped germanium, etc.) the molecules are readily coupled to the surface if provided with either a thiol group or an alcohol or with a linker comprising a thiol group or an alcohol. Methods of coupling a molecule comprising an alcohol or a thiol to a group IV element are described in copending application U.S. Ser. No. 10\040,059, filed on Oct. 26, 2001.

Basically, the method involves halogenating the group IV element surface; providing a solution comprising the molecule to be coupled to the surface where the alcohol terminated (e.g., terminated with an alcohol selected from the group consisting of a primary alcohol, a secondary alcohol, a tertiary alcohol, a benzyl alcohol, and an aryl alcohol) or thiol terminated (e.g., a primary thiol, a secondary thiol, a tertiary thiol, a benzyl thiol, an arylthiol, etc.) and present in a solvent and said alcohol-terminated organic molecule is in a solvent (e.g., mesitylene, durene, o-dichlorobenzene, 1,2, 4,-trichlorobenzene, 1-chloronaphthalene, 2-chloronaphthalene, N,N-dimethylformamide, N,N-dimethylacetamide, N,N-dimethylpropionamide, benzonitrile, anisole, etc.); and contacting the solution with the group IV element surface under conditions where the solvent is rapidly removed from the surface whereby the organic molecule is coupled to said surface through an E—O— or an E—S— bond where E is the group IV element (e.g. silicon, germanium, doped silicon, doped germanium, etc.). The reaction is preferably performed in the presence of a base (e.g. 2,4,6-collidine, 2,6-lutidine, 2,6-di-tert-butylpyridine, 4-dimethylaminopyridine, trimethylamine, triethylamine, tributylamine, N,N-diisopropylethylamine, 1,8-bis(dimethylamino)naphthalene, 1,5-diazabicyclo [4.3.0]non-5-ene, 1,8-diazabicyclo[5.4.0]undec-7-ene, $Na_2CO_3$, $NH_3$, etc.). Typically the surface is heated to a temperature of at least about 70° C.

Using the teachings provided herein, other methods of coupling a storage molecule and/or molecules of a storage medium to one or more electrodes, or other substrates, will be routinely implemented by one of skill in the art.

C. Addressing the Memory Cells

Addressing of the storage cell(s) in the devices of this invention is relatively straightforward. In one simple approach a discrete pair of electrodes (e.g., one working and one reference electrode) can be connected to every storage cell. Individual reference electrodes, however are not required and can be replaced with one or more common reference electrodes connected to all or to a subset of all of the storage elements in a particular device. Alternatively, the common reference electrodes can be replaced with one or more conductive "backplanes" each communicating to all, or to a subset, of the storage cells in a particular device.

Where the storage cells contain identical storage media, in certain embodiments, each storage cell is addressed with a separate working electrode so that the storage (oxidation) states of the storage cells can be distinguished from each other. Where the storage cells contain different storage media such that the oxidation states of one storage cell are different and distinguishable from the oxidation states of another storage cell, the storage cells are can be addressed by a common working electrode thereby reducing the number of electrodes in a device.

In certain embodiments, the storage devices of this invention contain 64, 128, 256, 512, 1024 or more storage locations per layer (64, 128, 256, 512, 1024 or more locations in the mirror image architecture) with each location capable of storing one or more bits (e.g., holding a two bit word). Accordingly, in certain embodiments, a 1024-bit or a 512-bit chip can contain 8 wiring interconnects on each of the three electrode grids in the 3-dimensional architecture illustrated in FIG. 4.

D) Characterization of the Memory Device

The performance (e.g. operating characteristics) of the memory devices of this invention is characterized by any of a wide variety of methods, most preferably by electrochemical methods (amperometry and sinusoidal voltammetry, see, e.g., Howell et al. (1986) *Electroanal. Chem.*, 209: 77–90; Singhal and Kuhr. (1997) *Anal. Chem.*, 69: 1662–1668), optical spectroscopy (Schick et al. (1989) *J. Am. Chem. Soc.* 111: 1344–1350), atomic force microscopy, electron microscopy and imaging spectroscopic methods. Surface-enhanced resonance and Raman spectroscopy are also used to examine the storage medium on the electrodes.

Among other parameters, characterization of the memory devices (e.g., memory cells) involves determining the number of storage medium molecules (e.g., porphyrin arrays) required for defect-tolerant operation. Defect tolerance includes factors such as reliably depositing the required number of holes to write the desired digit and accurately detecting the numbers/transfer rates of the holes.

The long-term resistance of electron/holes to charge-recombination in the solid-phase medium of the device package is also determined. Using these parameters, the device architecture can be optimized for commercial fabrication.

IV. Architecture of the Storage Medium

The storage medium used in the devices of this invention typically comprises one or more species of storage molecule. A preferred storage medium is characterized by having a multiplicity of different and distinguishable oxidation states. Those oxidation states are typically provided by one or more storage molecules where the storage molecule(s) comprise one or more redox-active units. A redox-active unit refers to a molecule or to a subunit of a molecule that has one or more discrete oxidation states that can be set by application of an appropriate voltage. Thus, for example, in one embodiment, the storage medium can comprise one species of redox-active molecule where that molecule has two or more (e.g. 8) different and distinguishable oxidation states. Where each species of storage molecule has a single, non-neutral, oxidation state, the storage medium achieves multiple bit storage by having a plurality of such molecules where each molecule has a different and distinguishable oxidation state (e.g. each species of molecule oxidizes at a different and distinguishable potential). In certain preferred embodiments, the storage medium comprises at least one species of storage molecule that has a plurality of different and distinguishable oxidation states.

As indicated above, the storage medium can be broken down into individual, e.g., spatially segregated, storage locations (storage elements). Each storage element can have a storage medium that is the same or different from the other storage elements in the chip and/or system. Where the storage elements are of identical composition, in preferred embodiments, they are separately addressed so that information in one element can be distinguished from information in another element. Where the storage elements are of different composition they can be commonly addressed (where the oxidation states of the commonly addressed storage elements are distinguishable) or they can be individually addressed.

In certain preferred embodiments the storage medium is combined with or juxtaposed to a dielectric medium to insure electrical connectivity to an electrode (e.g. a reference electrode, a reference backplane, etc.). In certain preferred embodiments, a layer of dielectric material is imbedded with counterions to ensure electrical connectivity to the reference electrode and stability of the cationic species in the absence of applied potential (latching) disposed between the reference working electrode(s).

Dielectric materials suitable for the devices of this invention are well known to those of skill in the art. Such materials include, but are not limited to Nafion™ polymer, cellulose acetate, polystyrene sulfonate, poly (vinylpyridine), electronically conducting polymers such as polypyrrole and polyaniline, etc.

The sandwich coordination compounds identified herein are ideally suited for molecular based memory storage. These compounds have desirable electroactive properties, available modular synthetic chemistry, and in conjunction with thiols, and other linkers described herein, undergo directed self-assembly on surfaces (e.g. electrodes, silicon substrates, etc.).

A. Sandwich Coordination Compounds

Figure 5:
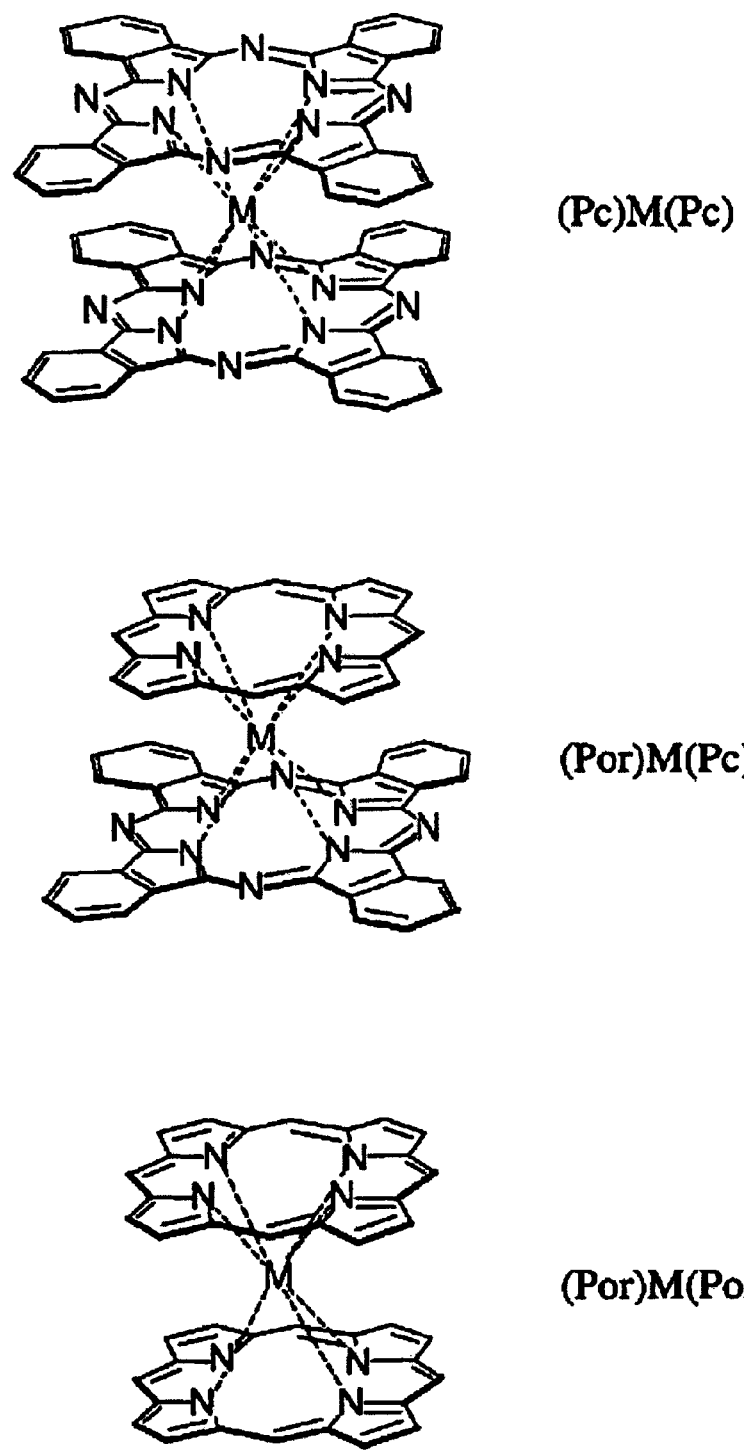
FIG. 5 shows examples of double-decker sandwich coordination compound architectures.

A variety of double-decker and triple-decker sandwich molecules comprised of porphyrinic macrocycles and metals are known to those of skill in the art (see, e.g., Jiang et al. (1997) *Inorg. Chim. Acta* 255: 59–64; Ng et al. (1997) *Chem. Soc. Rev.*, 26, 433–442; Chabach et al., (1996) *Angew. Chem. Int. Ed. Engl.*, 35: 898–899). Preferred sandwich molecules for use in the present invention comprise metals, e.g., of the lanthanide series and Y, as well as others discussed below, that have properties similar to those of the lanthanides. Examples of various double-decker architectures are shown in FIG. 5. The architectures include a bis-phthalocyanine sandwich molecule ((Pc)M(Pc)), a bis-porphyrin sandwich molecule ((Por)M(Por)), and a hybrid phthalocyanine-porphyrin sandwich molecule ((Pc)M(Por)). It is understood that each porphyrinic macrocycle can bear substituents at the peripheral beta- or meso-carbon atoms (not shown). A phthalocyanine can have substituents at the alpha and beta positions, etc. In the bis-porphyrinic sandwich molecules, the two macrocycles can be identical (homoleptic) or different (heteroleptic).

Figure 6:
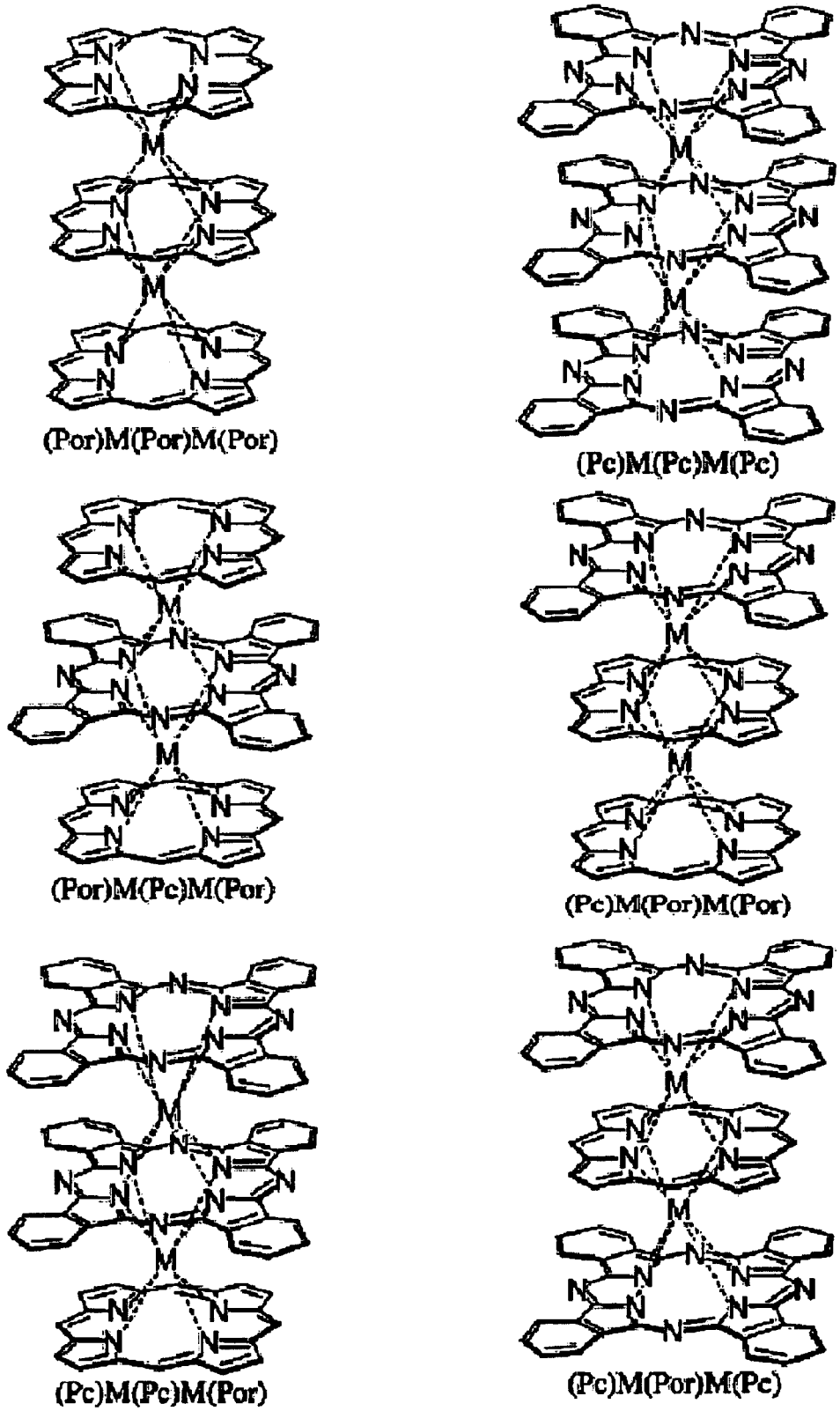
FIG. 6 shows examples of triple-decker sandwich coordination compound architectures.

Examples of various triple-decker architectures are shown in FIG. 6. The architectures include an all-phthalocyanine sandwich molecule ((Pc)M(Pc)M(Pc)), an all-porphyrin sandwich molecule ((Por)M(Por)M(Por)), two configurations of two porphyrins and one phthalocyanine ((Por)M(Pc)M(Por), (Pc)M(Por)M(Por)) and two configurations of one porphyrin and two phthalocyanines ((Pc)M(Por)M(Pc), (Pc)M(Pc)M(Por)). It is understood that each porphyrinic macrocycle can bear substituents at the peripheral carbon atoms (not shown). It is also understood that the two metals in the triple decker can be identical or different (not shown). Heteronuclear heteroleptic or homoleptic complexes can also be prepared (heteronuclear refers to the use of different metals in the triple decker coordination compound).

The triple deckers are attractive for molecular-based information storage due to the multiple accessible oxidation states (which in turn are a consequence of the tight coupling of the porphyrinic macrocycles in the sandwich architectures). The triple deckers generally exhibit four oxidation potentials in the range 0.1–1.4 V (vs. Ag/Ag$^+$). (Note that all potentials denoted here are referenced to, or have been scaled to, the Ag/Ag$^+$ electrode for internal consistency. Reported values measured against the saturated calomel electrode have had 170 mV subtracted in order to give a value appropriate for the Ag/Ag$^+$ electrode, based on the use of ferrocene as a standard.) For example, the (Por)Eu(Pc)Eu(Por) triple decker with Ar=4-t-butylphenyl gave anodic waves at 0.23, 0.62, 0.95, and 1.23 V, corresponding to formation of the monocation, dication, trication, and tetracation, respectively (Jiang et al. (1998) *Inorg. Chim. Acta*, 268: 49–53).

Particular examples of sandwich coordination compounds that may be used to carry out the present invention have the Formula I (for double-decker sandwich compounds) or Formula II (for triple-decker sandwich compounds):

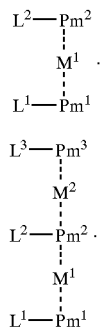

where $M^1$ and $M^2$ (when present) are metals, more preferably metals independently selected from the group consisting of metals of the lanthanide series (Ln=La, Ce, Pr, Nd, Pm, Sm, Eu, Gd, Tb, Dy, Ho, Er, Tm, Yb, Lu, as well as Y, Zr, Hf, and Bi, and in the actinide series Th and U (radioactive elements such as Pm are generally less preferred); $Pm^1$, $Pm^2$, and $Pm^3$ (when present) are independently selected redox-active molecules or subunits (e.g., porphyrinic macrocycles); and $L^1$, $L^2$, and $L^3$ may be present or absent and, when present, are independently selected linkers, e.g., as described above (the linker preferably including a protected or unprotected reactive group, e.g. thiol, selenol, alcohol, or tellurol group). Preferably, at least one of $L^1$, $L^2$, and $L^3$ is present.

It will also be appreciated that each redox-active molecule/unit Pm can be substituted with a single linker L, or can be multiply substituted with linkers L, as explained in greater detail below. Thus the molecule of Formula I or Formula II can be covalently linked to an electrode or substrate by at least one of $L^1$, $L^2$, and $L^3$.

Each redox-active molecule/unit Pm can be further substituted without departing from the scope of the compounds of Formula I or Formula II. For example, and as explained in greater detail below, ligands may be covalently joined to a metallocene group, to another porphyrinic macrocycle, to a ligand of another sandwich coordination compound, etc.

Particular embodiments of the compounds of Formula I and II above, which provide additional memory storage as discussed below, are those represented by Formula III and Formula IV:

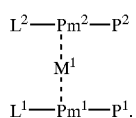

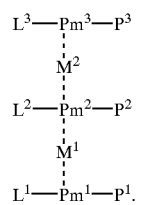

where $M^1$ and $M^2$ are metals, e.g. as given above; $Pm^1$, $Pm^2$, and $Pm^3$ are as given above; $L^1$, $L^2$, and $L^3$ are as given above; and $P^1$, $P^2$, and $P^3$ can be present or absent and, when present, represent an independently selected oxidizable group such as a porphyrinic macrocycle, a metallocene such as ferrocene, etc. (that can be joined to the corresponding $Pm^n$ through a linker, e.g. as described below).

Thus, particular embodiments of Formulas I and II that also provide additional storage capability include the case where two sandwich coordination compounds are linked together, as represented by Formula V and Formula VI below:

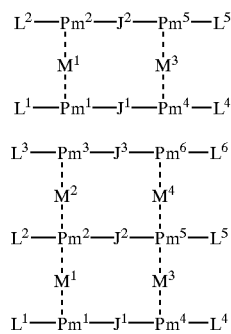

where $M^1$ and $M^2$ are as given above and $M^3$ and $M^4$ are independently selected from the same group as $M^1$ and $M^2$; $Pm^1$, $Pm^2$ and $Pm^3$ are as given above, and $Pm^4$, $Pm^5$, and $Pm^6$ are independently selected from the same group as $Pm^1$, $Pm^2$, and $Pm^3$; $L^1$, $L^2$ and $L^3$ may be present or absent and are as given above, and $L^4$, $L^5$, and $L^6$ can be present or absent and are independently selected from the same group as $L^1$, $L^2$, and $L^3$ (subject to the proviso that, in certain embodiments, at least one of $L^1$ through $L^6$ is present); and $J^1$, $J^2$, and $J^3$ can be present or absent and when present represent independently selected linkers (subject to the proviso that at least one of $J^1$, $J^2$, or $J^3$ is present). Each linker $J^n$ can be a linker of the same category or structure as described with respect to linker $L^1$ herein, but is preferably a linear linker.

Compounds of Formula V and VI above may be further substituted, e.g., in the manner described in connection with the compounds of Formulas III and IV above, to provide compounds of Formula VII and Formula VIII below (such compounds, particularly those of Formula VIII, provide an architecture that enables the storage of multiple bits of information.

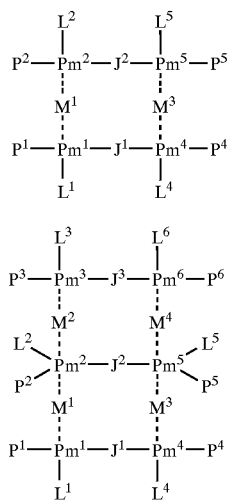

where $M^1$, $M^2$, $M^3$ and $M^4$ are as given above; $Pm^1$, $Pm^2$, $Pm^3$, $Pm^4$, $Pm^5$, and $Pm^6$ are as given above; $L^1$, $L^2$, $L^3$, $L^4$, $L^5$, and $L^6$ are as given above; $J^1$, $J^2$, and $J^3$ can be present or absent and when present represent independently selected linkers (subject to the proviso that at least one of $J^1$, $J^2$, or $J^3$ is present); $P^1$, $P^2$, and $P^3$ are as given above, and $P^4$, $P^5$, and $P^6$ are independently selected from the same group as $P^1$, $P^2$ and $P^3$.

In the compounds of Formula V and VII above, $Pm^5$ could further be substituted or extended with $—M^4—Pm^6—L^6$, or $—M^4—Pm^6—L^6P^6$, as where a double decker compound is linked to a triple decker compound.

Particular examples of porphyrinic macrocycles that can be used as storage molecules to carry out the present invention include compounds of the Formula IX and Formula X below:

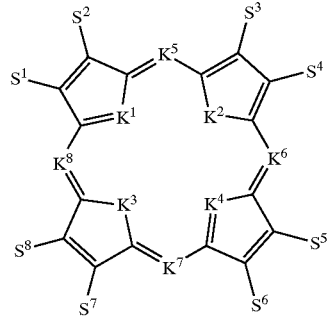

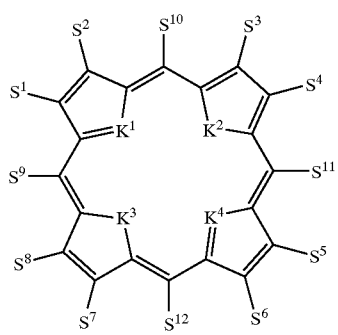

where: $K^1$, $K^2$, $K^3$, $K^4$, $K^5$, $K^6$, $K^7$, and $K^8$ are independently selected from the group consisting of N, O, S, Se, Te, and CH; $S^1$, $S^2$, $S^3$, $S^4$, $S^5$, $S^6$, $S^7$, $S^8$, $S^9$, $S^{10}$, $S^{11}$, and $S^{12}$ are independently selected substituents that preferably provide a redox potential of less than about 5, 2 or even 1 volt. Example substituents, e.g. $S^1$, $S^2$, $S^3$, and $S^4$, include, but are not limited to, H, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl.

In addition, each pair of $S^1$ and $S^2$, $S^3$ and $S^4$, $S^5$ and $S^6$, and $S^7$ and $S^8$, can independently form an annulated arene, e.g., a benzene, naphthalene, anthracene, etc. which in turn can be unsubstituted or substituted one or more times with a substituent that preferably provides a redox potential of less than about 5, 2 or even 1 volt, such as H, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl. Examples of such annulated arenes include, but are not limited to:

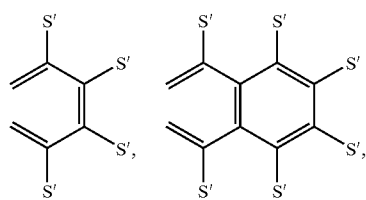

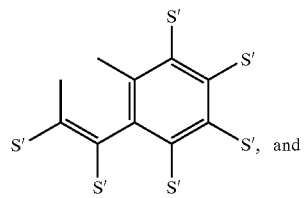

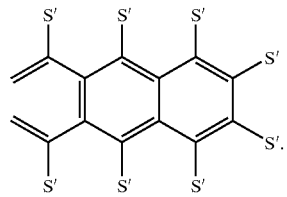

(It being understood that the rings are appropriately conjugated to retain aromaticity of the fused rings); and wherein each substituent S' is independently selected and preferably provides a redox potential of less than about 5, 2 or even 1 volt. Examples of such substituents include, but are not limited to H, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl. Particular examples of compounds of Formulas X and XI containing anullated arenes are exemplified by Formulas XIV–XVII below.

To link the sandwich coordination compound to a substrate, or to another compound such as another sandwich coordination compound in the manners described above, at least one ligand in the sandwich coordination compound can contain at least one substituent $S^1$ through $S^n$ or S' which is a linker, particularly a linker containing a reactive group (where multiple linkers are substituted on the ligand, the linkers may be the same or independently selected). Such linkers are designated as Z—L— herein, where: L is a linker, and Z is a substrate, an electrode, a protected or unprotected reactive site or group that can covalently couple to a substrate, or a protected or unprotected reactive site or group that can ionically couple to a substrate.

L can include a linear linker, an oblique linker, and the like, with linear linkers currently preferred. Examples of oblique linkers include, but are not limited to, 4,3'-diphenylethyne, 4,3'-diphenylbutadiyne, 4,3'-biphenyl, 1,3-phenylene, 4,3'-stilbene, 4,3'-azobenzene, 4,3'-benzylideneaniline, and 4,3"-terphenyl. Examples of linear linkers include, but are not limited to, 4,4'-diphenylethyne, 4,4'-diphenylbutadiyne, 4,4'-biphenyl, 1,4-phenylene, 4,4'-stilbene, 1,4-bicyclooctane, 4,4'-azobenzene, 4,4'-benzylideneaniline, and 4,4"-terphenyl.

Z can be a protected or unprotected reactive site or group on the linker such as a carboxylic acid, amine, alcohol, thiol, selenol or tellurol group.

Thus, examples of Z—L— include, but are not limited to those described above.

Examples of porphyrinic macrocycles that contain annulated arenes as described above include, but are not limited to, ligands of Formulas XIV, XV, XVI, and XVII below:

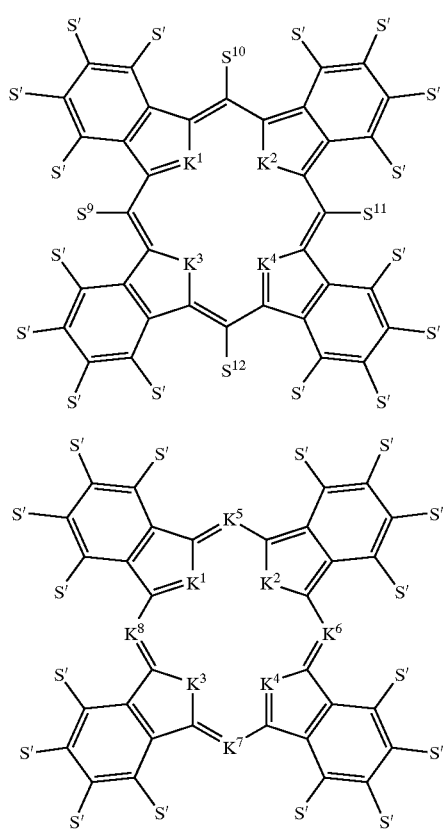

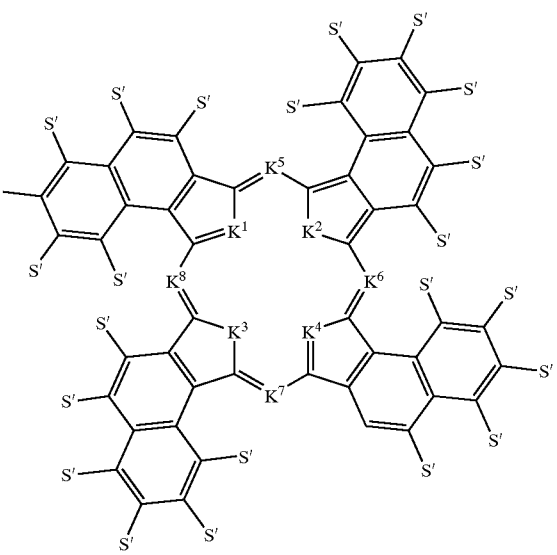

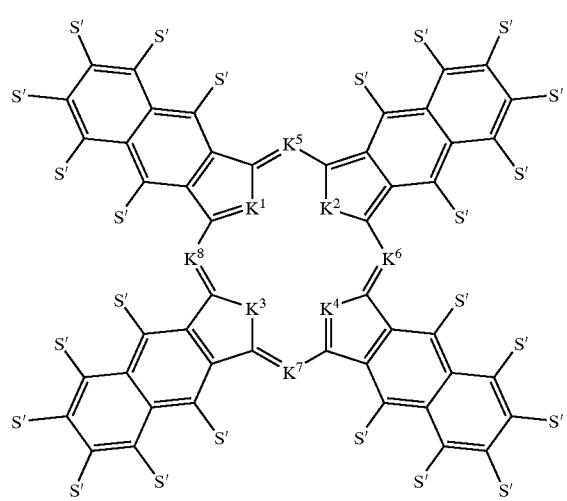

where each substituent S' is independently selected and preferably provides a redox potential of less than about 5, 2 or even 1 volt. Examples of such substituents include but are not limited to, H, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl. Again, linkage of the sandwich coordination compound to a substrate, or to another compound such as another sandwich coordination compound in the manners described above, is facilitated by embodiments wherein at least one ligand in the sandwich coordination compound contains at least one substituent S' which is a linker, particularly a linker containing a reactive group (where multiple linkers are substituted on the ligand, the linkers may be the same or independently selected). Such linkers include, but are not limited to, the linkers described above.

B. Multimeric Triple Decker Sandwich Compounds as Counters/registers

In certain preferred embodiments, the storage molecules of this invention comprise multimeric molecules where each monomer comprising the multimer is a triple-decker or double decker sandwich. In certain embodiments, the multimeric storage molecules comprise between 2 and about 3, 5, 7, or 10 triple decker and/or double decker sandwich molecules. In certain preferred embodiments, the multimeric molecules are triple-decker sandwich dyads (more preferably triple-decker heterodimers). It was a discovery of this invention that while mixtures of triple decker sandwich molecules would partition equally onto a surface, the mixed triple-decker SAMs exhibited very poorly resolved redox waves. Without being bound by a particular theory, it is believed that this behavior is most likely due to the formation of very heterogeneous monolayers owing to the different molecular shapes (because of the different macrocycle substituents) of the two types of triple deckers.

In contrast, it was a surprising discovery of this invention that dyads comprising covalently linked triple-decker sandwich molecules exhibit well-resolved redox features (unlike the mixed triple-decker SAMs) and are excellent candidates for preparing multistate counters.

In general, a triple-decker dyad having 8 different and distinguishable oxidation states can store three bits of information, as illustrated in Table 1.

TABLE 1

Oxidation states of the triple decker dyad encoding 3 bits of information.

| Oxidation State | Bit 1 | Bit 2 | Bit 3 |
|---|---|---|---|
| 1 | 0 | 0 | 0 |
| 2 | 0 | 0 | 1 |
| 3 | 0 | 1 | 0 |
| 4 | 0 | 1 | 1 |
| 5 | 1 | 0 | 0 |
| 6 | 1 | 0 | 1 |
| 7 | 1 | 1 | 0 |
| 8 | 1 | 1 | 1 |

In certain preferred embodiments, the triple-decker dyads comprise one of three different architectures. In one architecture, the triple deckers are arranged vertically wherein the planes of the macrocycles are anticipated to be (approximately) perpendicular to the plane of the surface. This dyad contains a single substrate linker and is designated V1. In the second and third architectures, the triple deckers are arranged horizontally, again with the planes of the macrocycles anticipated to be (approximately) perpendicular to the plane of the surface (see e.g., FIG. 8). One of these dyads contains a single substrate linker, and is designated H1, whereas the other contains a linker on each of the triple-decker building blocks and is designated H2.

Preferred triple-decker dyads comprise two triple decker molecules covalently linked to each other (directly or through a linker), although multimeric triple-decker compounds (e.g. comprising 3, 5, 7, 10, etc. different triple-decker sandwich compounds) are contemplated. Preferred triple decker molecules for use in such dyads include the following triple decker sandwich molecules: $Por^1M^1Por^2M^2Por^3$, $Por^1M^1Pc^1M^2Por^2$, $Pc^1M^1Pc^2M^2Por^1$, $Pc^1M^1Pc^2M^2Pc^3$, $Pc^1M^1Por^1M^2Por^2$, and $Pc^1M^1Por^1M^2Pc^2$, where $M^1$ and $M^2$ are the same or different and each is a metal (e.g. a member of the lanthanide series or the actinide series), $Por^1$, $Por^2$, and $Por^3$ are the same or different and each is a porphyrinato species; and $Pc^1$, $Pc^2$, and $Pc^3$ are the same or different and each is a phthalocyaninato species. Particularly preferred triple-decker molecules for use in the multimeric sandwich molecules of this invention include $Por^1Ln^1Pc^1Ln^2Por^2$, $Pc^1Ln^1Por^1Ln^2Pc^2$, and $Pc^1Ln^1Pc^2Ln^2Por^1$ where $Por^1$ and $Por^2$ are porphyrinato species, $Pc^1$ and $Pc^2$ are phthalocyaninato species, $Ln^1$ and $Ln^2$ are the same or different and each is a lanthanide or an actinide, more preferably a lanthanide.

A family of such molecules can be created. Tuning of the oxidation potentials can be achieved by variation in the nature of the porphyrin meso-substituents, the porphyrin beta-substituents, the phthalocyanine substituents (e.g., R=alkyl, perfluoroalkyl, alkoxy, alkylthio, etc.), replacement of the skeletal atoms of the porphyrin or phthalocyanine macrocycles, and the nature of the sandwiched metals ($M^1$, $M^2$, $M^3$, and $M^4$). It is understood that such variations in molecular structure (not displayed in the Figures) can be utilized in order to tune the electrochemical potentials as desired.

Figure 9:
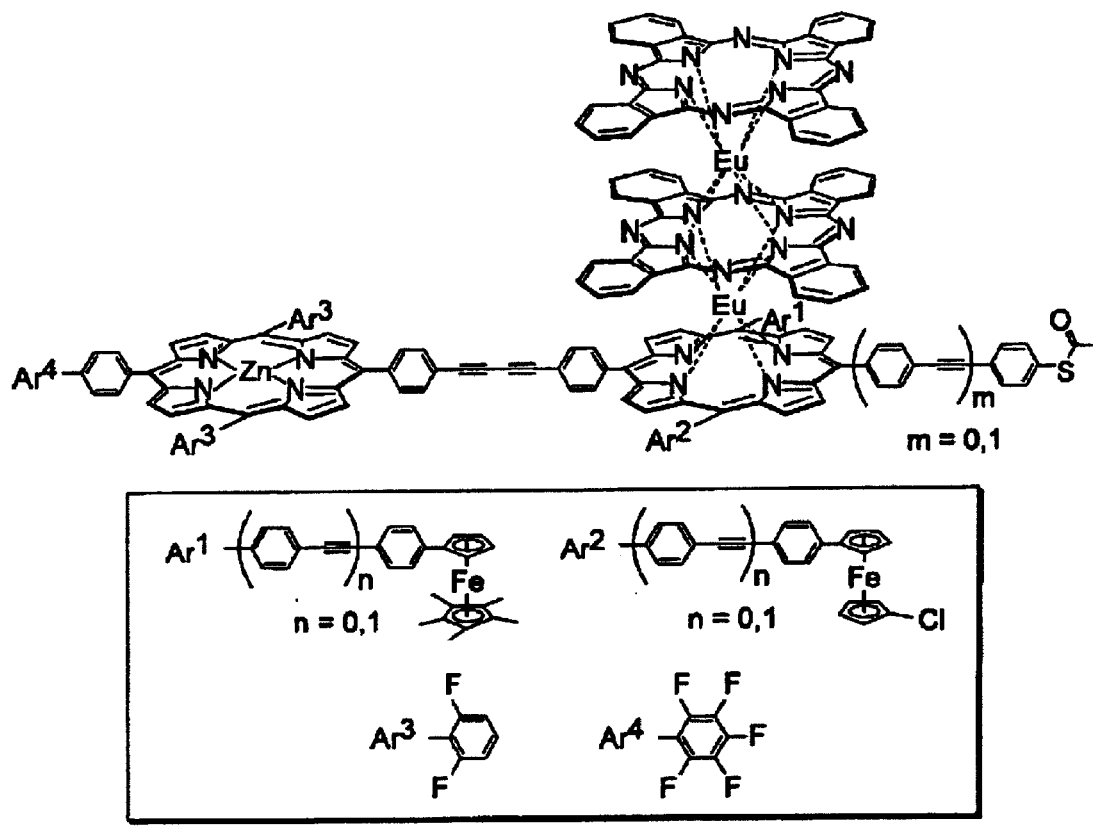
FIG. 9 shows a sandwich molecule in which one porphyrin bears four different meso-substituents.
Figure 10:
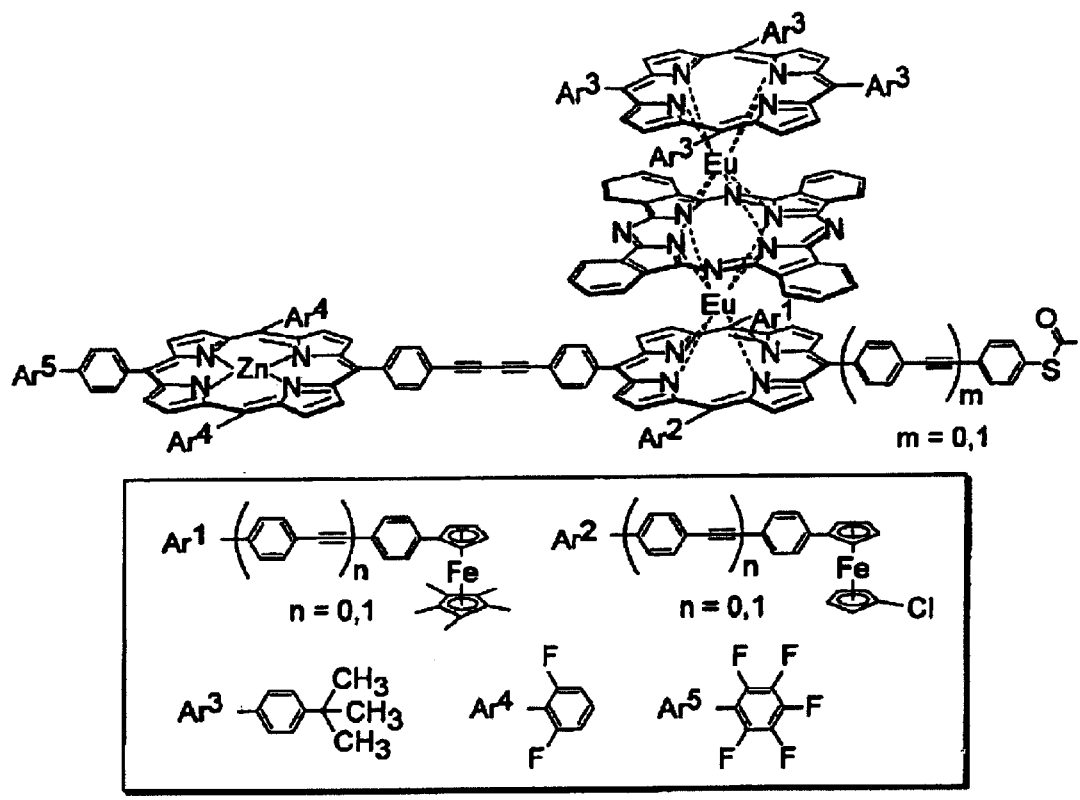
FIG. 10 displays a sandwich compound architecture that employs a (Por)Eu(Pc)Eu(Por) triple decker rather than a (Pc)Eu(Pc)Eu(Por) architecture.

Other architectures can be employed where one triple decker is substituted with redox-active groups such as porphyrins or ferrocenes, as illustrated in Formula III and Formula IV above. Examples of such substituted triple-decker molecules are illustrated in FIGS. 9 and 10. In FIG. 9, one porphyrin bears four different meso-substituents, of which one includes a protected thiol unit for ultimate attachment to an electroactive surface. The remaining three meso-substituents are redox-active units, including two substituted ferrocene molecules and one porphyrin molecule. These redox-active units are chosen so that their oxidation potentials are interleaved with that of the triple-decker sandwich unit. Various linkers can be used to attach the ferrocene units to the porphyrin. A p-phenylene unit (n=0) and a 4,4'-diphenylethyne unit (n=1) are shown. The selection of the linkers is based on synthetic feasibility and the electronic communication properties of the linkers. The choice of p-phenylene or diarylethyne linker is not expected to alter significantly the intrinsic electrochemical properties of the ferrocene or porphyrin units.

FIG. 10 displays a related architecture that employs a (Por)Eu(Pc)Eu(Por) triple decker rather than a (Pc)Eu(Pc)Eu(Por) architecture used in FIG. 9. In some cases the (Por)Eu(Pc)Eu(Pc) architecture shifts the first and second oxidation potential (but not the third or fourth) to lower potential by about 100–200 mV. This distinction can be exploited in synthetic design where the substituents are selected to have oxidation potentials that interleave appropriately with those of the triple-decker unit.

In certain embodiments, the triple-decker sandwich molecules comprising the multimeric storage molecule are joined, directly or through a linker joining porphyrinato species or the phthalocyaninato species comprising each triple-decker sandwich. In certain embodiments, a porphyrinato species of one triple-decker can be joined to a phthalocyaninato species of another triple decker. The triple-decker molecules can be joined by a one or more bonds and/or by one or more linkers. Certain particularly preferred triple-decker dyads are joined through a porphyrinato species, e.g. as illustrated by Formulas XVIII and XIX:

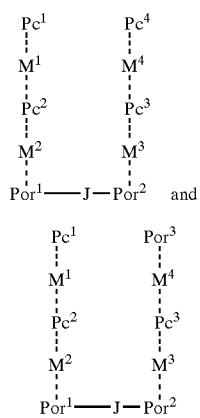

where $M^1$, $M^2$, $M^3$, and $M^4$ are metals independently selected from the lanthanide series or the actinide series; $Por^1$, $Por^2$, $Por^3$, and $Por^4$ are are the same or different and each is a porphyrinato species; $Pc^1$, $Pc^2$, $Pc^3$, and $Pc^4$ are the same or different and are each phthalocyaninato species; and J is a covalent bond or a linker.

In certain embodiments, the triple-decker dyads include, but are not limited to, molecules of Formula XX:

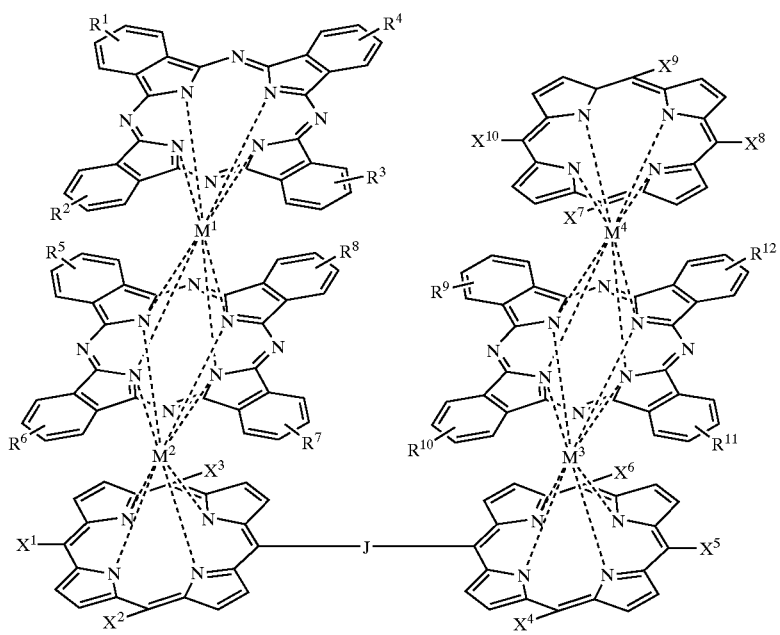

where $R^1$ $R^2$, $R^3$, $R^4$, $R^5$, $R^6$, $R^7$, $R^8$, $R^9$, $R^{10}$, $R^{11}$, and $R^{12}$ are independently selected and can include, but are not limited to a covalent bond, a linker, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. Particularly preferred substituents include methyl, t-butyl, butoxy, fluoro, and H (no substituent). $X^1$, $X^2$, $X^3$, $X^4$, $X^5$, $X^6$, $X^7$, $X^8$, $X^9$, and $X^{10}$ are independently selected from the group consisting of a covalent bond, a linker, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. Particularly preferred substituents include 4-methylphenyl, 4-t-butylphenyl, 4-trifluoromethylphenyl, pentyl, and H (no substituent). In certain preferred emdiments, at least one R or X is a covalent bond or a linker. J is a covalent bond or a linker; and $M^1$, $M^2$, $M^3$, and $M^4$ are independently selected metals from the lanthanide or actinide series, e.g. as described above. It will be appreciated that the storage molecules, e.g. of formula XX can be obtained as a mixture of diastereoisomers. In certain embodiments, one or more diastereoisomers can be isolated as desired.

In certain embodiments, $M^1$, $M^2$, and $M^4$ are the same metal (e.g. Eu), and $M^3$ is a different metal (e.g. Ce). In certain embodiments, $R^1$, $R^2$, $R^3$, $R^4$, $R^5$, $R^6$, $R^7$, $R^8$, $R^9$, $R^{10}$, $R^{11}$, and $R^{12}$ are the same. In certain embodiments, $X^5$ is a linker, while in certain other embodiments, $X^3$ and $X^4$ are both linkers. In certain embodiments, $X^1$, $X^2$, and $X^3$ are the same, and $X^5$ is a linker. In particularly preferred embodiments, J is a linker, e.g. 4,4'-diphenylethyne, 4,4'-diphenylbutadiyne, 4,4'-biphenyl, 1,4-phenylene, 4,4'-stilbene, 1,4-bicyclooctane, 4,4'-azobenzene, 4,4'-benzylideneaniline, 4,4''-terphenyl, etc. Particularly preferred storage molecues are illustrated by dyad2, dyad3, dyad4, and dyad5.

In certain embodiments, the triple-decker dyads include, but are not limited to, molecules of Formula XXI:

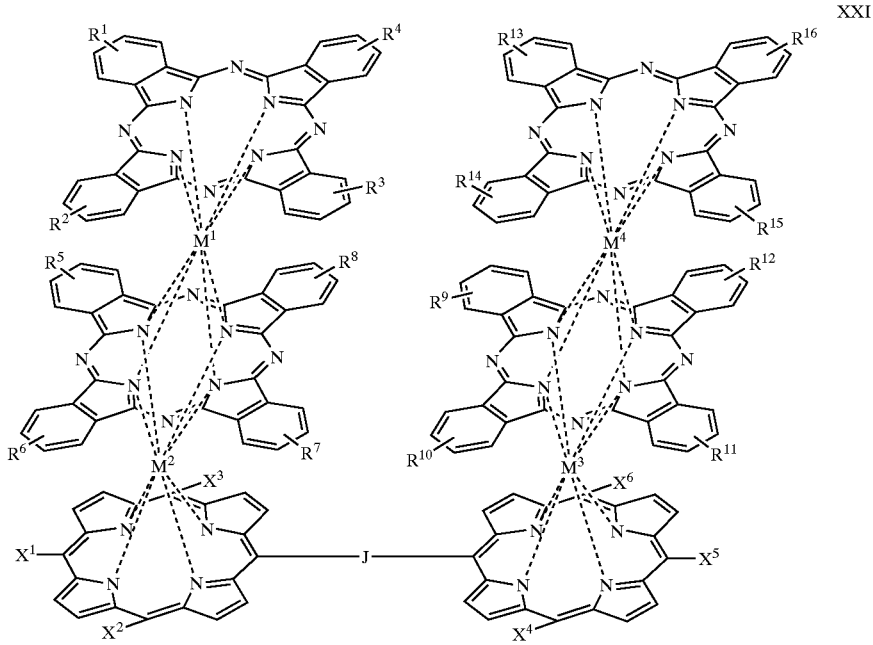

XXI where $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ are independently selected from the group consisting of a covalent bond, a linker, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. Particularly preferred R's include methyl, t-butyl, butoxy, fluoro, and H (no substituent). $X^1$, $X^2$, $X^3$, $X^4$, $X^5$, and $X^6$ are independently selected from the group consisting of a covalent bond, a linker, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. Particularly preferred substituents include 4-methylphenyl, 4-t-butylphenyl, 4-trifluoromethylphenyl, pentyl, and H (no substituent). In certain preferred embodiments, at least one R or X is a covalent bond or a linker. J is a covalent bond or linker (e.g. 4,4'-diphenylethyne, 4,4'-diphenylbutadiyne, 4,4'-biphenyl, 1,4-phenylene, 4,4'-stilbene, 1,4-bicyclooctane, 4,4'-azobenzene, 4,4'-benzylideneaniline, and 4,4"-terphenyl, etc.). $M^1$, $M^2$, $M^3$, and $M^4$ are independently selected metals, e.g., from the lanthanide or actinide series.

In certain embodiments, $M^1$, $M^2$, and $M^4$ are the same. In certain embodiments, $M^1$, M2, and $M^4$ are the same (e.g. Eu) and $M^3$ is different (e.g. Ce). In certain embodiments, $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ are the same. In certain embodiments, $X^5$ is a linker. In certain embodiments, $X^3$ and $X^4$ are linkers. In certain embodiments, $X^1$, $X^2$, and $X^3$ are the same, and $X^5$ is a linker. In certain embodiments, the storage molecule has the formula of dyad1.

As indicated above, the storage medium is juxtaposed in the proximity of an electrode of an apparatus of the invention such that electrons can pass from said storage medium to said electrode. In various embodiments, the storage medium may be juxtaposed to a dielectric material embedded with counterions. Typically, the storage medium and the electrode are fully encapsulated in an integrated circuit. In certain embodiments, the storage medium is electronically coupled to a second electrode that is a reference electrode.

The storage medium can be present on a single plane of a device, and can be present at a multiplicity of storage locations in the device. In certain embodiments, the storage locations are present on multiple planes of the apparatus. Each storage location can be addressed by a single electrode, two electrodes, or more. In an assembled device the electrodes can be connected to a voltage source such as the output of an integrated circuit, and/or the electrode may be connected to a device to read the oxidation state of said storage medium (e.g., a voltammetric device, an amperometric device, a potentiometric device). Such a device can be a device that facilitates/performs cyclic voltammetry, e.g., a sinusoidal voltammeter. The device may provide a Fourier transform of the output signal from said electrode. The apparatus can be assembled or programmed to refresh the oxidation state of said storage medium after reading the oxidation state.

V. Synthesis and Characterization of Storage Medium Molecule(s)

A. Designing Oxidation States into the Storage Medium Molecule(s)

Control over the hole-storage and hole-hopping properties of the redox-active units of the storage molecules used in the memory devices of this invention allows fine control over the architecture of the memory device.

Such control is exercised through synthetic design. The hole-storage properties depend on the oxidation potential of the redox-active units or subunits that are themselves or that are used to assemble the storage media used in the devices of this invention. The hole-storage properties and redox potential can be tuned with precision by choice of base molecule(s), associated metals and peripheral substituents (Yang et al. (1999) *J. Porphyrins Phthalocyanines*, 3:117–147).

For example, in the case of porphyrins, Mg porphyrins are more easily oxidized than Zn porphyrins, and electron withdrawing or electron releasing aryl groups can modulate the oxidation properties in predictable ways.

The electrochemical properties of a library of monomeric Mg or Zn porphyrins bearing diverse aryl groups have been characterized (Yang et al. (1999) *J. Porphyrins Phthalocyanines*, 3: 117–147). The effects of metals on metalloporphyrin oxidation potentials are well known (Fuhrhop and Mauzerall (1969) *J. Am. Chem. Soc.*, 91: 4174–4181). Together, these provide a strong foundation for designing devices with predictable hole-storage properties.

Ferrocene oxidation potentials can be tuned over a range of nearly 1 V through use of substituents attached to the cyclopentadienyl rings (*Encyclopedia of Electrochemistry of the Elements*, Bard, A. J., Lund, H., Eds., Marcel Dekker: New York, 1979, Vol. 13, pp 3–27).

The design of compounds with predicted redox potentials is well known to those of ordinary skill in the art. In general, the oxidation potentials of redox-active units or subunits are well known to those of skill in the art and can be looked up (see, e.g., Encyclopedia of Electrochemistry of the Elements, supra). Moreover, the effects of various substituents on the redox potentials of a molecule are generally additive. Thus, a theoretical oxidation potential can be readily predicted for any potential data storage molecule. The actual oxidation potential, particularly the oxidation potential of the information storage molecule(s) or the information storage medium can be measured according to standard methods. Typically the oxidation potential is predicted by comparison of the experimentally determined oxidation potential of a base molecule and that of a base molecule bearing one substituent in order to determine the shift in potential due to that particular substituent. The sum of such substituent-dependent potential shifts for the respective substituents then gives the predicted oxidation potential.

B. Synthesis of Storage Medium Molecules

The basic synthetic methodologies used to construct porphyrinic macrocycles and other molecules related to this invention are described in Prathapan et al. (1993) *J. Am. Chem. Soc.*, 115: 7519–7520, Wagner et al. (1995) *J. Org. Chem.*, 60: 5266–5273, Nishino et al. (1996) *J. Org. Chem.*, 61: 7534–7544, Wagner et al. (1996) *J. Am. Chem. Soc.*, 118: 11166–11180; Strachan et al. (1997) *J. Am. Chem. Soc.*, 119: 11191–11201, and Li et al. (1997) *J. Mater. Chem.*, 7: 1245–1262. These papers describe various strategies for the synthesis of a number of multiporphyrin (porphyrinic macrocycle) compounds. More particularly, these papers which focus on light capture, energy funneling, and optical gating, have led to the preparation of nanostructures containing up to 21 covalently linked porphyrins (Fenyo et al. (1997) *J. Porphyrins Phthalocyanines*, 1: 93–99, Mongin et al. (1998) *J. Org. Chem.*, 63: 5568–5580, Burrell and Officer (1998) *Synlett* 1297–1307, Mak et al. (1998) *Angew. Chem. Int. Ed.* 37: 3020–3023, Nakano et al. (1998) *Angew. Chem. Int. Ed.* 37: 3023–3027; Mak et al. (1999) *Chem. Commun.*, 1085–1086). Two-dimensional architectures, such as molecular squares (Wagner et al. (1998) *J. Org. Chem.*, 63: 5042–5049), T-shapes (Johnson, T. E. (1995), Ph.D. Thesis, Carnegie Mellon University), and starbursts (Li et al. (1997) *J. Mater. Chem.*, 7: 1245–1262) all comprised of different covalently linked porphyrin constituents, have also been prepared.

In addition, the hole storage and dynamic hole mobility characteristics of the multiporphyrin nanostructures have been investigated in detail during the course of our other studies of these materials (Seth et al. (1994) *J. Am. Chem. Soc.*, 116: 10578–10592, Seth et al. (1996) *J. Am. Chem. Soc.*, 118: 11194–11207, Strachan et al. (1997) *J. Am. Chem. Soc.*, 119: 11191–11201; Li et al. (1997) *J. Mater. Chem.*, 7: 1245–1262, Strachan et al. (1998) *Inorg. Chem.*, 37: 1191–1201, Yang et al. (1999) *J. Am. Chem. Soc.*, 121: 4008–4018).

A number of methods are available for forming phthalocyanines ((Lindsey, J. S. In *The Porphyrin Handbook*; Kadish, K. M.; Smith, K.; Guilard, R., Eds.; Academic Press, San Diego, Calif. 1999, Vol. 1, pp 45–118)). The lithium pentoxide method (involving the reaction of a phthalonitrile in n-pentanol containing lithium pentoxide) is one of the oldest methods for preparing phthalocyanines (Barrett et al. (1938) *Chem. Soc.*, 1157–1163.). This method somewhat fell into disuse upon the advent of the Shiraishi method, which has been used for the preparation of phthalocyanines bearing large substituents (Snow and Jarvis (1984) *J. Am. Chem. Soc.* 106, 4706–4711; Okur et al. (1990) *Synth. React. Inorg. Met.-Org. Chem.*, 20: 1399–1412; Rihter et al. (1992) *Photochem. Photobiol.*, 55: 677–680; Kobayashi et al. (1994) *Chem. Lett.* 2031–2034; van Nostrum et al. (1994) *Angew. Chem. Int. Ed. Eng.*, 33: 2173–2175; Linssen et al. (1995) *J. Chem. Soc., Chem. Commun.*, 103–104; Duro et al., (1995) *Tetrahedron Lett.*, 36: 8079–8082; van Nostrum et al. (1995) *J. Am. Chem. Soc.*, 117: 9957–9965; Yilmaz and Bekaroglu (1996) *Chem. Ber.*, 129: 967–971; Kimura et al. (1997) *Chem. Commun.*, 1215–1216; Brewis et al. (1998) *Chem. Eur. J.*, 4: 1633–1640; Kimura et al. (1998) *Tetrahedron Lett*, 39: 8471–8474; Gonzalez et al. (1999) *Tetrahedron Lett.*, 40: 3263–3266). However, phthalonitriles bearing short alkyl-ethynyl or tetrathiafulvalene-linked substituents were recently converted to the corresponding phthalocyanines using the lithium pentoxide method (Terekhov et al. (1996) *J. Org. Chem*, 61: 3034–3040; Wang et al. (1997) *J. Chem. Soc., Perkin Trans.* 2, 1671–1678). The Shiraishi method and the lithium pentoxide method have both been used to prepared (porphyrin)$_4$ phthalocyanine and (porphyrin)$_8$ phthalocyanine star-shaped arrays (Li et al. (1999) *J. Org. Chem.*, 64: 9090–9100; Li (1999) *J. Org. Chem.*, 64: 9101–9108). For these porphyrin-phthalocyanine arrays, the lithium pentoxide method gave higher yields than the Shiraishi method. Pd-coupling methods and other coupling methods have been used to prepare porphyrin-phthalocyanine dyads (Yang et al., (2000 *J. Mater. Chem.* 10: 283–296; Gaspard et al. (1986) *J. Chem. Soc., Chem. Commun.*, 1239; Tran-Thi et al. (1989) *J. Phys. Chem.*, 93:1226; Tran-Thi et al. (1991) *Chim. Phys.*, 88: 1151; Li et al. (1991) *J. Chem. Soc., Chem. Commun.*, 619; Tian et al. (1993) *J. Photochem. Photobiol. A: Chem.*, 72: 163; Dou et al. (1994) *J. Lumin.*, 465; Tian et al. (1996) *Chin. J. Chem.*, 14: 412; Li et al. (1998) *Chin. J. Chem.*, 16: 97; Tran-Thi (1997) *Coord. Chem. Rev.*, 160: 53).

In addition the synthesis of a number of redox active species (e.g. phorphyrinic macrocycles, metallocenes, etc.) for use in data storage applications is described in U.S. Pat. Nos. 6,272,038, 6,212,093, 6,208,553, and international patent applications WO 01/51188 and WO 01/03126.

One general synthetic strategy involves the following approaches: (1) synthesis of porphyrin and phthalocyanine monomers; (2) conversion of the porphyrin and phthalocyanine monomers with appropriate metals into triple deckers; (3) attachment of a suitable linker to be used for linking the triple decker to a surface (e.g. electrode, semiconductor, other substrate); and (4) the directed self-assembly of the resulting nanostructures on the electroactive surface (e.g., gold electrode).

The following synthetic methods form the foundation for the synthesis of porphyrin building block structures:

(1) A room temperature one-flask synthesis of meso-substituted porphyrins (Lindsey et al. (1987) *J. Org. Chem.* 52: 827–836; Lindsey et al. (1994) *J. Org. Chem.* 59: 579–587; Li et al. (1997) *Tetrahedron*, 53: 12339–12360).

(2) Incorporation of bulky groups around the porphyrin to achieve enhanced solubility in organic solvents (Lindsey and Wagner (1989) *J. Org. Chem.* 54: 828–836).

(3) A one-flask synthesis of dipyrromethanes, key building blocks in the synthesis of porphyrins bearing 2–4 different meso-substituents (Lee and Lindsey (1994) *Tetrahedron* 50: 11427–11440; Littler et al. (1999) *J. Org. Chem.* 64: 1391–1396).

(4) A synthesis of trans-substituted porphyrins without acidolytic scrambling (Littler et al. (1999) *J. Org. Chem.*, 64: 2864–2872).

(5) A rational synthesis of porphyrins bearing up to 4 different meso-substituents (Rao et al. (2000) *J. Org. Chem.*, 65: 7323–7344).

(6) Efficient Pd-mediated coupling reactions (60–80% yields in 1–2 h at 35° C.) for constructing diphenylethyne linkers joining the porphyrins (Wagner et al. (1995) *J. Org. Chem.*, 60: 5266–5273; Wagner et al. (1999) *Chem. Mater.* 11: 2974–2983).

Methodology for selection and manipulation of thiol linkers has been described in Gryko et al. (1999) *J. Org. Chem.* 64: 8635–8647.

The synthesis of the molecules that form the basis for the storage molecules is performed using a modular building block approach. This approach employs a stepwise synthesis (rather than polymerization) and yields highly purified and well-characterized products. One approach utilizes a series of redox-active "building blocks" (e.g., a series of monomeric porphyrinic macrocycles or ferrocene constituents) that can be linked to the gold substrate that will serve as one of the electrodes in the chip. Preferred monomeric redox-active units that are prepared have different oxidation potentials that fall in the range from 0 to 5, more preferably 0 to 2.0 and most preferably 0 to 1.3 volts.

Heteroleptic double deckers comprised of different phthalocyanine ligands can be synthesized in several different ways. One method involves the reaction of two different dilithium phthalocyanines ($Li_2Pc^1$) and ($Li_2Pc^2$) with a metal acetate such as $Lu(OAc)_3$ at reflux in chloronaphthalene for 1 h, affording a statistical mixture of $(Pc^1)Lu(Pc^1)$, $(Pc^1)Lu(Pc^2)$, and $(Pc^1)Lu(Pc^2)$ which then is separated chromatographically (Pondaven et al. (1991) *New J. Chem.*, 15: 515–516).

A stepwise method toward heteroleptic double deckers comprised of different phthalocyanine ligands affords greater control over the product distribution. In this stepwise method, the reaction of a mixture of $Li_2Pc^1$ and M(acac)$_3$.nH2O in 1,2,4-trichlorobenzene at reflux for several hours affords the half-sandwich complex. The latter is then treated with a phthalonitrile and 1,8-diazabicyclo[5.4.0]undec-7-ene (DBU) and n-pentyl alcohol under reflux, giving the heteroleptic double decker $(Pc^1)M(Pc^2)$ quite selectively (Jiang et al. (1998) *Inorg. Chim. Acta*, 268: 141–144, Jiang et al. (1999) *J. Porphyrins Phthalocyanines* 3: 322–328). The same approach beginning with a porphyrin half-sandwich complex affords the heteroleptic (Por)M(Pc) double decker (Jiang et al. (1998) *Polyhedron* 17: 3903–3908).

A distinct approach toward the synthesis of (Por)M(Pc) double deckers achieves some selectivity by employing reaction of (Pc)M(acac) with a porphyrin when the metal cation is quite large (e.g., La—Gd). On the other hand, the reaction of (Por)M(acac) with a phthalocyanine is employed when the metal cation is smaller (e.g., Er, Lu, and Y) (Chabach et al. (1995) *J. Am. Chem. Soc.* 117: 8548–8556).

Heteroleptic triple deckers comprised of porphyrins and phthalocyanines can be synthesized in the following manner. A mixture of free base porphyrin is treated with $M(acac)_3.nH_2O$ in 1,2,4-trichlorobenzene at reflux for several hours. Then the dilithium salt of phthalocyanine ($Li_2Pc$) is added and the mixture is refluxed for an additional period. Subsequent chromatography affords the desired (Por)M(Pc) M(Por) and (Pc)M(Pc)M(Por) triple deckers (Jiang et al. (1998) *Inorg. Chim. Acta*, 268: 49–53). This is a very general method with regards to the nature of the metal and the substituents on the phthalocyanine, despite the distribution of products formed, and has been used to prepare a wide variety of such triple deckers.

Triple decker complexes with different metals also can be prepared in the following manner. Reaction of a (Por)$M^1$ (Pc) with a (Por)$M^2$ (acac) complex in 1,2,4-trichlorobenzene at reflux for eight hours resulted in the (Por)$M^1$(Pc)$^2$(Por) triple decker, with metal combinations of Ce and Gd, Ce and Lu, Ce and Y, and La and Y (Chabach et al. (1996) *Angew. Chem. Int. Ed. Engl.* 35: 898–899.

Another route to triple decker phthalocyanines involves reaction of a metal or an alloy with a phthalonitrile. A notable example is provided by the reaction of $Bi_2Se_3$ with phthalonitrile, affording the triple decker (Pc)Bi(Pc)Bi(Pc) (Janczak et al. (1999) *Polyhedron*, 18: 2775–2780).

In one embodiment, the methods for joining the triple deckers into larger arrays employ Pd-mediated reactions. One example involves the coupling of iodo-substituted and ethynyl-substituted porphyrinic compounds (Wagner et al. (1995) *J. Org. Chem.* 60: 5266–5273; Wagner et al. (1999) *Chem. Mater.* 11: 2974–2983). Alternatively, the Cadiot-Chodkiewicz reaction enables unsymmetrical coupling of ethynyl-substituted compounds, affording the unsymmetrically substituted butadiyne product (Eastmond and Walton (1972) *Tetrahedron Lett.* 28: 4591–4599, Elbaum et al. (1994) *Tetrahedron* 50: 1503–1518, Montierth et al. (1998) *Tetrahedron* 54: 11741–11748, Godt (1997) *J. Org. Chem.* 62: 7471–7474). In yet another example, Suzuki coupling can be employed affording a phenylene or oligophenylene linker (Hensel and Schluter (1999) *Chem. Eur. J.* 5: 421–429).

A number of double deckers or triple deckers with appended functional groups have been prepared. Various appended groups include: quinone attached to a zirconium bis(porphyrin) (Girolami et al. (1996) *Angew. Chem. Int. Ed. Engl.* 35: 1223–1225), crown ethers attached to a lutetium bis(phthalocyanine) (Ishikawa and Kaizu (1998) *Chem. Lett.* 183–184), porphyrin attached to the porphyrin component a (Pc)Eu(Por)Eu(Pc) triple decker (Arnold and Jiang (1999) *Chem. Lett.* 483–484), and the like.

Figure 7:
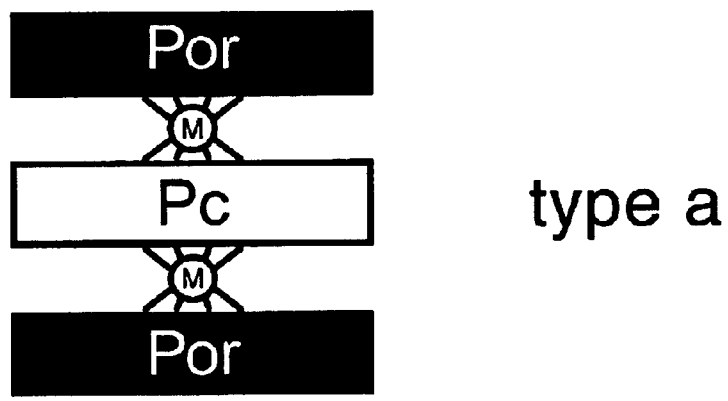
FIG. 7 illustrates schematic structures of the different types of triple deckers.
Figure 7:
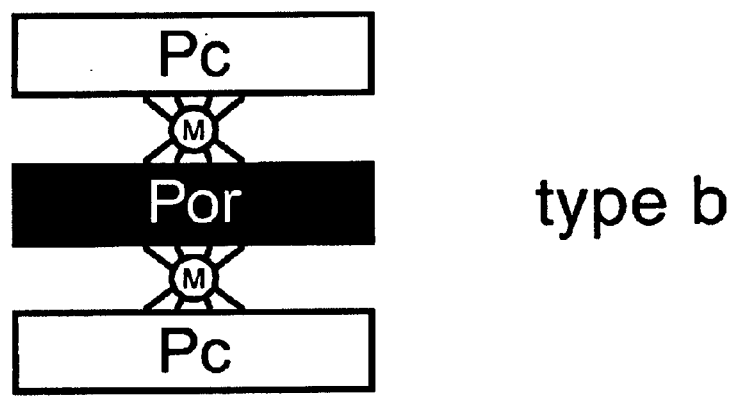
Figure 7:
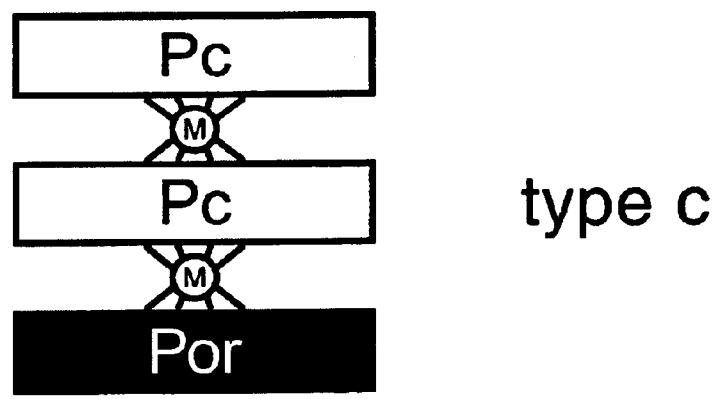

Triple-decker sandwich complexes of porphyrins and phthalocyanines can be prepared either by statistical (Li et al. (2000) *J. Org. Chem.*, 65: 7379; Jiang et al. (1998) *Inorg. Chim. Acta*, 268: 49) or by rational (Chabach et al. (1996) *Angew. Chem. Int. Ed. Engl.*, 35: 898; Gross et al. (2001) *Inorg. Chem.*, 40: 4762) approaches. The statistical approach generally results in a mixture containing the following three types of triple deckers: (Por)Ln(Pc)Ln(Por) (type a), (Pc)Ln(Por)Ln(Pc) (type b), and (Pc)Ln(Pc)Ln(Por) (type c) (FIG. 7) (Gryko et al. (2001) *Mater. Chem.*, 11: 1162; Jiang et al. (1998) *Inorg. Chim. Acta*, 268: 49). In this context, the term Por or Pc refers generically to the dianion of a free base porphyrin or free base phthalocyanine, respectively. Isolation of the desired triple decker from this mixture is typically achieved by chromatography.

Type c triple deckers are accessible via a procedure analogous to that of Weiss (Chabach et al. (1996) *Angew. Chem. Int. Ed. Engl.*, 35: 898), wherein a double decker (Pc)Eu(Pc) (wherein each europium double decker is assumed to be a radical species) is reacted with a half-sandwich complex (Por)Eu(acac) (Gross et al. (2001) *Inorg. Chem.*, 40: 4762.). The latter is formed in situ starting from the free base porphyrin and Eu(acac)$_3$·nH$_2$O in refluxing 1,2,4-trichlorobenzene (bp 214° C.) (Wong et al. (1974) *J. Am. Chem. Soc.*, 96: 7149).

A rational method for the preparation under milder conditions of certain members of type a and type c triple deckers containing Eu or Ce is described by Gross et al. (2001) *Inorg. Chem.*, 40: 4762. Treating CeI$_3$ with LiN(SiMe$_3$)$_2$ and a free base porphyrin in bis(2-methoxyethyl) ether (bp 162° C.) and reacting the resulting (Por$^1$)CeI half-sandwich complex with double decker (Por$^2$)Eu(Pc) under reflux affords the mixed type a triple decker (Por$^2$)Eu(Pc)Ce(Por$^1$), which is comprised of two different porphyrins (Por$^1$ and Por$^2$) and two different metals (Ce and Eu).

These two rational methods can be employed for the synthesis of the type c and type a triple-decker building blocks as described herein in example 1.

Figure 20:
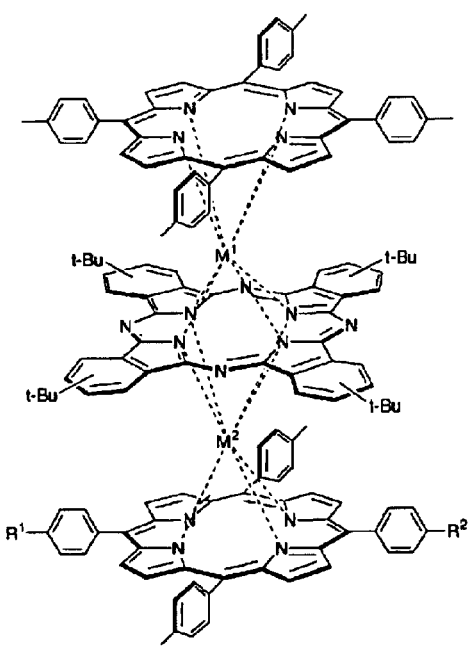
FIG. 20 illustrates chart 1.
Figure 20:
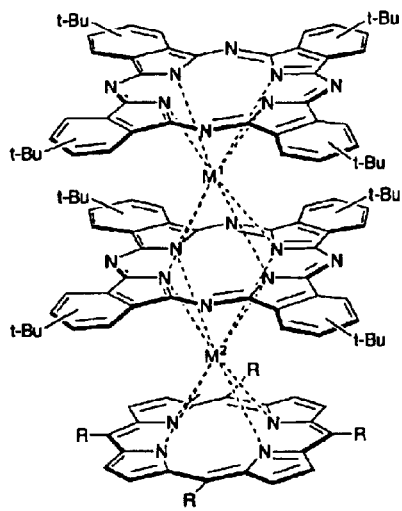

In our previous studies of triple deckers, we identified several classes of complexes as promising candidates for constituents in a multistate counter (Gryko et al. (2001) *Mater. Chem.*, 11: 1162). A collection of suitable triple deckers of type a or type c, respectively, is presented in Chart 1 (FIG. 20). Type a triple deckers (TD1-TD3) are of form (TTP)M$^1$(t-Bu$_4$Pc)M$^2$(Por), and type c triple deckers (TD4-TD6) are of form (t-Bu$_4$Pc)M$^1$(t-Bu$_4$Pc)M$^2$(Por), where M$^1$/M$^2$=Ce or Eu; t-Bu$_4$PcH$_2$=tetra-tert-butylphthalocyanine; TTPH$_2$=meso-tetra-p-tolyl porphyrin; and PorH$_2$ is a porphyrin bearing p-tolyl or n-pentyl groups at the meso-positions (except for TD3 which is substituted with a p-iodophenyl group and a trimethylsilyl (TMS)-ethynyl group as synthetic handles, and two p-tolyl groups.] Note that t-Bu$_4$PcH$_2$ is composed of a mixture of four regioisomers (Sommerauer et al. (1996) *J. Am. Chem. Soc.*, 118: 10085). We have previously investigated the Eu/Eu triple deckers (Gryko et al. (2001) *Mater. Chem.*, 11: 1162). The mixed Eu/Ce and Ce/Ce triple deckers are new to this study. The Ce containing complexes were synthesized because additional cationic states are available due to the possibility of metal-centered oxidation(s) (vide infra) (Duchowski and Bocian (1990) *J. Am. Chem. Soc.*, 112: 8807).

Figure 14:
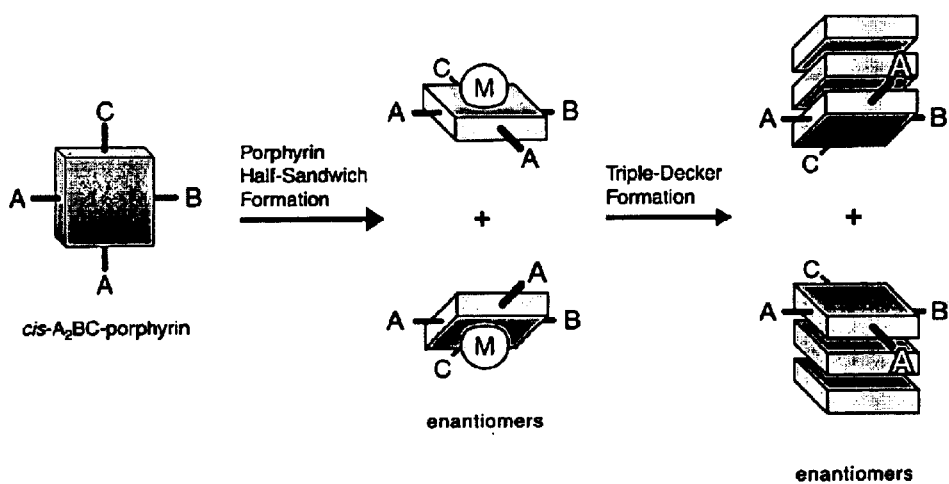
FIG. 14 illustrates a meso-substituted porphyrin with substituents in a cis-$A_2BC$ (or ABCD) pattern is facially enantiotopic. The formation of a half-sandwich complex with a lanthanide metal (M) affords a pair of enantiomers (the ligand on the trivalent metal is omitted for clarity). Subsequent reaction with a lanthanide double decker affords the corresponding triple decker as a pair of enantiomers. This analysis assumes that (a) the Por and/or Pc components that complete the triple decker themselves have mirror planes perpendicular to the plane of the macrocycle, and (b) rotation about the cylindrical axis of the triple decker is unhindered.

The incorporation of certain types of porphyrin building blocks in triple-decker sandwich complexes can result in a mixture of stereoisomers. The meso-substituted metalloporphyrins have the following symmetry point groups: A$_4$-porphyrin (D$_{4h}$); A$_3$B-porphyrin (C$_{2v}$); cis-A$_2$B$_2$-porphyrin (C$_{2v}$); trans-A$_2$B$_2$-porphyrin (D$_{2h}$); trans-A$_2$BC-porphyrin (C$_{2v}$); cis-A$_2$BC-porphyrin (C$_s$); ABCD-porphyrin (C$_s$). The latter two types of substituted porphyrins have no mirror plane perpendicular to the plane of the macrocycle. Porphyrins of the type A$_4$, A$_3$B, cis-A$_2$B$_2$, trans-A$_2$B$_2$, and trans-A$_2$BC have at least one mirror plane perpendicular to the plane of the macrocycle. As a result, the formation of a corresponding triple decker affords a single product with a mirror plane perpendicular to the porphyrin and phthalocyanine rings. The cis-A$_2$BC porphyrins and ABCD porphyrins lack a perpendicular mirror plane and are thus facially enantiotopic. The reaction with a lanthanide metal occurs on one or the other of the two faces of the porphyrin, affording the porphyrin half-sandwich complex as a pair of enantiomers (FIG. 14). The reaction of an appropriate double decker with the enantiomeric half-sandwich complexes gives the corresponding triple decker as a pair of enantiomers. Note that the H1 and H2 dyads, but not the V1 dyads, are derived from triple deckers that incorporate a cis-A$_2$BC porphyrin. The use of this approach for the synthesis of triple-decker dyads is illustrated herein in Example 1.

In certain embodiments, this invention thus provides methods of synthesizing a triple-decker sandwich dyad, (more preferably a triple-decker sandwich heterodimer). The methods involve providing a metal-porphyrin half-sandwich complex comprising a cis-A$_2$BC type porphyrin complexed with a metal or an ABCD type porphyrin complexed with a metal; and reacting the half-sandwich complex with a double-decker sandwich complex to form a triple-decker sandwich. Then palladium coupling can be performed to join triple deckers to give a triple decker dyad.

It is noted that the substituents on the porphyrin building block can include one group that gives rise to the inter-porphyrin linker in the dyad; one group that give rise to the linker for attachment to the electrode; and two non-linking substituents. The two non-linking substituents can be different (in which case the porphyrin is of the ABCD-type, not cis-A$_2$BC type).

In certain preferred embodiments, the porphyrin comprising the half-sandwich complex has the formula:

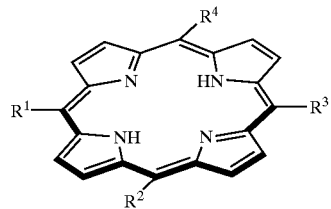

where R$^1$, R$^2$, R$^3$, and R$^4$ are independently selected from the group consisting of p-tolyl, n-pentyl, 4-bromophenyl, 4-iodophenyl, trimethylsilylethynyl, bromo, iodo, 1,3,2-dioxaborolan-2-yl, 4-(1,3,2-dioxaborolan-2-yl)phenyl, 4-(2-trimethylsilylethynyl)phenyl, 4-formylphenyl, 4-aminophenyl, and 4-iodobicyclo[2.2.2]octan-1-yl.

Using the synthesis strategies exemplified here and in the examples, one of ordinary skill in the art can routinely produce relatively complex data storage molecules for use in the devices of this invention.

C. Characterization of the Storage Media

The storage media molecule(s), once prepared, can be characterized according to standard methods well known to those of skill in the art. The characterization of multiporphyrin nanostructures has been described (see, e.g., Strachan et al. (1997) *J. Am. Chem. Soc.*, 119: 11191–11201; Wagner et al. (1996) *J. Am. Chem. Soc.*, 118: 3996–3997; Li et al. (1997) *J. Mater. Chem.*, 7: 1245–1262; Seth et al. (1996) *J. Am. Chem. Soc.*, 118:11194–11207; Seth et al. (1994) *J. Am. Chem. Soc.*, 116: 10578–10592). In a preferred embodiment, the electrochemical studies include cyclic and square-wave voltammetry to establish the redox potentials of the monomeric and multi-unit constituents of the storage media. Bulk electrochemical oxidations are performed on each of the storage materials to assess the hole-storage capabilities and the stability. Absorption and vibrational spectroscopic methods are used to assess the structural and electronic properties of both the neutral and oxidized materials. Electron paramagnetic resonance techniques are used to probe the hole-storage and hole-mobility characteristics of the oxidized storage molecules. Using the above-identified techniques, benchmarks for the expected performance characteristics of a storage molecule (e.g., oxidation potentials, redox reversibility, dynamic hole-mobility characteristics, etc.) can be ascertained.

D. Self-Assembly of the Storage Medium Molecules on Target Substrates

In preferred embodiments, the storage molecules comprising the storage medium are designed to self-assemble on a substrate (e.g. a metal such as gold). The disklike structure of the porphyrin macrocycles engenders self-assembly. Self-assembled monolayers of porphyrins on solid substrates are well known and have been extensively studied (see, e.g., Schick et al. (1989) *J. Am. Chem. Soc.*, 111:1344–1350, Mohwald et al. (1986) *Thin Solid Films*, 141: 261–275).

To exert control over the pattern of self-assembly, reactive sites (e.g. thiols) or linkers bearing active sites are incorporated into the storage molecules (nanostructures). The reactive sites bind to the target (e.g. gold electrode) surface giving an organized self-assembled structure. In the case of porphyrins with thiol-derivatized linkers attached to the meso positions, the porphyrins arrange in vertical orientations. Non-covalent interactions between storage molecules are typically weak, particularly when bulky aryl groups are attached to each of the porphyrins.

VI. Writing to the Storage Device

In preferred embodiments of the data storage devices of this invention, information is written to a particular memory location via application of a potential of the requisite value and temporal duration at the appropriate working and reference electrode(s) to achieve the desired digital value. The information can be erased via application of a potential of the opposite sign.

There is a great advantage to the small size of each memory element, which is essentially a modified electrode surface. When each memory element is reduced to submicron dimensions, the area of the surface allows the presence of only a few hundred data storage (e.g., porphyrin) molecules. Using Faraday's law, Q=nFN (where Q equals the total charge, n equals the number of electrons per molecule, F is 96,485 Coulombs/mole and N is the number of moles of electroactive species present), it can be determined that the passing of only a small charge ($1.6 \times 10^{-16}$ C; if passed in 1 $\mu$s, would result in a current of roughly 160 pA) can change the electrochemical charge corresponding to each bit.

Additionally, the intrinsic limitation to the speed of most electrochemical experiments lies in the time required to charge the electrode to the appropriate potential (the charging current, which has a time dependence of exp(-t/RC)). Since the capacitance of the electrode is directly proportional to its area, miniaturization of each element of the system to submicron dimensions will greatly increase its speed. For example, a square gold electrode with 0.1 $\mu$m dimensions would have a capacitance of approximately $2 \times 10^{-19}$ F, leading to an RC time constant of only 2 picoseconds. For this reason, electrode charging currents should be insignificant in determining the ultimate performance of these devices.

The voltage used to write the data can be derived from any of a wide variety of sources. In a simple embodiment, the voltage can simply be the output from a power supply. However, in preferred embodiments, the voltage will be the output from some element of an electronic circuit. The voltage can be a signal, the representation of a logic state, the output from a gate, from an optical transducer, from a central processing unit, and the like. In short, virtually any voltage source that can be electrically coupled to the devices of this invention can be used to write data to the storage media therein.

VII. Reading from the Storage Device

The storage device(s) of this invention can be read according to any of a wide variety of methods well known to those of ordinary skill in the art. Essentially any method of detecting the oxidation state of a compound can be utilized in the methods of this invention. However, where the readout is destructive of the state of the memory cell(s) (e.g. in certain memories), the read will preferably be followed by a refresh to reset the oxidation state of the storage cell.

In particularly preferred embodiments, the storage medium 102 of a storage cell 100 is set to neutral (e.g. 0 potential for the system, but which might not be at true zero voltage with respect to ground) using the working electrode. The oxidation state of the memory cell is then set by changing the potential at the reference electrode 103 (e.g. by setting the reference electrode negative to the desired voltage). The oxidation state of the storage cell is then measured (e.g. using sinusoidal voltammetry) via the working electrode 101. In this preferred format, the oxidation state is assayed by measuring current. By measuring current at the working electrode 101 and setting the state with the reference electrode 103, the measurement is not made at the place the potential is applied. This makes it far simpler to discriminate the oxidation state. If the potential were applied to the electrode through which the current was measured, unnecessary noise could be introduced into the system.

In certain embodiments, the faradaic current is temporally dissociated from the charging current associated with reading the charge of the redox-active species (e.g. storage molecule(s)). This method, designated "open circuit potential amperometry" (OCPA), quantitatively reads the charge of the redox species bound to (electrically coupled to) an electrode surface, while discriminating against both charging current(s) and amperometric signal(s) that arise, e.g. from diffusion-based species in solution.

Voltammetric data can also be obtained using this methodology. In this method, designated open circuit potential voltammetry (OPCV), a series of OCPA steps is performed in which the potential is successively incremented (similar to pulse voltammetric methods). The efficacies of OCPA and OPCV are demonstrated in U.S. Ser. No. 60/278,555, filed on Mar. 23, 2001, using two types of thiol-derivatized, redox-active molecules attached to Au: (1) an alkyl-ferrocene and (2) a Zn tetraarylporphyrin. The studies showed that OPCA and OPCV permit the accurate measurement of the charge associated exclusively with the electrode-coupled redox species with very high signal quality in a very short time period.

Thus, in one embodiment this invention provides methods of determining the oxidation state of the storage molecule by disconnecting an electrode from an electrochemical cell comprising the storage molecule(s) being measured to allow the cell to reach an open circuit potential (OCP), connecting said electrochemical cell to an externally applied potential equivalent to the open circuit potential; and detecting a resulting current if such current exists where the magnitude of the current is a measure of the oxidation state of the storage molecule(s). In certain embodiments, the storage molecule(s) are oxidized and said open circuit potential is a reducing potential, while in certain other embodiments the storage molecule(s) are reduced and the open circuit potential is an oxidizing potential. The disconnecting is typically for a period ranging from about 0.001 ms to about 60 seconds, preferably from about 0.01 ms to about 20 s, more preferably from about 0.01 ms to about 1 s, and most preferably from about 0.001 ms to about 0.1 s. These "open circuit" methods of reading an oxidation state are described in copending application U.S. Ser. No. 60/278,555, filed on Mar. 23, 2001.

A. Reading from the Storage Media

In the case of the storage media as described herein, the reading of information from a particular memory location is achieved extremely rapidly by sweeping a potential over the full range used to establish the dynamic range of the storage element. The fidelity of the measurement is dependent on how well the oxidation state of the individual storage element can be determined. Traditionally, electrochemical methods could only improve the signal to noise ratio by discriminating the faradaic signal from the background components in the time domain through application of pulse waveforms (i.e., differential pulse polarography, square wave voltammetry). These methods discriminate the faradaic current from the charging current in the time domain, since charging currents decay much more rapidly than the faradaic current ($\exp(-t/RC)$ vs $t^{-1/2}$, respectively). However, the analytical faradaic current is not totally discriminated from the charging current, and most of the signal is discarded because sampling is done late in the pulse cycle.

More recently, sinusoidal voltammetry (SV) has been shown to have significant advantages over traditional waveforms in an electrochemical experiment (Singhal and Kuhr (1997) *Anal. Chem.*, 69: 1662–1668). For example, the background current resulting from cyclic voltammetry (consisting primarily of charging current) resembles a square wave, which contains significant intensity at both fundamental and odd harmonic frequencies. In contrast, the charging current resulting from sine wave excitation has only one frequency component centered at the fundamental, while the faradaic current is distributed over many frequencies. This characteristic of sine wave excitation simplifies the electroanalytical measurement, since the signal from each oxidation state can be fine-tuned by "locking-in" on one of the higher frequency harmonics. Ultimately, the speed at which this can be performed is only limited by the kinetics of the redox reaction, which may ultimately lead to megahertz frequency operation.

Since most electrochemical methods rely on differences between the $E_{1/2}$'s ($E_{1/2}$ is the potential at which half of the subject molecules are oxidized or reduced to a particular oxidation state) to differentiate compounds present in a sample and thereby to generate the selectivity for the measurement, this has severely limited the utility of electrochemical methods for the analysis of many complex matrices. In contrast, sinusoidal voltammetry can exploit the vast diversity in electron transfer rates observable at solid electrodes ($k^0$, the rate of electron transfer can vary over ten orders of magnitude at the same electrode surface) to obtain additional selectivity in the electrochemical measurement.

The composition of the frequency spectrum is extremely dependent on the rate of electron transfer. By adjusting the frequency of the sinusoidal (or other time-varying) excitation waveform, it becomes possible to use this kinetic information as well as the phase information to discriminate between two molecules which have very similar electrochemical properties. For example, this technique has been used for the detection of the direct oxidation of double-stranded DNA at copper electrodes (Singhal and Kuhr (1997) *Anal. Chem.*, 69: 1662–1668). Where this is usually undetectable at conventional electrodes with standard voltammetric techniques, the use of sinusoidal voltammetry allowed the measurement of 1.0 nM double-stranded DNA. The concentration detection limit (S/N=3) for this size of dsDNA at the 6th harmonic is 3.2 pM. When coupled with a low-volume system, such as a monolayer of the adsorbed material, this allows detection of sub-zeptomole ($10^{-21}$ mole) quantities of the storage medium molecule(s) on the surface.

This procedure may ultimately degrade the memory in the absence of a refresh mechanism. The level of degradation will depend on the total number of molecules ultimately used to ensure acceptable fault tolerance. To avoid degradation problems, however, a refresh cycle (a write cycle resetting the memory to the read value) can be inserted immediately after each read cycle is complete.

B. Instrumentation for Reading/Writing Molecular Memories

As indicated above, the molecular memory devices can be read by any of a wide variety of electrochemical technologies including amperometric methods (e.g. chronoamperometry), coulometric methods (e.g. chronocoulometry), voltammetric methods (e.g., linear sweep voltammetry, cyclic voltammetry, pulse voltammetries, sinusoidal voltammetry, etc.), any of a variety of capacitance measurements, and the like. Such readouts can be performed in the time and/or frequency domain.

In one preferred embodiment, readout is accomplished using a fast potentiostat/voltammetry system. Such a system is capable of reading and writing the memory elements on a microsecond time scale. Such a system can be modified from the prototypical system described in U.S. Pat. No. 5,650,061.

Figure 11:
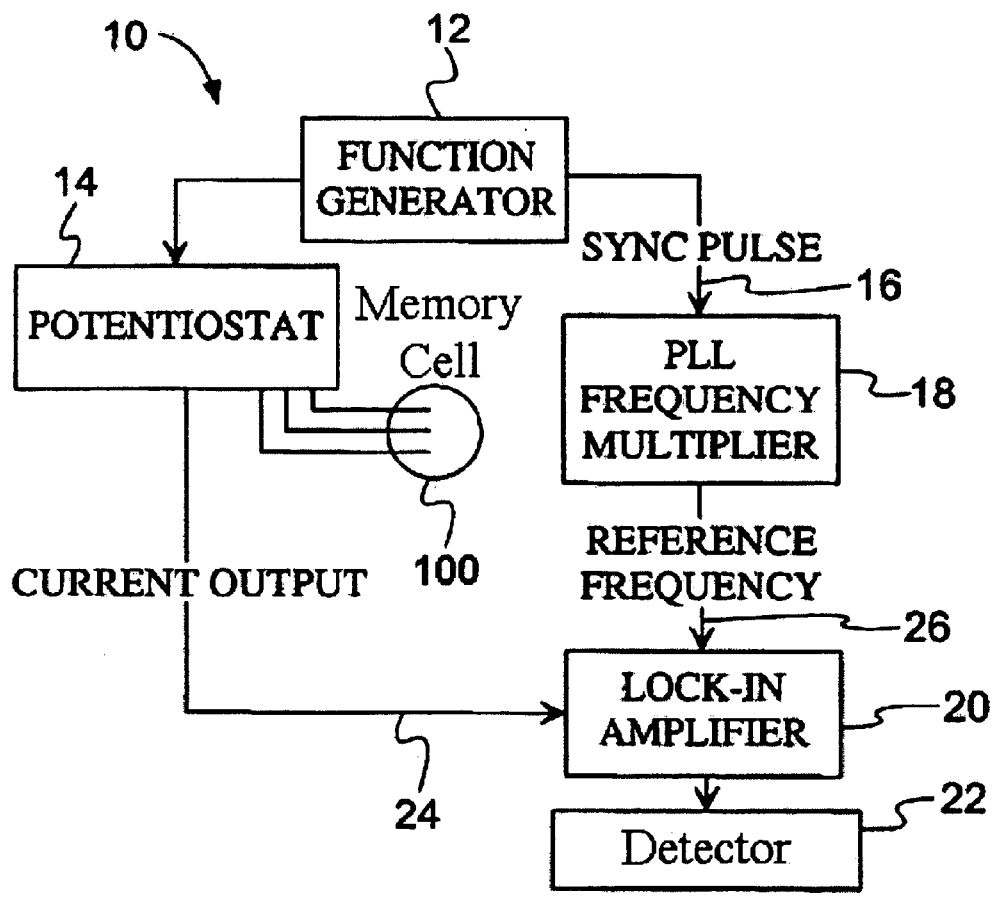
FIG. 11 illustrates a sinusoidal voltammetry system suitable for readout of the memory devices of this invention.

One such system is illustrated in FIG. 11. The system, generally denoted by reference numeral 10 can include a function generator 12 to generate a sine wave, or other, excitation waveform which is coupled to potentiostat 14, which, in turn, is coupled to one or more storage (memory) cell(s) 100. Function generator 12 can also provide a TTL synchronization pulse to input 16 of frequency multiplier 18. Frequency multiplier 18 can include a variable switch to allow access to integral frequency harmonics of up to 10 times the frequency of the fundamental provided by frequency generator 12. The output of phase lock loop frequency multiplier 18 can provide a TTL reference frequency input pulse to lock-in amplifier 20. The output of lock-in amplifier can be read by a suitable detector 22 or further processed by additional circuitry. In certain embodiments, the current output of potentiostat 14 is provided to input 24 of lock-in amplifier 20. Lock-in amplifier 20 can cross-correlates the input signal on line 24 with the reference frequency on line 26, the integrated or filtered output processed as desired.

As illustrated in FIG. 11, a potentiostat 14 with an RC time constant less than one microsecond can be provided by using a fast voltage driver (e.g., video buffer amplifier). A preferred video buffer amplifier retains a usable bandwidth beyond 20 MHz and is used to rephase the voltage and current in the excitation signal to zero phase shift between voltage and current. This rephasing of the excitation signal immediately before the working electrode cancels out any phase shift that might be introduced by capacitance in the cable leading from the Arbitrary Waveform Synthesizer (AWS) function generator 12. An important part of the current monitor is a wide band op-amp. By using an op-amp with a very wide gain-bandwidth product, the amplifier gain can be set to 10,000 and still retain a bandwidth usable from DC to above 1 MHz. This allows the collection of impedance data from electrodes as small as a 1 $\mu$m disk over a frequency range from 15 kHz to 5 MHz.

VIII. Use of the Storage Device in Computer Systems

Figure 12:
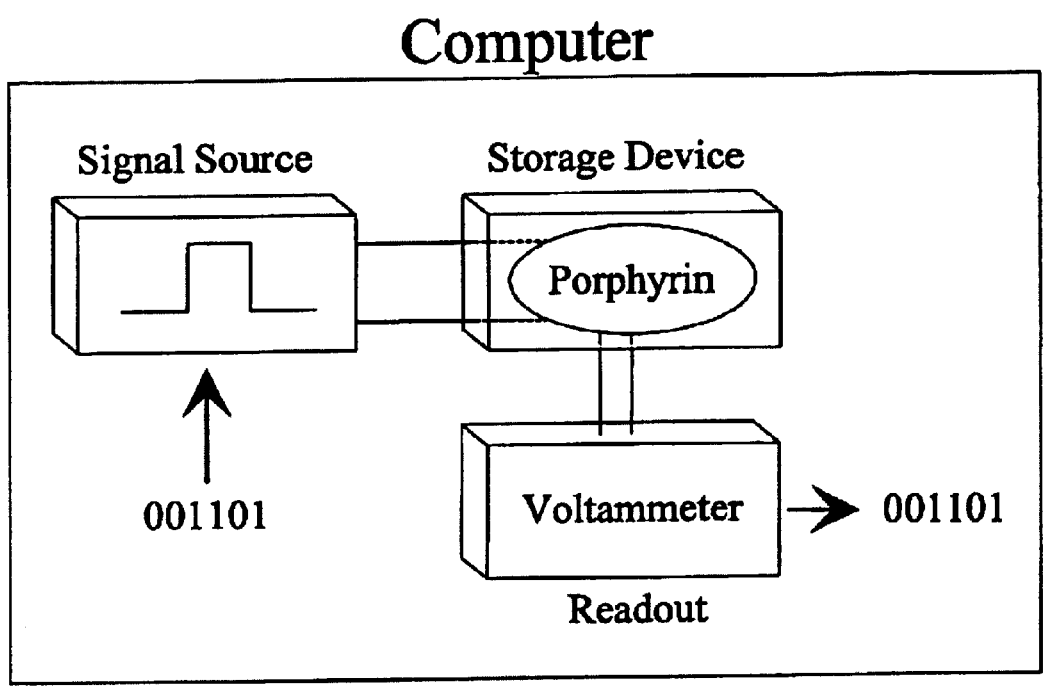
FIG. 12 illustrates a computer system embodying the memory devices described herein. Typically the memory device will be fabricated as a sealed "chip". Ancillary circuitry on the chip and/or in the computer permits writing bits into the memory and retrieving the written information as desired.

The use of the storage devices of this invention in computer systems is contemplated. One such computer system is illustrated in FIG. 12. The computer comprises a signal source (e.g. I/O device or CPU) a storage device of this invention and appropriate circuitry (e.g. voltammetry circuitry) to read the state(s) of the storage device. In operation, voltages representing the bits to be stored are applied to the working electrodes of the storage device thereby setting the memory. When retrieval is necessary (e.g. for output, or further processing) the state(s) of the storage device is read by the I/O circuitry and the information is passed off to other elements (e.g. CPU) in the computer.

Figure 13:
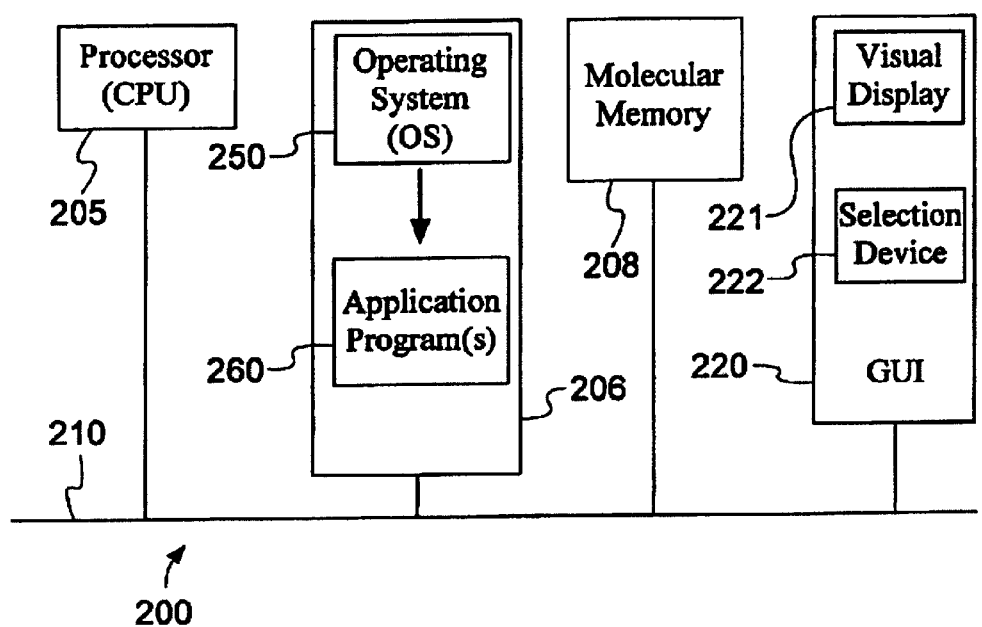
FIG. 13 illustrates the memory devices of this invention integrated into a standard computer architecture or computer system 200.

FIG. 13 illustrates the memory devices of this invention integrated into a standard computer architecture or computer system 200. The hardware of system 200 includes a processor (CPU) 205, a memory 206 (which can comprise molecular memory devices), a persistent storage 208 which does comprise molecular memory devices of this invention, and hardware for a graphical user interface (GUI) 220, coupled by a local bus or interface 210. The persistent memory 208 can include the elements shown in FIG. 12. System 200 can further include additional hardware components (not shown).

System 200 can be, for example, a personal computer or workstation. Processor 205 can be, for example, a microprocessor, such as the 80386, 80486 or Pentium™ microprocessor, made by Intel Corp. (Santa Clara, Calif.). Memory 206 can include, for example, random-access memory (RAM), read-only memory (ROM), virtual memory, molecular memory (FIG. 12) or any other working storage medium or media accessible by processor 205. Persistent storage 208 can include a hard disk, a floppy disk, an optical or magneto-optical disk, a molecular memory or any other persistent storage medium. GUI 220 facilitates communications between a user and system 200. Its hardware includes a visual display 221 and a selector device (mouse, keyboard, etc.) 222. Through visual display 221, system 200 can deliver graphical and textual output to the user. From selector device 222, system 200 can receive inputs indicating the user's selection of particular windows, menus, and menu items. Visual display 221 can include, for example, a cathode-ray tube (CRT) or flat-panel display screen, or a head-mounted display such as a virtual reality display. Selector device 222 can be, for example, a two-dimensional pointing device such as a mouse, a trackball, a track pad, a stylus, a joystick, or the like. Alternatively or additionally, selector device 222 can include a keyboard, such as an alphanumeric keyboard with function and cursor-control keys.

The software of system 200 includes an operating system 250 and an application program 260. The software of system 200 can further include additional application programs (not shown). Operating system 250 can be, for example, the Microsoft(®) Windows(™) 95 operating system for IBM PC and compatible computers having or emulating Intel 80386, 80486, or Pentium(™) processors. Alternatively, the operating system can be specialized for operation utilizing molecular memory elements. Application program 260 is any application compatible with the operating system and system 200 architecture. Persons of skill in the art will appreciate that a wide range of hardware and software configurations can support the system and method of the present invention in various specific embodiments.

EXAMPLES

The following examples are offered to illustrate, but not to limit the claimed invention.

Example 1

Design, Synthesis, and Characterization of Prototypical Multistate Counters in Three Distinct Architectures The storage of multiple bits of information in distinct molecular oxidation states is anticipated to afford extraordinarily high memory densities. Among redox-active molecules, lanthanide porphyrinic triple-decker complexes are attractive candidates for such molecular information storage elements because they provide at least four cationic states over a modest potential range. Our approach toward a molecular multistate counter involves covalently linking two triple deckers with interleaving oxidation potentials to achieve a commensurate increase in the number of oxidation states within a single dyad. We report the design and synthesis of five dyads comprised of triple-decker complexes of the form (Pc)Ln(Pc)Ln(Por) or (Por$^1$)Ln(Pc)Ln(Por$^2$), where Pc=phthalocyaninato, Por=porphyrinato, and Ln=Ce or Eu. The dyads were prepared in a modular building-block fashion by Pd-mediated coupling of an iodophenyl-triple decker and an ethynylphenyl-triple decker. The different dyad architectures examined include a vertical architecture with one linker (V1), a horizontal architecture with one linker (H1), and a horizontal architecture with two linkers (H2). In each dyad, one or two S-acetylthiomethyl groups incorporated on the porphyrinic moiety of the triple decker enables attachment to an electroactive surface via in situ cleavage of the protected thiol linker(s). Three dyads (Dyad1–3) have the V1 architecture but different compositions of triple deckers; three dyads (Dyad3–5) have identical composition but different architectures (V1, H1, H2) for comparison of the properties in self-assembled monolayers (SAMs) on gold. The SAM of each dyad exhibits robust reversible electrochemical behavior; the redox waves are essentially the sum of the waves of the component triple deckers. In contrast, mixtures of the component triple decker monomers form poor quality SAMs with inferior electrochemical characteristics. Accordingly, all three dyad architectures are viable constructs for assembling a multistate counter.

Introduction

Our groups have been investigating how multiple bits of information can be stored at the molecular level (Roth et al. (2000) *J. Vac. Sci. Technol. B*, 18: 2359; Gryko et al. (2000) *J. Org. Chem.*, 65: 7345; Clausen et al. (2000) *J. Org. Chem.*, 65: 7363; Clausen et al. (2000) *J. Org. Chem.*, 65: 7371; Gryko et al. (2000) *J. Org. Chem.*, 65: 7356; Li et al. (2000) *Org. Chem.*, 65: 7379; Gryko et al. (2001) *Mater. Chem.*, 11: 1162). Our approach toward molecular-based information storage utilizes the distinct redox states of molecules. Information can be stored either in cationic or anionic states; however, we have chosen to work with molecules that afford a rich set of cationic (rather than anionic) states, owing to their greater stability under real-world (e.g., oxidizing) conditions. One of the principal goals of our research program is to design molecular systems that have a large number of resolvable oxidation states whose potentials are less than 2 V. In addition to storing multiple bits of information, our approach has attributes that include (1) electrical writing/reading, (2) no moving parts, (3) low power consumption, (4) scalability to molecular dimensions, (5) operation under ambient conditions, and (6) retention of stored charge for many minutes after removal of applied potential.

In our prior investigations of multibit information storage, we have employed thiol-functionalized porphyrins (Gryko et al. (2000) *J. Org. Chem.*, 65: 7345; Clausen et al. (2000) *J. Org. Chem.*, 65: 7363; Clausen et al. (2000) *J. Org. Chem.*, 65: 7371), ferrocenes (Gryko et al. (2000) *J. Org. Chem.*, 65: 7356), and porphyrinic lanthanide triple-decker sandwich complexes (Li et al. (2000) *Org. Chem.*, 65: 7379; Gryko et al. (2001) *Mater. Chem.*, 11: 1162) as the redox units prepared as self-assembled monolayers (SAMs) on electroactive surfaces (e.g., gold). Among these different classes of molecules, the triple-decker sandwich complexes (Buchler and Ng (2000) In *The Porphyrin Handbook, Vol.* 3, Pages 245–294, Eds. K. M. Kadish, K. M. Smith, R. Guilard, Academic Press, San Diego, Calif.) have proved particularly attractive for multibit information storage because they typically exhibit at least four oxidation states in the range 0–1.4 V (v. Ag/Ag$^+$), corresponding to the formation of the mono-, di-, tri-, and tetracations (Gryko et al. (2001) *Mater. Chem.*, 11: 1162; Jiang et al. (1998) *Inorg. Chim. Acta*, 268: 49). The fact that the triple deckers possess four readily accessible cationic oxidation states provides for counting from one to four (where the neutral state is zero), which enables the storage of two bits of information. A complementary approach employs polynuclear cobalt complexes of polypyridine ligands that afford up to 10 resolvable anionic states in solution over the range of –0.5—–2.9 V (Ruben et al. (2000) *Angew. Chem. Int. Ed.*, 39: 4139). Another approach employs an FeS cluster in the core of a dendrimer (Gorman (1997) *Adv. Mater.*, 9: 1117).

One of our objectives was to extend the number of distinct oxidation states from four to eight, thus enabling the storage of three bits of information. In principle this can be achieved by utilizing two different triple deckers with well resolved, interleaved redox potentials. Toward this goal, we prepared a library of triple-decker phthalocyaninato and porphyrinato sandwich complexes of lanthanides (Eu, Ce) to elucidate how different macrocycle substituents influence the redox potentials of the complexes (Li et al. (2000) *Org. Chem.*, 65: 7379; Gryko et al. (2001) *Mater. Chem.*, 11: 1162). Electron-donating groups attached to the porphyrin and/or phthalocyanine building blocks were employed to shift the redox potentials to less positive values. Solution electrochemical studies revealed a variety of suitable combinations of triple deckers that provide effective interleaving of oxidation potentials. Several of these triple deckers were then selected for thiol-derivatization and attachment to Au. In general, the triple-decker SAMs were found to exhibit robust, reversible electrochemical behavior (Li et al. (2000) *Org. Chem.*, 65: 7379). These SAMs also exhibited remarkably high charge-retention times (tens to hundreds of seconds) (Gryko et al. (2001) *Mater. Chem.*, 11: 1162). We then selected various combinations of the thiol-derivatized triple deckers with interleaving oxidation potentials and formed mixed SAMs of these complexes (Id.). The success of this approach depends on two criteria: (1) the molecules partition equally onto the surface and (2) the redox waves remain well-resolved and interleaved. Our initial studies indicated that criterion 1 was met, but criterion 2 was not. In particular, the mixed triple-decker SAMs exhibited very poorly resolved redox waves. This behavior is most likely due to the formation of very heterogeneous monolayers owing to the different molecular shapes (because of the different macrocycle substituents) of the two types of triple deckers.

In this example, we describe an alternative approach aimed at achieving criterion 2 above. In this approach two different triple-deckers are joined in a covalent architecture bearing one or two thiol linkers. The studies reported herein explore triple-decker dyads in three different architectures. In one architecture, the triple deckers are arranged vertically wherein the planes of the macrocycles are anticipated to be (approximately) perpendicular to the plane of the surface. This dyad contains a single thiol linker and is designated V1. In the second and third architectures, the triple deckers are arranged horizontally, again with the planes of the macrocycles anticipated to be (approximately) perpendicular to the plane of the surface. One of these dyads contains a single thiol linker, and is designated H1, whereas the other contains a linker on each of the triple-decker building blocks and is designated H2. The electrochemical properties of the several different dyads were studied in both solution and in SAMs on a Au surface. The studies reveal that the covalently linked dyad SAMs exhibit well-resolved redox features (unlike the mixed triple-decker SAMs) and are excellent candidates for preparing multistate counters. It is noted that in the electrical engineering literature, a "multistate counter" of the type described herein would more appropriately be referred to as an integrator owing to the different potential that accompanies each distinct state. By contrast, in a true counter, successive digits are accessed by application of the same potential. We have elected to use the term "multistate counter" herein owing to the simple correspondence of distinct oxidation states and counting level.

Results and Discussion
1. Overview
Choice of Triple-decker Constituents for the Dyads
Lanthanide triple-decker sandwich complexes of porphyrins and phthalocyanines can be prepared either by statistical (Li et al. (2000) *Org. Chem.*, 65: 73791 Jiang et al. (1998) *Inorg. Chim. Acta*, 268: 49) or by rational (Chabach et al. (1996) *Angew. Chem. Int. Ed. Engl.*, 35: 898; Gross et al. (2001) *Inorg. Chem.*, 40: 4762) approaches. The statistical approach generally results in a mixture containing the following three types of triple deckers: (Por)Ln(Pc)Ln(Por) (type a), (Pc)Ln(Por)Ln(Pc) (type b), and (Pc)Ln(Pc)Ln (Por) (type c) (FIG. 7) (Gryko et al. (2001) *Mater. Chem.*, 11: 1162; Jiang et al. (1998) *Inorg. Chim. Acta*, 268: 49). In this context, the term Por or Pc refers generically to the dianion of a free base porphyrin or free base phthalocyanine, respectively. Isolation of the desired triple decker from this mixture is typically achieved by chromatography. Rational methods do not yet exist for the synthesis of a wide variety of heteronuclear heteroleptic members of the type a, b, and c complexes. However, two rational methods are available for a limited number of different central metals and porphyrin and phthalocyanine ligands. Type c triple deckers are accessible via a procedure analogous to that of Weiss (Chabach et al. (1996) *Angew. Chem. Int. Ed. Engl.*, 35: 898), wherein a double decker (Pc)Eu(Pc) (wherein each europium double decker is assumed to be a radical species) is reacted with a half-sandwich complex (Por)Eu(acac) (Gross et al. (2001) *Inorg. Chem.*, 40: 4762). The latter is formed in situ starting from the free base porphyrin and Eu(acac)$_3$.nH$_2$O in refluxing 1,2,4-trichlorobenzene (bp 214° C.) (Wong et al. (1974) *J. Am. Chem. Soc.*, 96: 7149). We recently reported a rational method for the preparation under milder conditions of certain members of type a and type c triple deckers containing Eu or Ce (Gross et al. (2001) *Inorg. Chem.*, 40: 4762). Treating CeI$_3$ with LiN(SiMe$_3$)$_2$ and a free base porphyrin in bis(2-methoxyethyl) ether (bp 162° C.) and reacting the resulting (Por$^1$)CeI half-sandwich complex with double decker (Por$^2$)Eu(Pc) under reflux affords the mixed type a triple decker (Por$^2$)Eu(Pc)Ce(Por$^1$), which is comprised of two different porphyrins (Por$^1$ and Por$^2$) and two different metals (Ce and Eu). In the present work, these two rational methods are employed for the synthesis of the type c and type a triple-decker building blocks.

In our previous studies of triple deckers, we identified several classes of complexes as promising candidates for constituents in a multistate counter (Gryko et al. (2001) *Mater. Chem.*, 11: 1162). A collection of suitable triple deckers of type a or type c, respectively, is presented in Chart 1 (FIG. 20). Type a triple deckers (TD1–TD3) are of form (TTP)M$^1$(t-Bu$_4$Pc)M$^2$(Por), and type c triple deckers (TD4–TD6) are of form (t-Bu$_4$Pc)M$^1$(t-Bu$_4$Pc)M$^2$(Por), where M$^1$/M$^2$=Ce or Eu; t-Bu$_4$PcH$_2$=tetra-tert-butylphthalocyanine; TTPH$_2$=meso-tetra-p-tolylporphyrin; and PorH$_2$ is a porphyrin bearing p-tolyl or n-pentyl groups at the meso-positions (except for TD3 which is substituted with a p-iodophenyl group and a trimethylsilyl (TMS)-ethynyl group as synthetic handles, and two p-tolyl groups). Note that t-Bu$_4$PcH$_2$ is composed of a mixture of four regioisomers (Sommerauer et al. (1996) *J. Am. Chem. Soc.*, 118: 10085). We have previously investigated the Eu/Eu triple deckers (Gryko et al. (2001) *Mater. Chem.*, 11: 1162). The mixed Eu/Ce and Ce/Ce triple deckers are new to this study. The Ce containing complexes were synthesized because additional cationic states are available due to the possibility of metal-centered oxidation(s) (vide infra) (Duchowski and Bocian (1990) *J. Am. Chem. Soc.*, 112: 8807).

The potentials for oxidation of TD1–TD6 in solution are summarized in Table 1. The data for TD1, TD4, and TD6 were taken from Gryko et al. (2001) *Mater. Chem.*, 11: 1162; the data for TD2, TD3, and TD5 were obtained in the present study. Examination of the electrochemical data shows that replacement of one or two Eu by Ce does not lead to a large change in the potentials in most of the cases (cf. TD1 and TD2; TD4 and TD5). The largest shift of 0.1 V for $E_{+3/+4}$ is observed for Ce/Ce triple decker TD2 vs. Eu/Eu triple decker TD1. However, Ce-containing triple deckers generally exhibit more oxidation waves. Comparison of TD1 and TD3 shows that replacement of one Eu by Ce and introduction of synthetic handles (iodophenyl and TMS-ethynylphenyl) to one of the porphyrin rings results in minor shifts of the redox potentials. Considering these observations, we selected three pairs of triple deckers to be combined in dyads (TD3/TD4, TD3/TD6, and TD4/TD6). These combinations were not necessarily chosen to achieve the optimum interleaving of potentials (i.e., to obtain the maximum number of resolved oxidation waves). Instead, certain combinations were chosen to explore how dyad composition might affect SAM quality. For example, the TD4/TD6 dyad is comprised of two type c triple deckers, whereas the TD3/TD4 and TD3/TD6 dyads are each comprised of one type a and one type c triple decker.

TABLE 1

Potentials for the oxidation of the benchmark triple deckers in solution[a,b]

| Triple decker | Potential | | | | | |
|---|---|---|---|---|---|---|
| | $E_{0/+1}$ | $E_{+1/+2}$ | $E_{+2/+3}$ | $E_{+3/+4}$ | $E_{+4/+5}$ | $E_{+5/+6}$ |
| Type a | | | | | | |
| TD1 | 0.26 | 0.62 | 0.98 | 1.27 | | |
| TD2 | 0.26 | 0.67 | 0.93 | 1.17 | 1.42 | 1.70 |
| TD3 | 0.24 | 0.64 | 1.00 | 1.24 | 1.48 | 1.68 |
| Type c | | | | | | |
| TD4 | 0.13 | 0.56 | 1.01 | | | |
| TD5 | 0.06 | 0.57 | 1.01 | 1.25 | 1.60 | |
| TD6 | 0.09 | 0.45 | 0.89 | 1.26 | | |

[a]Data for TD1, TD4, TD6, from Gryko et al. (2001) J. Mater. Chem., 11: 1162; data for TD2, TD3, TD5, this work.
[b]Obtained in BuCN (TD1, TD4, TD6) or CH$_2$Cl$_2$ (TD2, TD3, TD5) containing 0.1 M Bu$_4$NPF$_6$. E-values vs. Ag/Ag$^+$; FeCp$_2$/FeCp$_2^+$ = 0.19 V; scan rate = 0.1 Vs$^{-1}$. Values are ±0.03 V.

Dyad Design Strategy

The design of a viable multistate counter comprised of two different triple deckers attached to an electroactive surface requires the elucidation of the effects of SAM formation on the redox characteristics of the dyad. In this regard, prior studies of porphyrin arrays revealed that the oxidation potentials of the SAMs are typically shifted 0.05–0.15 V more positive compared with those in solution (Gryko et al. (2000) *J. Org. Chem.*, 65: 7345; Clausen et al. (2000) *J. Org. Chem.*, 65: 7363; Clausen et al. (2000) *J. Org. Chem.*, 65: 7371). The exact magnitude of the shift appears to depend on the packing in the SAM. In addition, in large arrays, the potential shift for a porphyrin closer to the surface appears to be slightly larger than that for a porphyrin further from the surface. The extent of these effects in the triple-decker dyads was unknown at the outset of this study and was found to be dependent on the exact composition of the dyad (vide infra).

Figure 8:
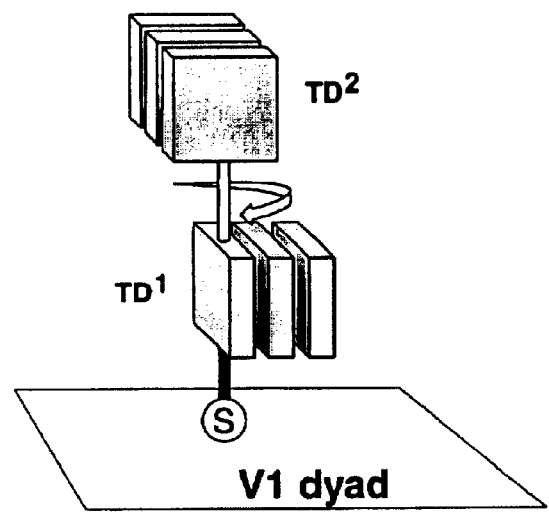
FIG. 8 shows schematic structures of the vertical dyad with one linker (V1), horizontal dyad with one linker (H1), and horizontal dyad with two linkers (H2) in self-assembled monolayers (SAMs) attached via the thiol linker.
Figure 8:
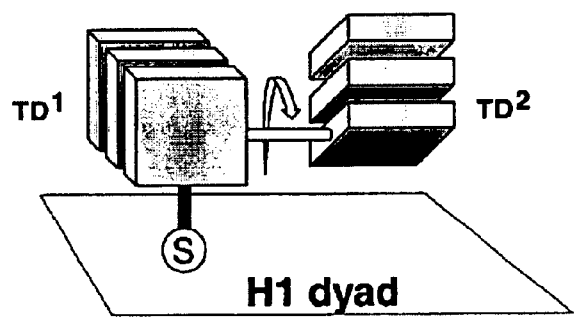
Figure 8:
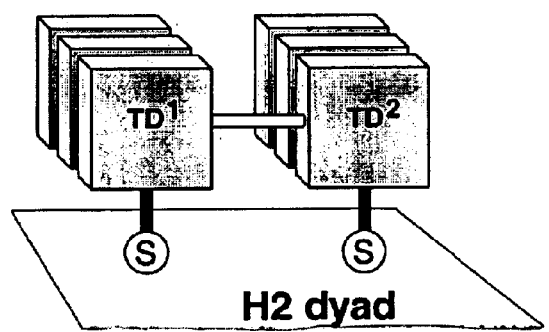

The first design consideration for a multistate counter composed of two triple deckers is whether the dyad should be constituted in a vertical architecture with one linker (V1) or a horizontal architecture with one (H1) or two (H2) linkers, as shown in FIG. 8. The vertical architecture affords the maximum number of molecules per unit area (presuming the two triple deckers are in registry) and could thereby increase functional features such as information-storage density. However, the diphenylethyne group that joins the two triple deckers permits for torsional rotation about the —C≡C— bond. Torsional rotation would significantly increase the molecular area. In addition, the two different triple deckers in the V1 architecture are at intrinsically different distances from the electroactive surface. This could be either be advantageous or deleterious for features ranging from redox potential to charge-retention characteristics. The horizontal architecture would occupy an intrinsically larger molecular area on the surface. However, in this design, the two triple deckers should be at similar distances from the surface. Nonetheless, this feature of the H1 dyad could be compromised by torsional rotation of the non-attached triple decker around the —C≡C— bond of the diphenylethyne linker. In contrast, in the case of H2 dyads, both triple deckers are attached to the surface and rotation is suppressed. All three types of architectures were examined herein to determine which design is best for achieving superior SAM formation and redox characteristics.

The next design consideration was the placement of the synthetic handles for joining the triple deckers and for attachment of thiol linkers. These handles can be more easily introduced via a suitably functionalized porphyrin rather than a phthalocyanine because the synthetic chemistry of the former class of molecules is better developed (Lindsey, In *The Porphyrin Handbook*, Eds. K. M. Kadish, K. M. Smith, R. Guilard, Academic Press, San Diego, Calif. 2000, Vol. 1, pp. 45–118). To avoid possible complications due to rotational isomers, we sought only one derivatized porphyrin in each triple decker. In the V1 dyads, the thiol linker is in the trans position with respect to the ethyne linker between the two triple deckers, which requires a trans-substituted porphyrin (trans-A$_2$BC) bearing the thiol linker. In the H1 and H2 dyads, the thiol linker and the ethyne group are in a cis position with respect to each other, which requires a cis-substituted porphyrin (cis-A$_2$BC) bearing the thiol linker. Iodophenyl and ethynylphenyl groups attached to the porphyrin constitute suitable handles for Sonogashira coupling of thiol-derivatized linker groups at the triple-decker stage or coupling of the two triple deckers to give the corresponding dyad.

The incorporation of certain types of porphyrin building blocks in triple-decker sandwich complexes can result in a mixture of stereoisomers (The meso-substituted metalloporphyrins have the following symmetry point groups: $A_4$-porphyrin ($D_{4h}$); $A_3B$-porphyrin ($C_{2v}$); cis-$A_2B_2$ porphyrin ($C_{2v}$); trans-$A_2B_2$ porphyrin ($D_{2h}$); trans-$A_2BC$ porphyrin ($C_{2v}$); cis-$A_2BC$ porphyrin ($C_s$); ABCD porphyrin ($C_s$). Only the latter two types of substituted porphyrins have no mirror plane perpendicular to the plane of the macrocycle.) Porphyrins of the type $A_4$, $A_3B$, cis-$A_2B_2$, trans-$A_2B_2$, and trans-$A_2BC$ have at least one mirror plane perpendicular to the plane of the macrocycle. As a result, the formation of a corresponding triple decker affords a single product with a mirror plane perpendicular to the porphyrin and phthalocyanine rings. (This analysis assumes that (a) the Por and/or Pc components that complete the triple decker themselves have mirror planes perpendicular to the plane of the macrocycle, and (b) rotation about the cylindrical axis of the triple decker is unhindered.) However, cis-$A_2BC$ porphyrins and ABCD porphyrins lack a perpendicular mirror plane and are thus facially enantiotopic. The reaction with a lanthanide metal occurs on one or the other of the two faces of the porphyrin, affording the porphyrin half-sandwich complex as a pair of enantiomers (FIG. 14). The reaction of an appropriate double decker with the enantiomeric half-sandwich complexes gives the corresponding triple decker as a pair of enantiomers. Note that the H1 and H2 dyads, but not the V1 dyads, are derived from triple deckers that incorporate a cis-$A_2BC$ porphyrin.

Figure 15:
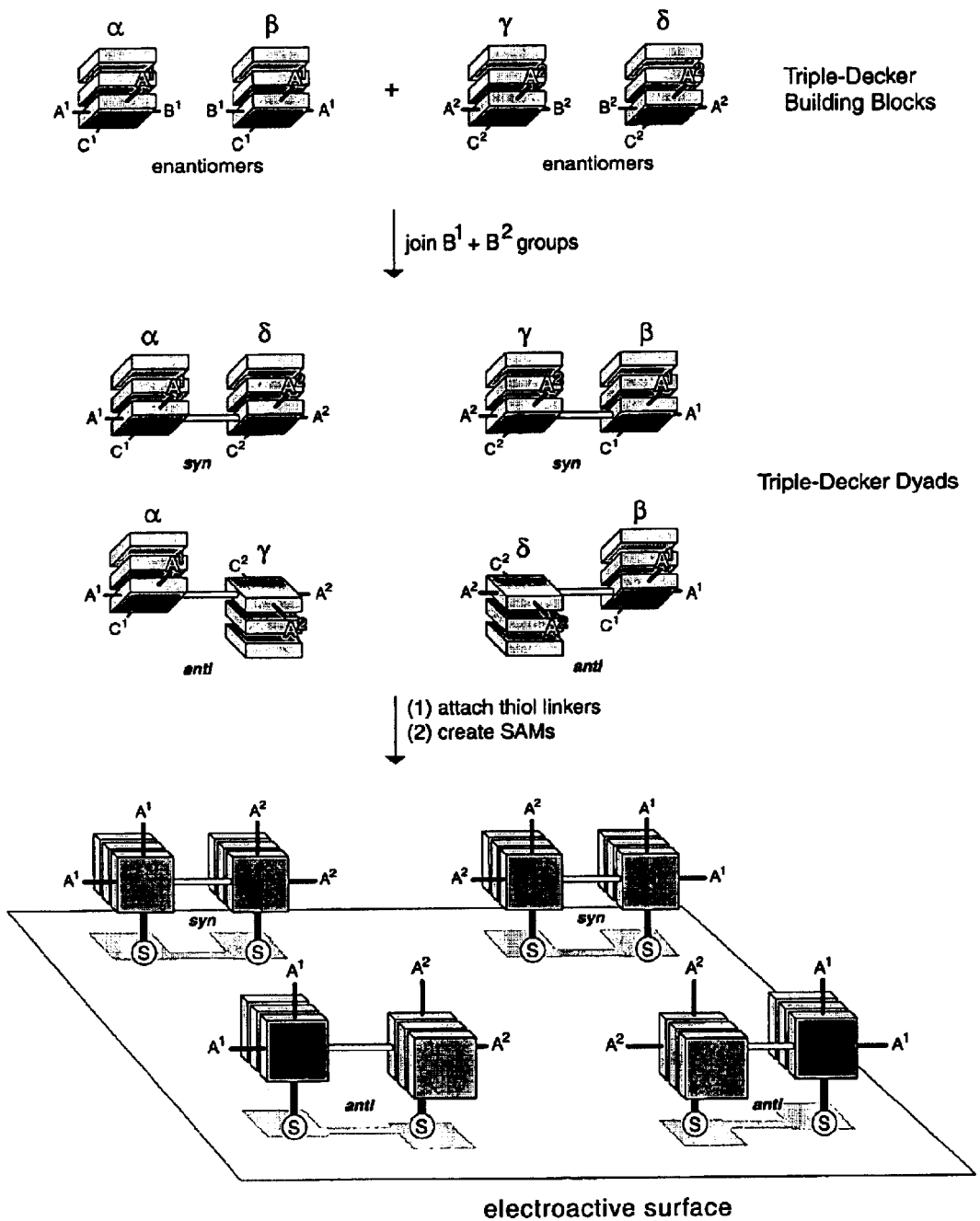
FIG. 15 illustrates syn/anti stereoisomers of an H2 dyad in a SAM. The coupling of two triple-decker building blocks, each of which comprises a pair of enantiomers, at sites $B^1+B^2$ (e.g., iodo+ethyne) affords four triple-decker dyads. The four dyads include a pair of syn enantiomers and a pair of anti enantiomers. Such syn and anti isomers are expected to pack and orient differently upon attachment to a surface.

The number of isomers grows for dyads comprised of two different triple deckers when one or both incorporates a cis-$A_2BC$ porphyrin. For an H1 dyad wherein the triple decker bearing the thiol linker is built around a cis-$A_2BC$ porphyrin, the triple decker dyad exists as a pair of enantiomers. For an H2 dyad, both triple deckers incorporate one cis-$A_2BC$ porphyrin (FIG. 15). In the latter case, the reaction of the enantiomeric mixture of one triple decker (derived from a cis-$A^1{}_2B^1C^1$ porphyrin) and the enantiomeric mixture of a second triple decker (derived from a cis-$A^2{}_2B^2C^2$ porphyrin) at the B sites yields the covalently linked triple-decker dyad as four isomers. There are two pairs of syn/anti stereoisomers, each of which consists of a pair of enantiomers. The terms syn and anti refer to the positions of the $C^1/C^2$ substituents with respect to each other. The thiol linker is coupled to the $C^1/C^2$ sites for attachment of the resulting dyads to an electroactive surface.

The syn and anti isomers have different spatial demands on the surface (FIG. 15), which could potentially compromise the quality of the SAM. This analysis describes the minimum number of structural isomers that can result for each triple decker and for each type of dyad. In practice, each triple decker described herein incorporates one or two tetra-tert-butylphthalocyanine units; accordingly, each triple decker exists as a mixture of diastereomers. The presence of the diastereomers stems from the fact that the tetra-tert-butylphthalocyanine employed in these reactions is comprised of four regioisomers. Thus, those triple deckers that incorporate a cis-$A_2BC$ porphyrin afford a mixture of diastereomers rather than a mere pair of enantiomers due to the presence of one or two tetra-tert-butylphthalocyanine units in the triple decker. It follows that each dyad that incorporates one or more tetra-tert-butylphthalocyanine ligands also exists as a mixture of diastereomers. However, the presence of syn versus anti isomers is expected to pose more distinct spatial requirements upon surface binding of a horizontal dyad than the existence of diastereomers due to the presence of multiple tetra-tert-butylphthalocyanine units.

Figure 16:
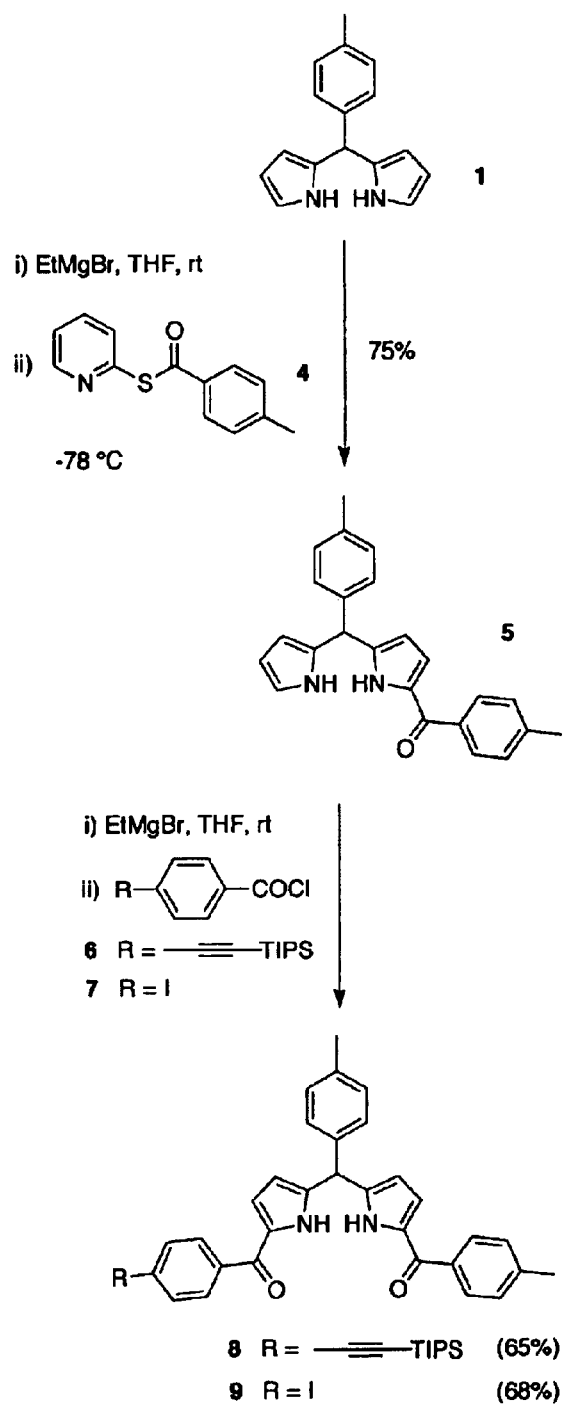
FIG. 16 illustrates synthesis scheme 1.

2. Synthesis of Triple-Decker Building Blocks and Dyads Porphyrin Building Blocks The rational synthesis of porphyrins bearing a distinct pattern of meso-substituents begins with dipyrromethanes (Rao et al. (2000) *J. Org. Chem.*, 65: 7323). Dipyrromethanes bearing aryl substituents at the 5-position are readily available via a one-flask synthesis (Littler et al. (1999) *J. Org. Chem.*, 64: 1391). The 5-aryl dipyrromethanes (1–3) employed in this work differ only in the nature of the p-aryl substituent (1=methyl (Littler et al. (1999) *J. Org. Chem.*, 64: 1391); 2=trimethylsilylethynyl (Cho et al. (1999) *J. Org. Chem.*, 64: 7890); 3=iodo (Littler et al. (1999) *J. Org. Chem.*, 64: 1391)). Following a general procedure (Rao et al. (2000) *J. Org. Chem.*, 65: 1084), reaction of dipyrromethane 1 with pyridyl thioester 4 (Id.) at −78° C. gave the monoacylated dipyrromethane 5 (Scheme 1, FIG. 16). Treatment of 5 with EtMgBr followed by acid chloride 6 in tetrahydrofuran (THF) at room temperature afforded 8 in 65% yield. Similar treatment of 5 with 4-iodobenzoyl chloride (7) gave 9 in 68% yield. To minimize the amount of free EtMgBr present at any time, EtMgBr (2, 2, 1 equiv) and acid chloride (1, 1, 0.5 equiv) were added sequentially and repeatedly at 5–10 min intervals rather than the entire amount all-at-once (Rao et al. (2000) *J. Org. Chem.*, 65: 1084).

Figure 17:
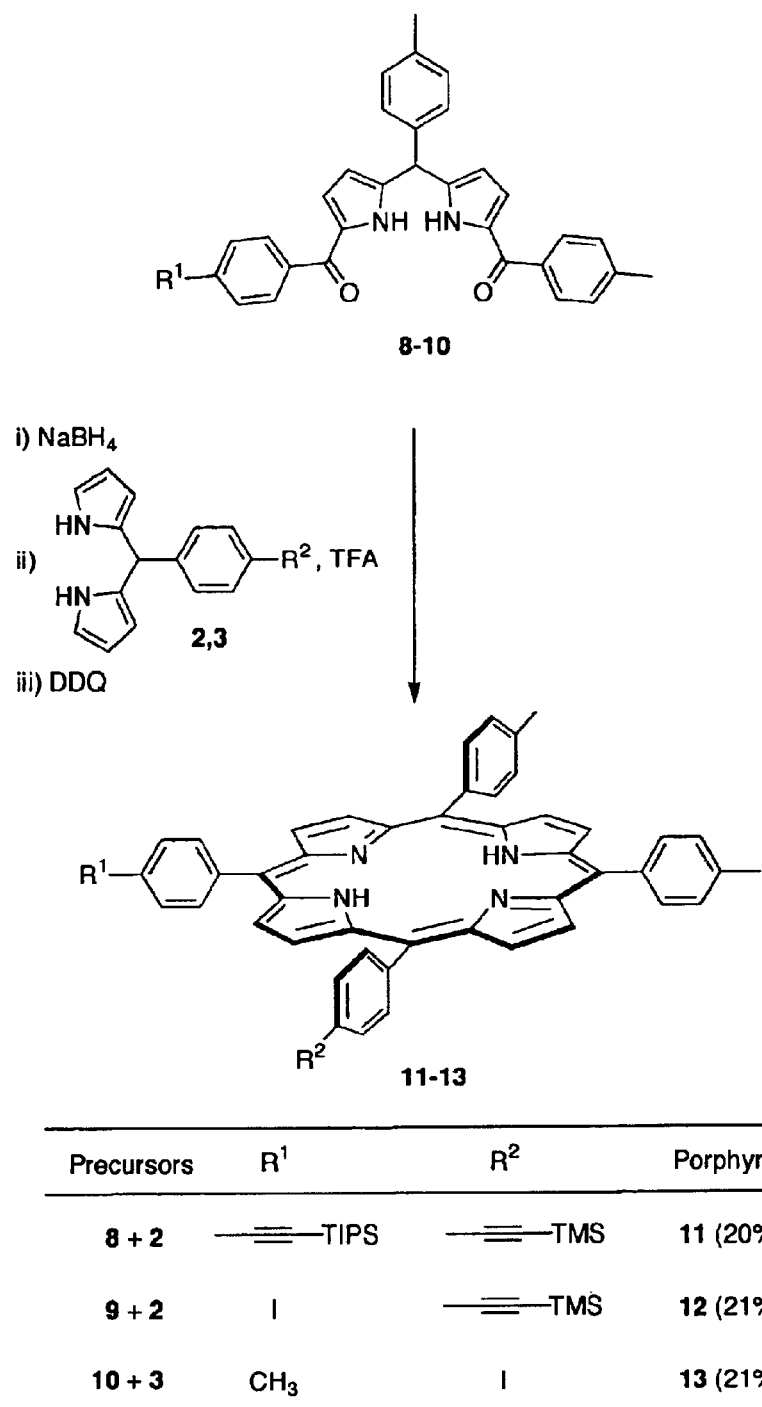
FIG. 17 illustrates synthesis scheme 2.

The synthesis of the porphyrins proceeds by acid-catalyzed condensation of a dipyrromethane and a dipyrromethane-dicarbinol, followed by oxidation upon addition of 2,3-dichloro-5,6-dicyano-1,4-benzoquinone (DDQ) (Rao et al. (2000) *J. Org. Chem.*, 65: 7323). This method affords the corresponding substituted porphyrin. Using this method, reduction of 8 with $NaBH_4$ followed by condensation of the resulting dicarbinol with dipyrromethane 2 in the presence of trifluoroacetic acid (TFA) (30 mM in acetonitrile) and subsequent oxidation with DDQ at room temperature afforded cis-$A_2BC$ porphyrin 11 in 20% yield (Scheme 2, FIG. 17). In the same manner, diacyldipyrromethane 9 and dipyrromethane 2 afforded cis-$A_2BC$ porphyrin 12, and diacyldipyrromethane 10 (Gryko et al. (2000) *J. Org. Chem.*, 65: 2249) and dipyrromethane 3 gave the $A_3B$ porphyrin 13, each in 21% yield. Porphyrins 11–13 are key precursors to the corresponding triple-decker building blocks. The porphyrins 5-(4-iodophenyl)-10,20-bis(4-methylphenyl)-15-[4-(2-(trimethylsilyl)ethynyl)phenyl] porphyrin (14) (Rao et al. (2000) *J. Org. Chem.*, 65: 7323) and 5-(4-iodophenyl)-10,15,20-tri-n-pentylporphyrin (15) (Li et al. (2000) *Org. Chem.*, 65: 7379) have been synthesized previously using the same rational method.

Triple-Decker Building Blocks

Figure 18:
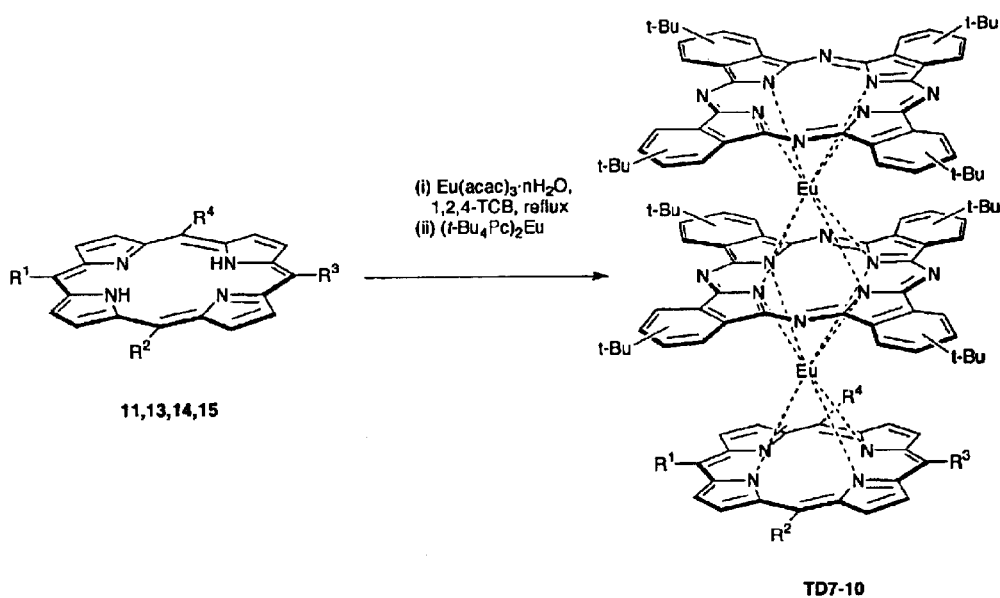
FIG. 18 illustrates synthesis scheme 3.

The type a and type c triple deckers were prepared following rational synthetic pathways. The synthesis of the type c triple-decker building blocks is shown in Scheme 3 (FIG. 18 ). Following a standard method (Chabach et al. (1996) *Angew. Chem. Int. Ed. Engl.*, 35: 898; Gross et al. (2001) *Inorg. Chem.*, 40: 4762), porphyrin 14 was treated with $Eu(acac)_3 \cdot nH_2O$ and double decker $(t\text{-}Bu_4Pc)_2Eu$ (Gross et al. (2001) *Inorg. Chem.*, 40: 4762; Battisti et al. (1992) *Chem. Mater.*, 4: 1323) in refluxing 1,2,4-trichlorobenzene to afford triple decker TD7 in 74% yield, bearing one iodophenyl and one TMS-ethyne group. Note that each europium double decker is assumed to be a radical species. Similarly, triple deckers TD8, TD9 and TD10 were obtained in 79%, 62% and 25% yield, respectively, starting from porphyrins 11, 13 and 15. Note that in TD7 the two functional handles are in trans configuration, whereas they are in cis configuration in TD8.

Figure 19:
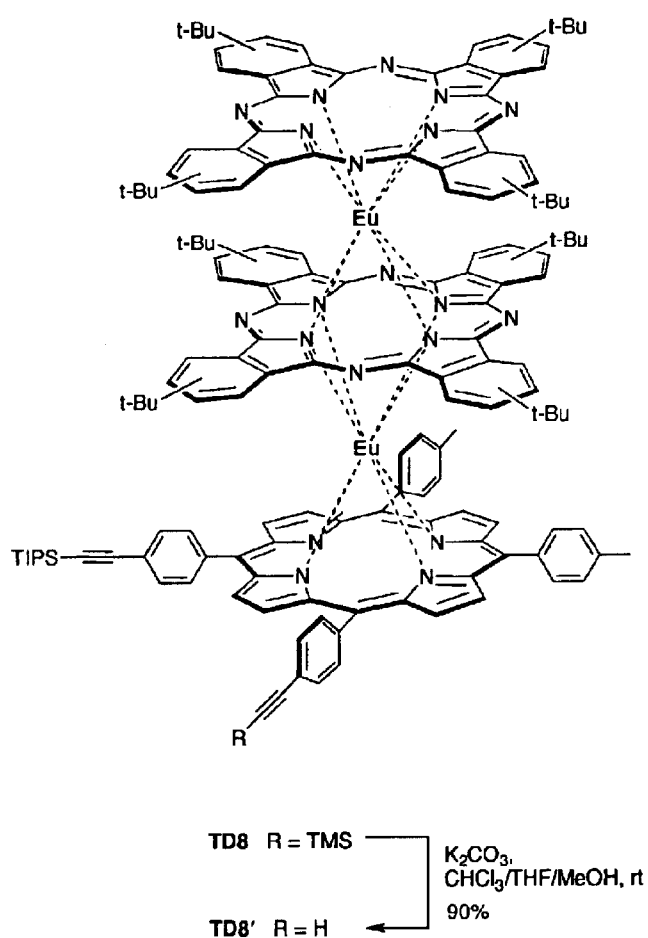
FIG. 19 illustrates synthesis scheme 4.

To provide for a free ethyne group in a subsequent Sonogashira-coupling step, the TMS group of triple decker TD8 was selectively cleaved in the presence of the TIPS group. The cleavage was performed by treating TD8 with finely powdered $K_2CO_3$ in a mixture of chloroform, THF, and methanol (1:5:2) at room temperature, affording ethyne triple decker TD8' in 90% yield after chromatography via a single silica column (FIG. 19).

Compounds TD8' and TD9 represent the desired functionalized analogues to TD4 (Chart 1, FIG. 20), whereas TD10 corresponds to TD6. The two functional handles (TIPS-ethyne and ethyne) in TD8' are cis to each other, thereby qualifying TD8' as a building block for horizontal dyads (see FIG. 8). The iodophenyl unit in triple deckers TD9 and TD10 provides a site for a Sonogashira coupling. Thus, TD9 and TD10 will constitute the terminal, non-attached triple-decker units (TD$^2$) in V1 and H1 dyads.

Figure 21:
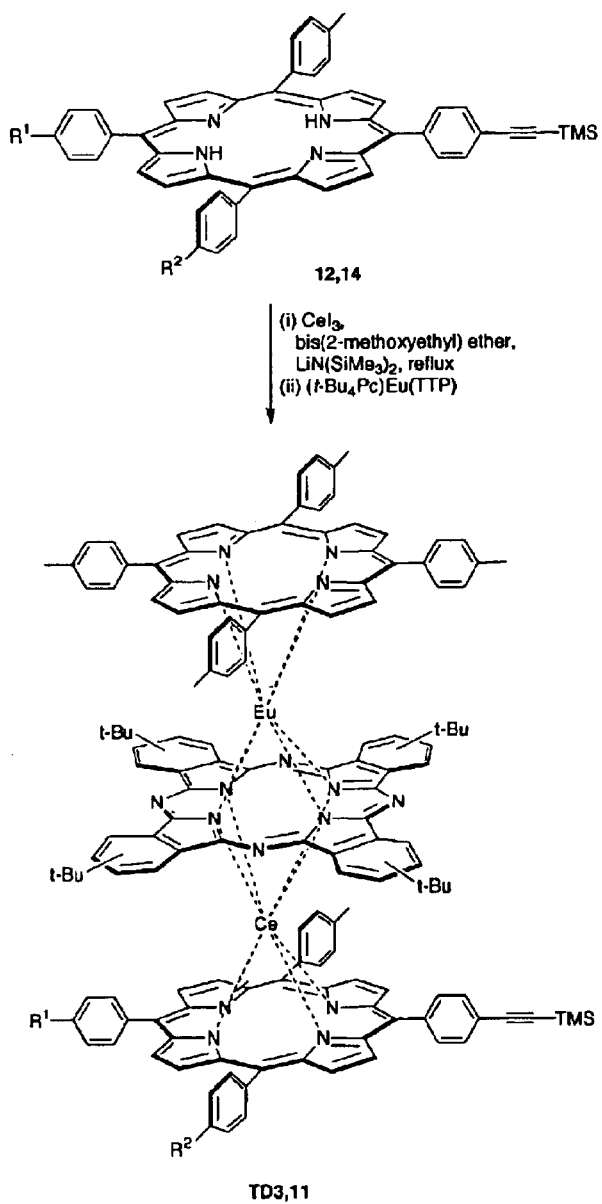
FIG. 21 illustrates synthesis scheme 5.

The synthesis of the type a triple-decker building blocks is shown in Scheme 5 (FIG. 21). Applying a standard procedure (Gross et al. (2001) *Inorg. Chem.*, 40: 4762), reaction of porphyrin 12 with CeI$_3$ and LiN(SiMe$_3$)$_2$ in refluxing bis(2-methoxyethyl) ether followed by treatment with double decker (t-Bu$_4$Pc)Eu(TTP) (Id) afforded TD11 in 54% yield. In the same manner, TD3 was resynthesized in 46% yield by reaction of porphyrin 14 with (t-Bu$_4$Pc)Eu (TTP). However, implementation of the reported synthesis (Id.) of TD3 failed in three out of five attempts, which prompted us to develop a modified procedure employing stringent avoidance of air and moisture. This refined procedure was applied to the synthesis of TD11 on three occasions without fail.

Figure 22:
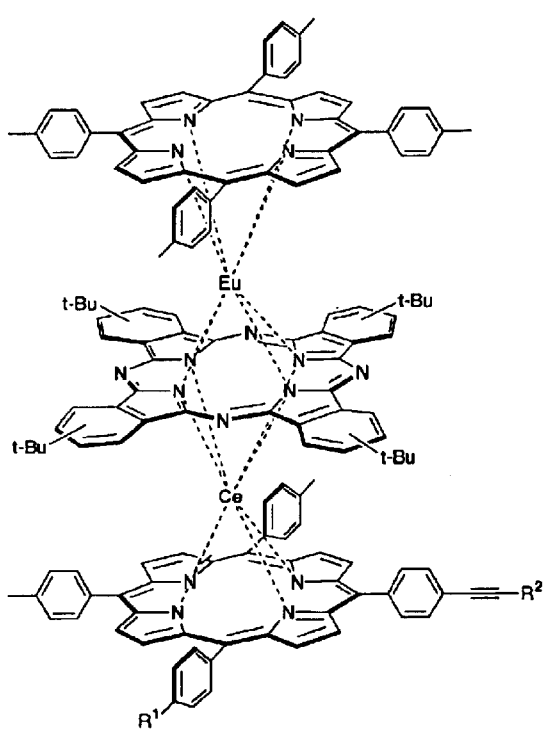
FIG. 22 illustrates synthesis scheme 6.
Figure 23:
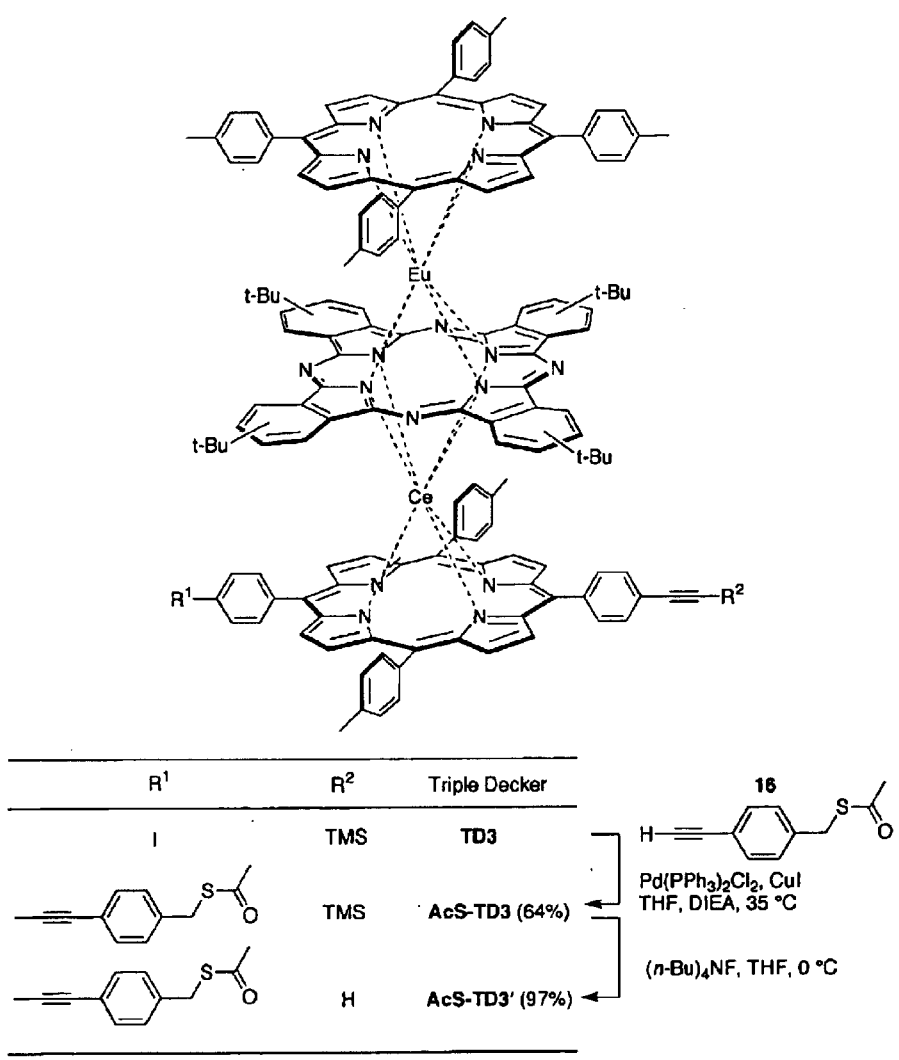
FIG. 23 illustrates synthesis scheme 7.
Figure 24:
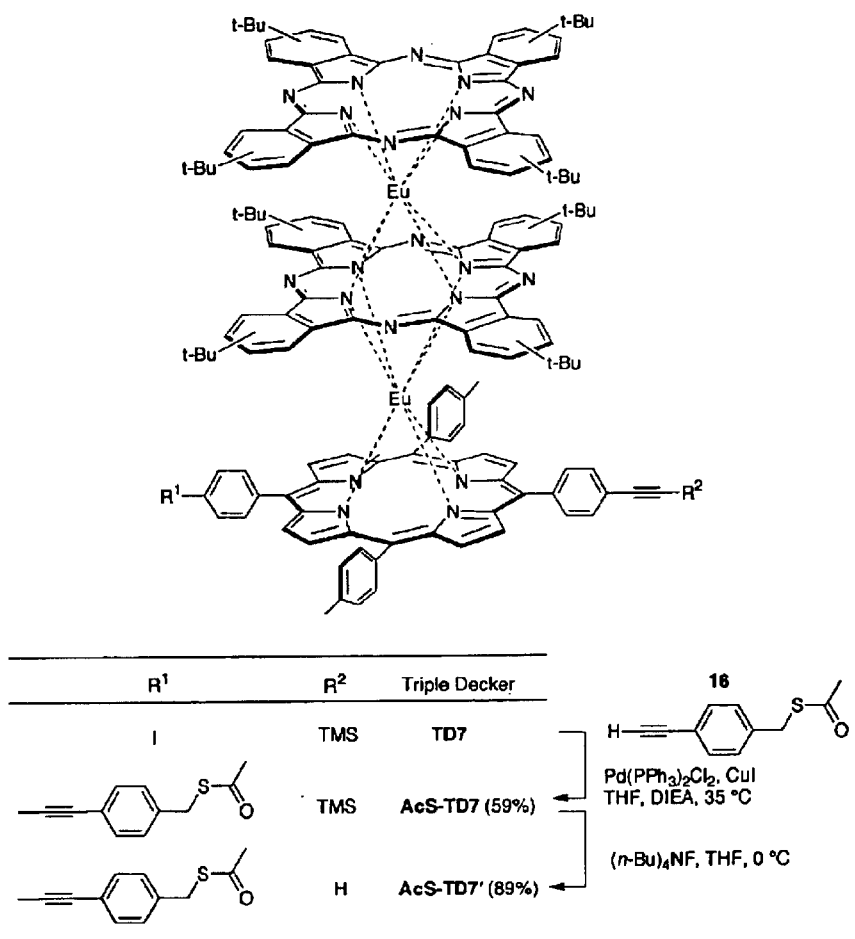
FIG. 24 illustrates synthesis scheme 8.

Subsequent Sonogashira coupling of TD11 with 1-[4-(S-acetylthiomethyl)phenyl]-acetylene (16) (Gryko et al. (2000) *J. Org. Chem.*, 65: 7345) in a mixture of dry THF and triethylamine (TEA) containing CuI afforded S-acetylthiomethyl-substituted triple decker AcS-TD11 in 57% yield (Scheme 6, FIG. 22). In the same manner but using N,N-diisopropylethylamine (DIEA) instead of TEA, AcS-TD3 and AcS-TD7 were obtained in 64% and 59% yield after chromatography, starting from TD3 and TD7, respectively (Scheme 7 and 8, FIGS. 23 and 24, respectively).

Deprotection of the TMS-ethyne groups of AcS-TD3, AcS-TD7 and AcS-TD11 with (n-Bu)$_4$NF in THF at 0° C. afforded the desired triple-decker building blocks AcS-TD3' (Scheme 7, FIG. 23), AcS-TD7' (Scheme 8, FIG. 24), and AcS-TD11' (Scheme 6, FIG. 22) in 97%, 89% and 66% yield, respectively. Note that the S-acetylthio group and the ethyne group in AcS-TD11' are cis to each other, whereas they are trans in AcS-TD3' and AcS-TD7'. Thus, AcS-TD3' and AcS-TD7' will allow the construction of V1 dyads, whereas AcS-TD11' is a building block for an H1 dyad (see FIG. 8).

In summary, the triple-decker building blocks were prepared via rational synthetic routes. Each triple decker prepared herein exists as a mixture of isomers due to one or both of the following types of substitution of the ligands. (1) The presence of a cis-A$_2$BC porphyrin. A cis-A$_2$BC porphyrin is facially enantiotopic and gives rise to enantiomers of triple deckers (TD8, TD11, and their derivatives). (2) The presence of one or two tetra-tert-butylphthalocyanine ligands. The four regioisomers of tetra-tert-butylphthalocyanine (Sommerauer et al. (1996) *J. Am. Chem. Soc.*, 118: 10085) result in a mixture of diastereomers of the triple decker (TD1–TD11 and their derivatives). The relative distribution of the four isomers of each tetra-tert-butylphthalocyanine ligand in the triple deckers is not known. However, the complexity of the $^1$H NMR spectra is consistent with the presence of tetra-tert-butylphthalocyanine isomers in the triple deckers. For packing in SAMs, the isomers of H1 and H2 triple-decker dyads caused by the cis-configuration of the porphyrin were anticipated to impose far greater spatial constraints than those caused by different substitution patterns of the tert-butyl groups about the perimeter of the phthalocyanine ligands. We first focused on the V1 dyads and decided to prepare a series of three different dyads comprised of monomers with a good interleaving of the oxidation potentials.

Vertical Dyads with One Linker (V1)

Figure 25:
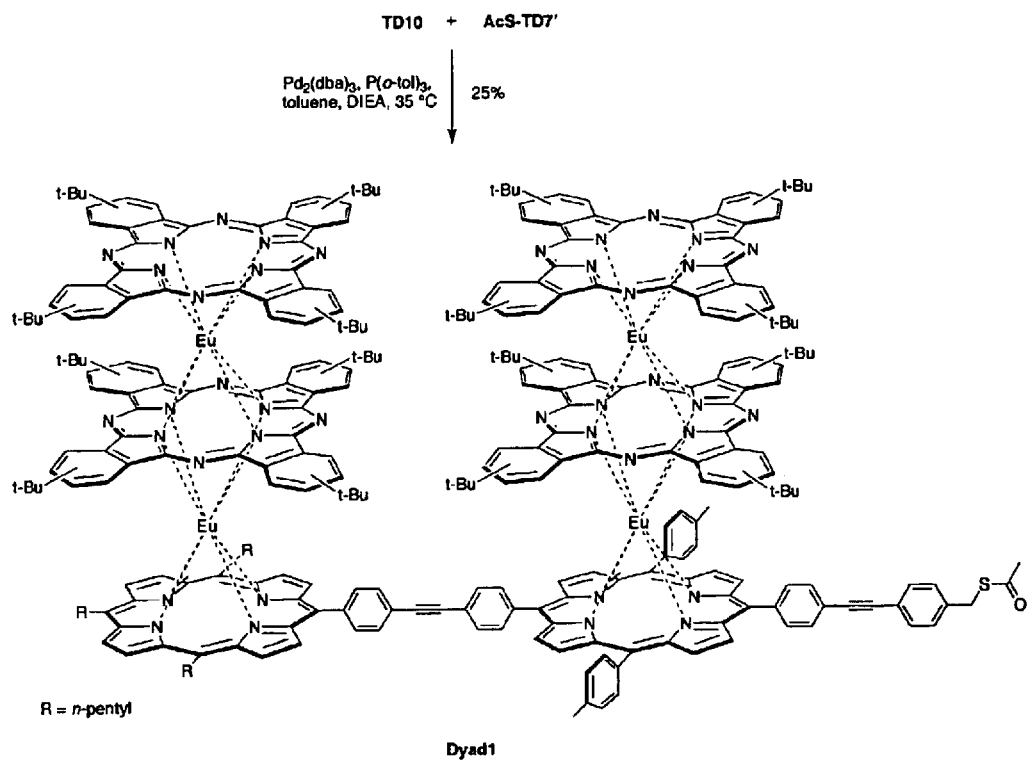
FIG. 25 illustrates synthesis scheme 9.

The synthesis of Dyad1 is shown in Scheme 9 (FIG. 25). S-Acetylthio-derivatized ethynylphenyl triple decker AcS-TD7' was reacted with iodophenyl triple decker TD10 in a Sonogashira coupling, applying copper-free reaction conditions [tris(dibenzylideneacetone)dipalladium(0) (Pd$_2$(dba)$_3$) and tri-p-tolylphosphine (P(o-tol)$_3$) in a 5:1 mixture of toluene/DIEA at 35° C.] that we have developed for use with porphyrins (Wagner et al. (1999) *Chem. Mater.*, 11: 2974). A copper-free Pd-catalyzed coupling procedure was employed to avoid homo-coupling of monomer AcS-TD7'. The progress of the coupling was monitored by analytical size exclusion chromatography (SEC). Because the reaction proceeded quite slowly, a further batch of catalyst [Pd$_2$(dba)$_3$ and P(o-tol)$_3$] was added twice during the course of the reaction. After a total elapsed reaction time of 48 h, the SEC trace still showed starting triple-decker monomers (~32%), but also already a considerable amount of oligomeric side products (~26%) (Analytical SEC data are uncorrected). Therefore, the reaction was stopped by evaporating the solvent. The desired Dyad1 was then obtained in 25% yield after a three-column procedure. The laser-desorption mass spectrometry (LD-MS) spectrum with the matrix 1,4-bis(5-phenyloxazol-2-yl)benzene (POPOP) showed the molecule ion peak at m/z=5001.2 together with several fragmentation peaks at lower mass.

Figure 26:
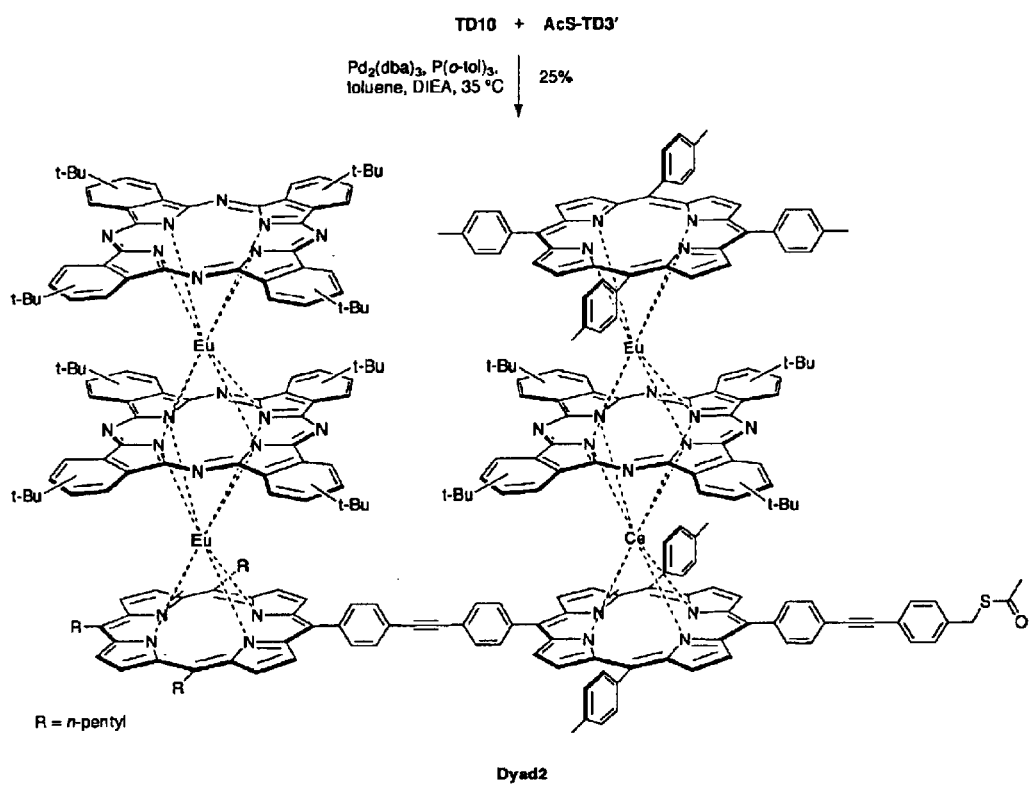
FIG. 26 illustrates synthesis scheme 10.

Analogously, S-acetylthio-derivatized triple decker AcS-TD3' was treated with TD10 in a Sonogashira reaction to give Dyad2 (Scheme 10, FIG. 26). Again, further catalyst was added twice, because the reaction had slowed down. Analytical SEC after 21 h revealed that oligomeric side-products had formed (~39%) while unreacted triple-decker monomers (~26%) were still present in the reaction mixture (analytical SEC data are uncorrected). The reaction was stopped after 24 h, affording Dyad2 in 25% yield after chromatography. The LD-MS spectrum showed the molecule ion peak at m/z=4922.1, and also a peak at m/z=4876.2 corresponding to fragmentation owing to the cleavage of the S-acetylthio group.

Figure 27:
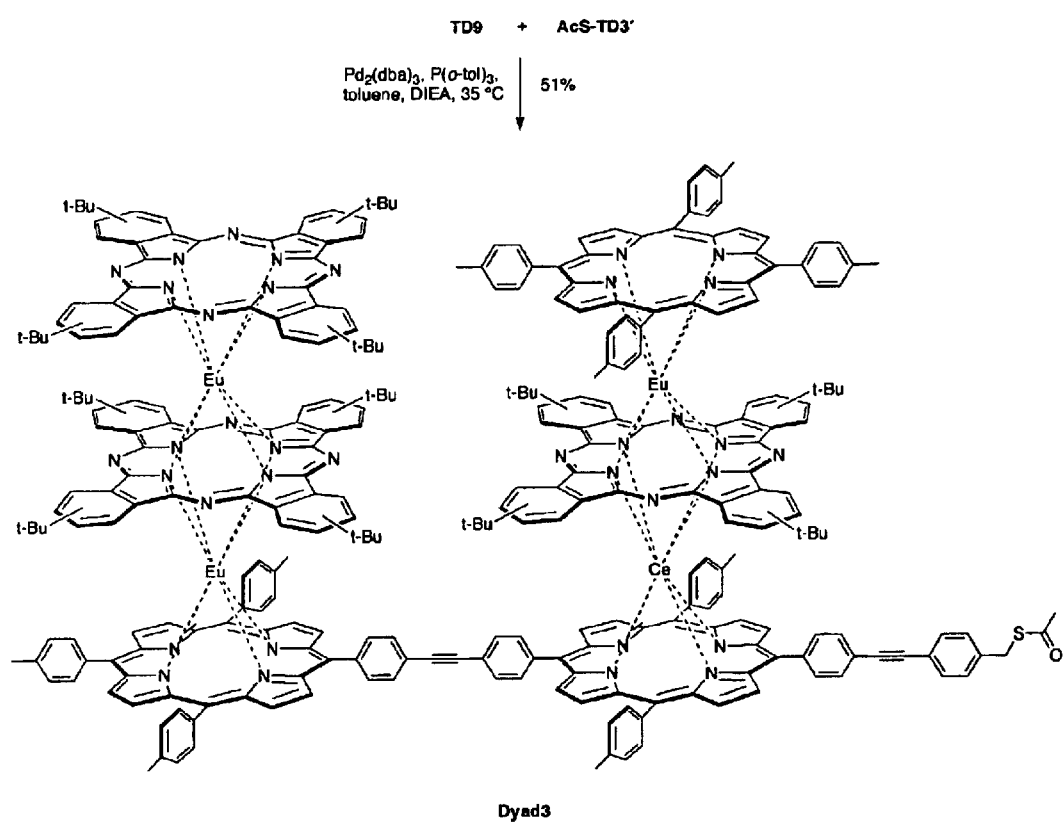
FIG. 27 illustrates synthesis scheme 11.

The same conditions [Pd$_2$(dba)$_3$, P(o-tol)$_3$ in a 5:1 mixture of toluene/DIEA at 35° C.] were applied to the reaction of AcS-TD3' and iodophenyl triple decker TD9 (Scheme 11, FIG. 27). The coupling reaction was monitored by analytical SEC, and a further amount of catalyst was added after 20 h. After a total reaction time of 24 h, removal of the solvent and chromatographic work-up afforded Dyad3 in 51% yield. The LD-MS spectrum (POPOP) showed the molecule ion peak at m/z=4979.4 and a peak at m/z=4902.4 due to cleavage of the S-acetylthio linker.

Note that Dyad2 and Dyad3 are each comprised of one type a triple decker and one type c triple decker, whereas Dyad1 consists of two type c triple deckers. In addition, in Dyad2 and Dyad3 one europium is replaced by cerium, which provides for additional oxidation states in the information-storage molecule. For the preparation of Dyad1–3, we initially chose the hindered base DIEA as recommended in Pd-coupling reactions involving the S-acetylthiophenyl group (Hsung et al. (1995) *Tetrahedron Lett.*, 26: 4525). However, we found that in all three cases upon use of DIEA, the formation of the triple-decker dyad proceeded very slowly and was accompanied by the formation of considerable amounts of oligomeric side-products as indicated by analytical SEC. The formation of significant amounts of higher molecular weight material is also observed in Pd-coupling reactions with porphyrins (Gryko et al. (2000) *J. Org. Chem.*, 65: 7345; Wagner et al. (1999) *Chem. Mater.*, 11: 2974). To overcome the problems of long reaction times, low yields, and the loss of starting material due to the formation of oligomers, we decided to employ TEA in place of DIEA in the following Pd-mediated coupling reactions. Coupling reactions involving TEA have proved successful for the (S-acetylthiomethyl)aryl group (Clausen et al. (2000) *J. Org. Chem.*, 65: 7363; Rukavishnikov et al. (1999) *Tetrahedron Lett.*, 40: 6353), which is more stable than the S-acetylthiophenyl group, and is used as the linker in our case.

Horizontal Dyads with One Linker (H1)

Figure 28:
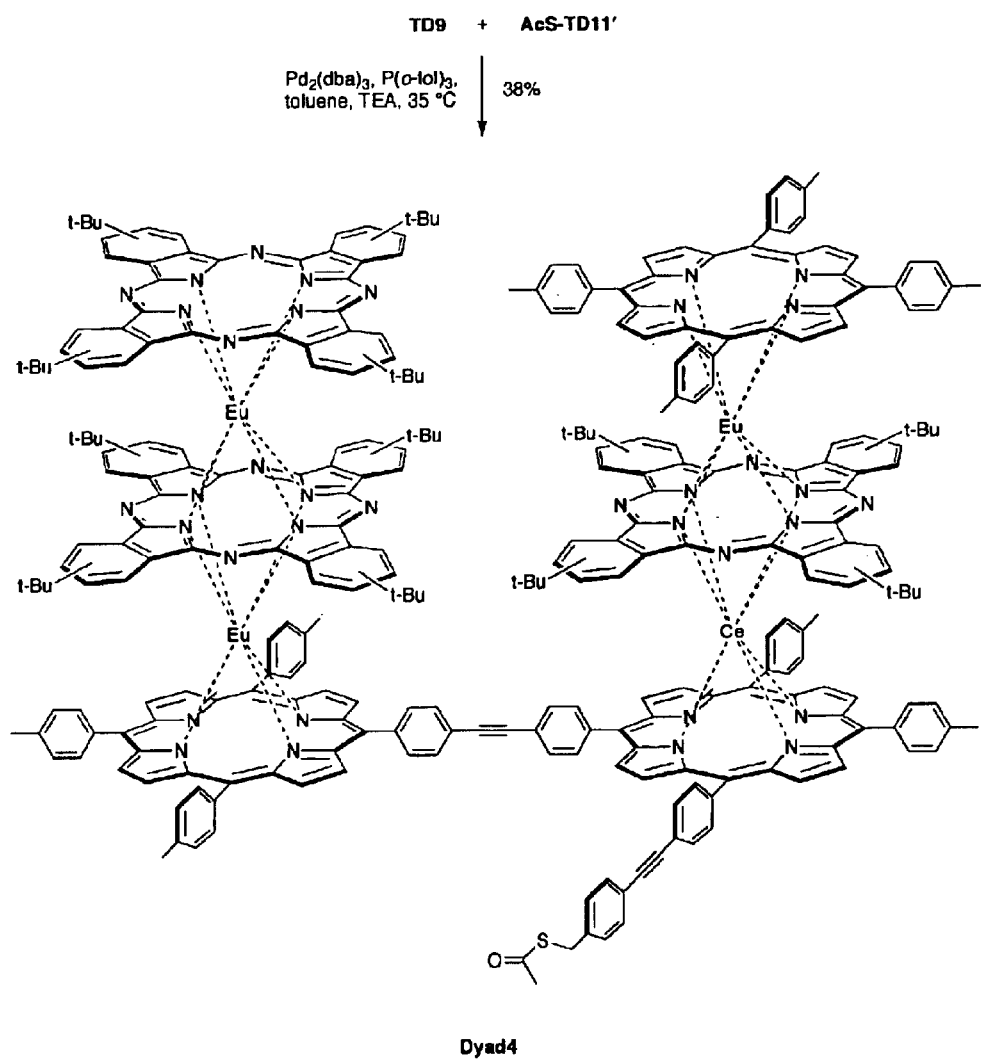
FIG. 28 illustrates synthesis scheme 12.

An H1 dyad analogous to Dyad3 was prepared to investigate the influence of the different architectures of triple-decker dyads on the electrochemical properties in solution as well as in SAMs. For this purpose, ethynylphenyl triple decker AcS-TD11' was treated with iodophenyl triple decker TD9, applying the reaction conditions described above with use of TEA instead of DIEA (Scheme 12, FIG. 28). The reaction was monitored by analytical SEC and by LD-MS. The reaction proceeded faster than those employing DIEA and was stopped after 8.5 h. However, further catalyst had to be added twice. The desired Dyad4 was obtained in 38% yield after chromatography on silica, SEC (THF), and again on silica. LD-MS (POPOP) showed the molecule ion peak at m/z=4975.8. Note that Dyad4 is isomeric to Dyad3 with the S-acetylthiomethyl linker cis instead of trans to the inter-triple decker axis.

Horizontal Dyads with Two Linkers (H2)

In the H2 dyads, each triple decker bears one S-acetylthiomethyl linker for attachment to the gold surface. As stated above, this arrangement is anticipated to prevent rotation of the triple-decker moieties around the bridging ethyne group upon binding to a surface, but a mixture of syn/anti isomers will also be present. For purposes of comparing the H1 and H2 architectures, we prepared the H2 dyad analogous to Dyad4, substituted with a thiol-attachment unit at both triple deckers.

Figure 29:
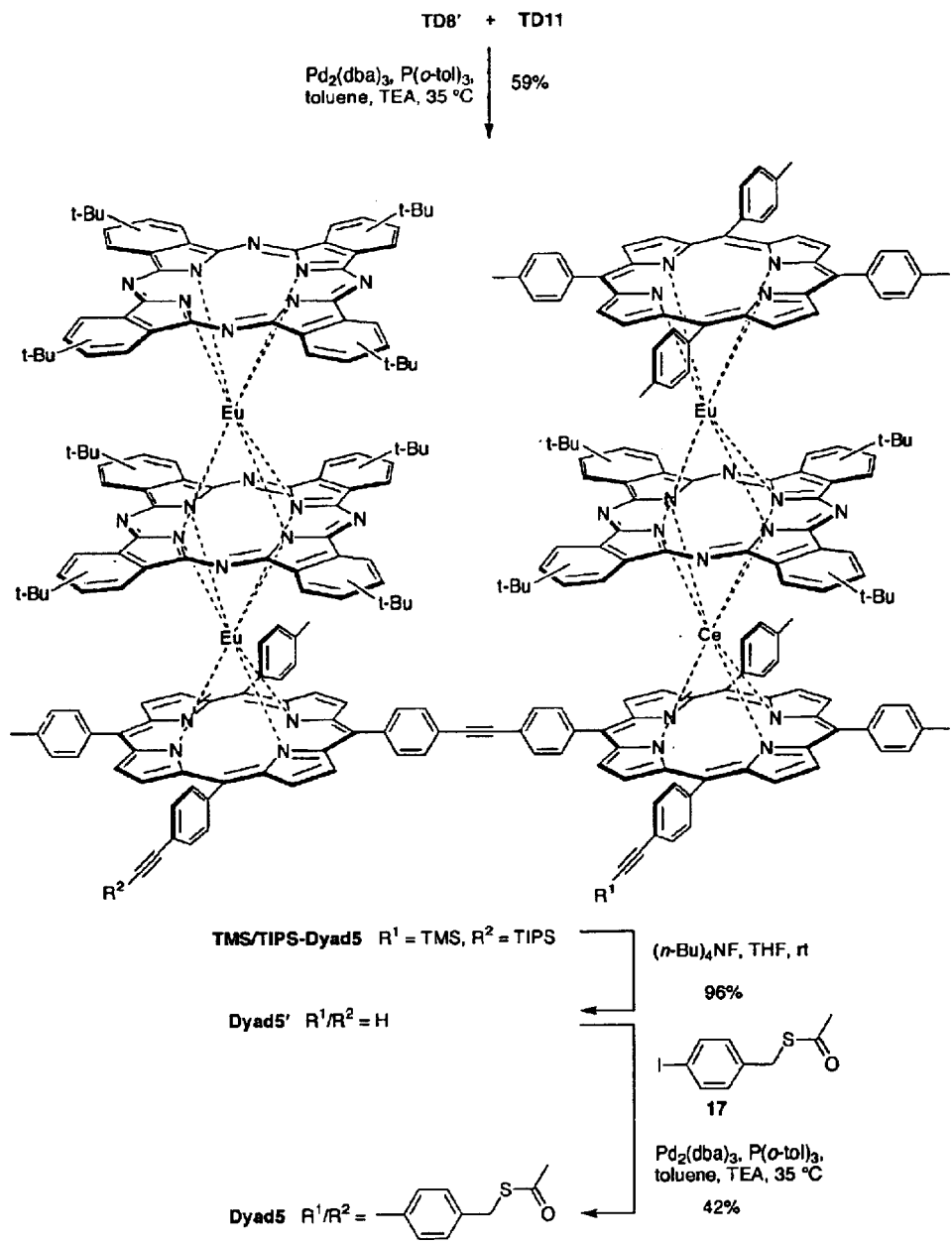
FIG. 29 illustrates synthesis scheme 13.
Figure 30:
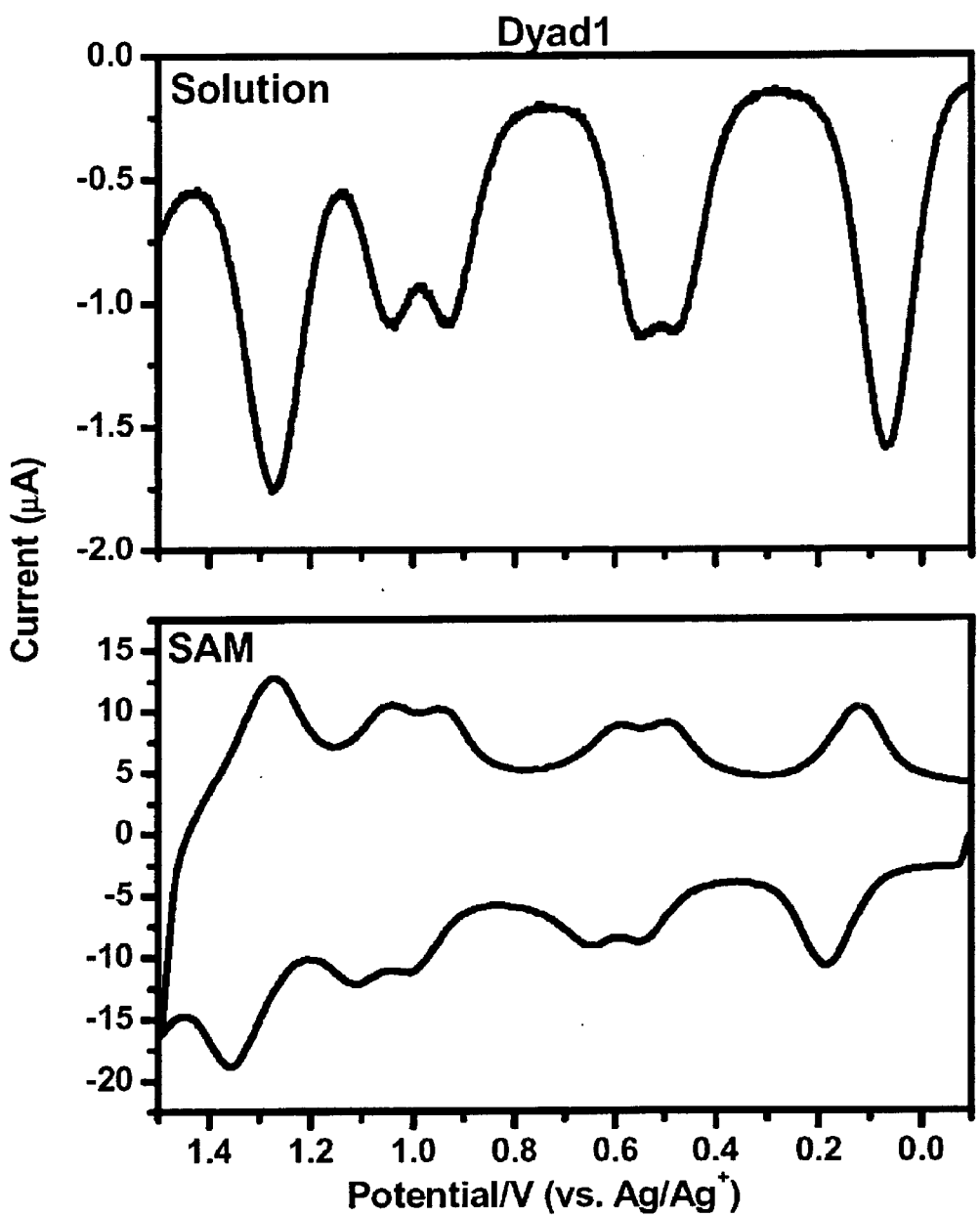
FIG. 30 illustrates voltammetry of Dyad1 in solution (top panel) and in a SAM (bottom panel). The solvent was $CH_2Cl_2$ containing 0.1 M (solution) or 1.0 M (SAM) $Bu_4NPF_6$; the scan rate was 0.1 V s$^{-1}$ (solution) or 100 V s$^{-1}$ (SAM).
Figure 31:
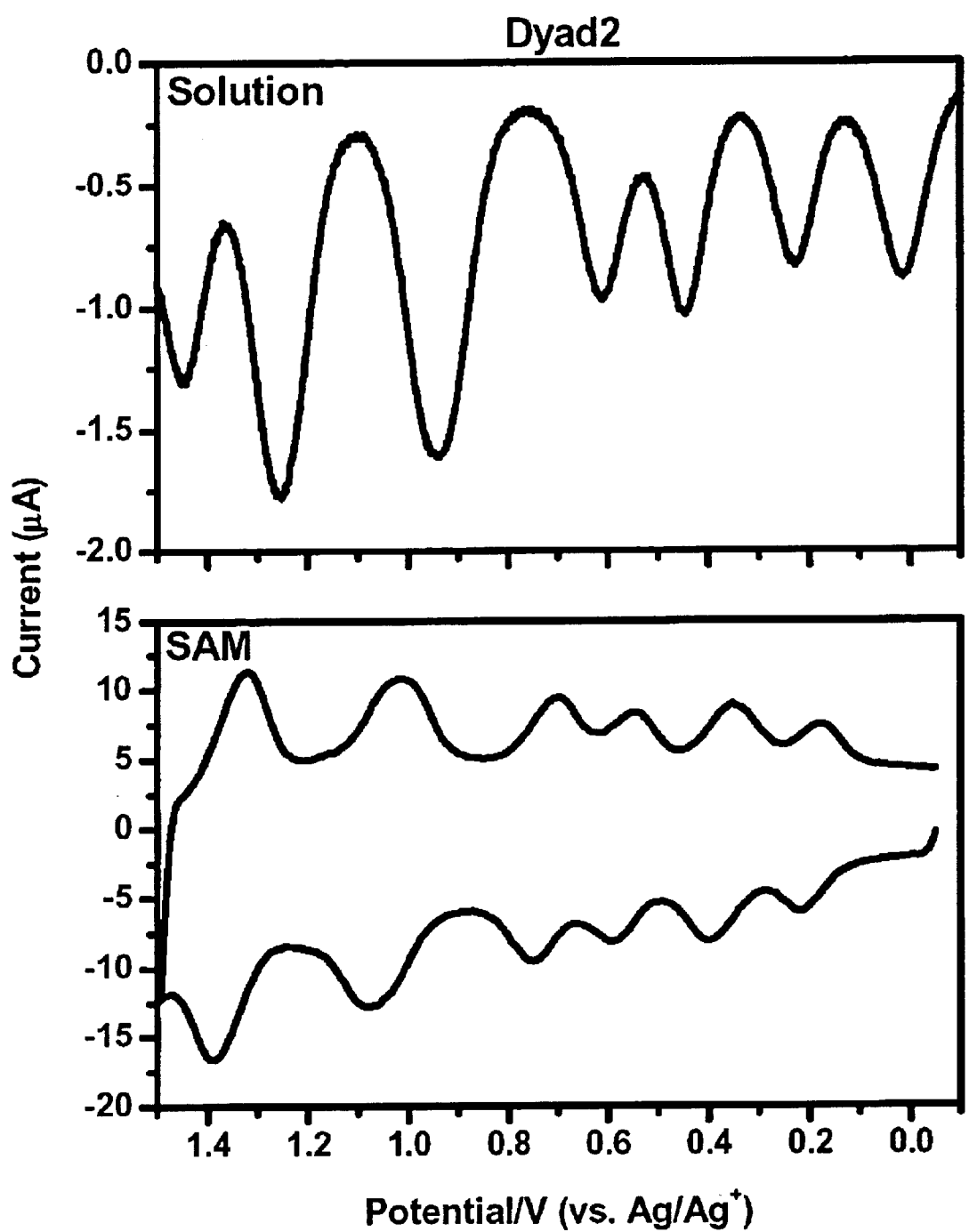
FIG. 31 illustrates voltammetry of Dyad2 in solution (top panel) and in a SAM (bottom panel). The solvent was $CH_2Cl_2$ containing 0.1 M (solution) or 1.0 M (SAM) $Bu_4NPF_6$; the scan rate was 0.1 V s–1 (solution) or 100 V s–1 (SAM).
Figure 32:
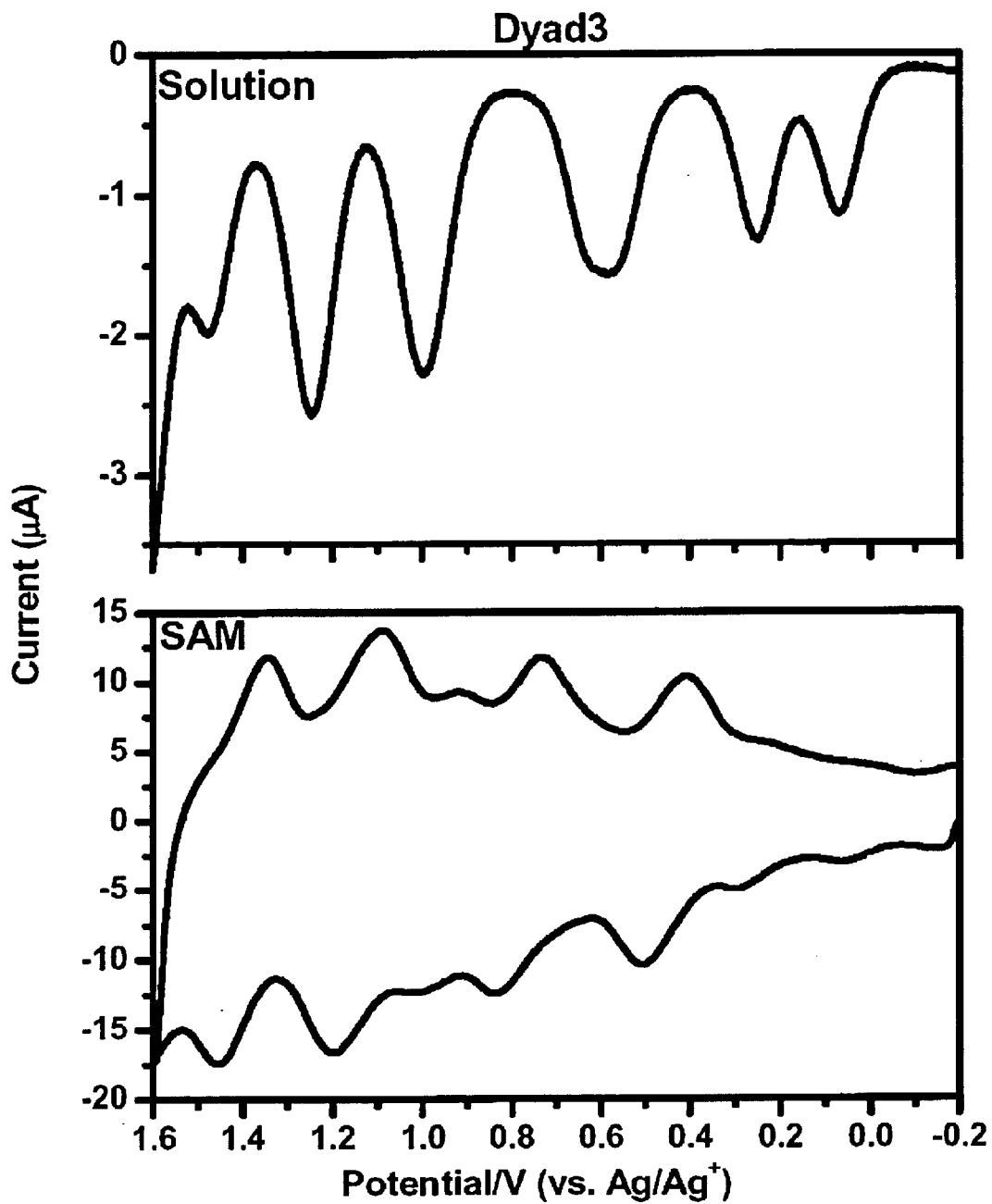
FIG. 32 illustrates voltammetry of Dyad3 in solution (top panel) and in a SAM (bottom panel). The solvent was $CH_2Cl_2$ containing 0.1 M (solution) or 1.0 M (SAM) $Bu_4NPF_6$; the scan rate was 0.1 V s–1 (solution) or 100 V s–1 (SAM).
Figure 33:
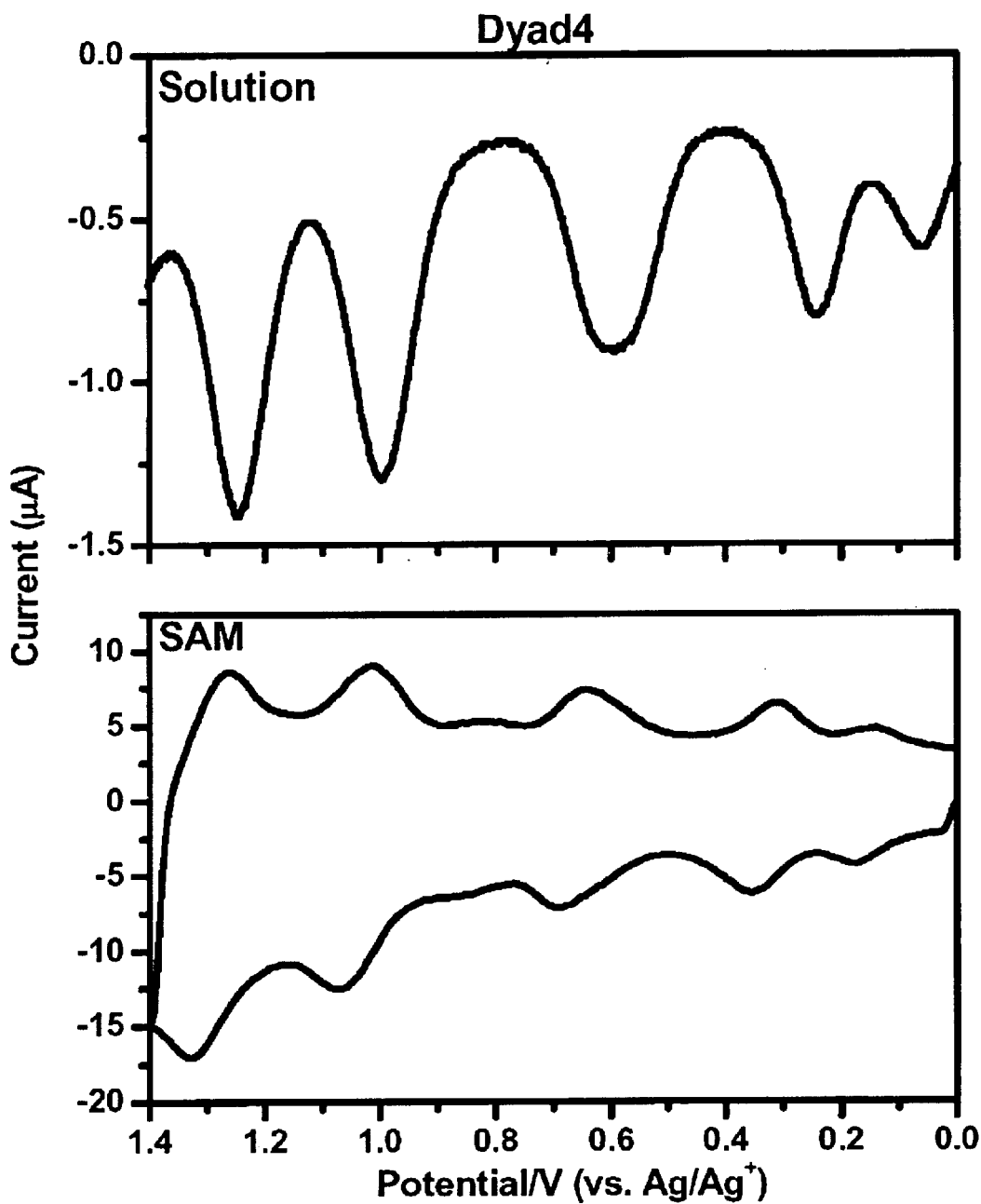
FIG. 33 illustrates voltammetry of Dyad4 in solution (top panel) and in a SAM (bottom panel). The solvent was $CH_2Cl_2$ containing 0.1 M (solution) or 1.0 M (SAM) $Bu_4NPF_6$; the scan rate was 0.1 V s–1 (solution) or 100 V s–1 (SAM).
Figure 34:
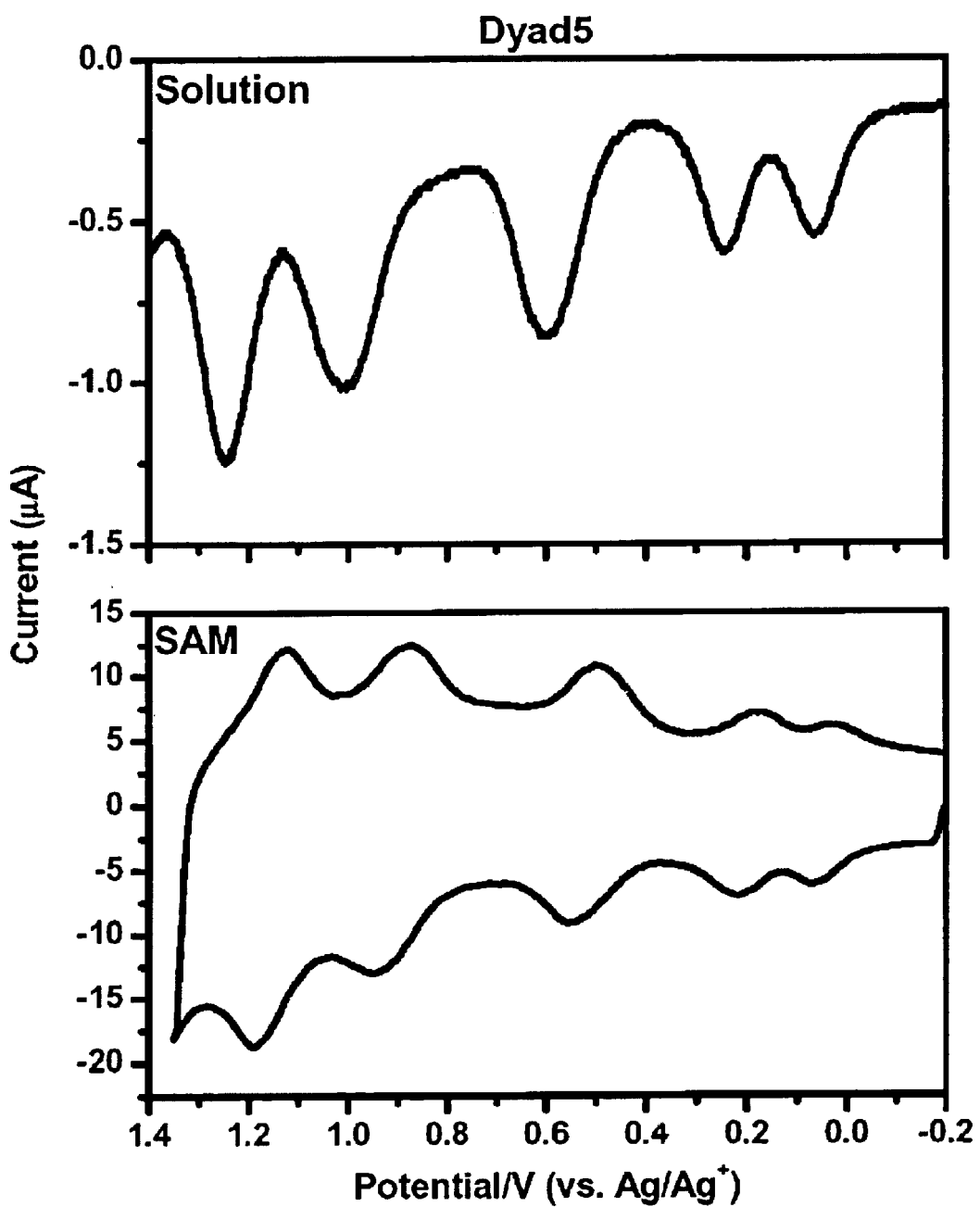
FIG. 34 illustrates voltammetry of Dyad5 in solution (top panel) and in a SAM (bottom panel). The solvent was $CH_2Cl_2$ containing 0.1 M (solution) or 1.0 M (SAM) $Bu_4NPF_6$; the scan rate was 0.1 V s$^{-1}$ (solution) or 100 V s$^{-1}$ (SAM).

Applying the same reaction conditions as for the synthesis of Dyad4, iodophenyl triple decker TD11 was coupled with ethynylphenyl triple decker TD8' (Scheme 13, FIG. 29). Note that both TD11 and TD8' each incorporate one cis-$A_2BC$ porphyrin. After 5.5 h, analytical SEC indicated ~67% of product TMS/TIPS-Dyad5, and the reaction was stopped (analytical SEC data are uncorrected). In contrast to the coupling reactions involving DIEA, almost no oligomeric species were present in the reaction mixture. The desired dyad was isolated in 59% yield after a two-column procedure. The TIPS and TMS groups of TMS/TIPS-Dyad5 were both cleaved in one step by treatment with $(n-Bu_4)NF$ in THF at room temperature. LD-MS showed that deprotection was complete after 1 h, affording Dyad5' in 96% yield. The S-acetylthiomethyl-linker groups were then introduced by Sonogashira coupling $[Pd_2(dba)_3, P(o-tol)_3,$ toluene/TEA (5:1), 35° C.] of Dyad5' with excess of 1-(S-acetylthiomethyl)-4-iodobenzene (17) (Gryko et al. (2000) *J. Org. Chem.*, 65: 7345), affording the desired Dyad5 in 42% yield. LD-MS showed the molecule ion peak at m/z= 5155.65 together with peaks at m/z=5080.83 and 4980.57 owing to cleavage of the linker groups. Dyad5 consists of a large number of isomers due to the four syn/anti architectures and the presence of the four patterns of tert-butyl groups on each phthalocyanine ligand. The four syn/anti architectures are expected to exhibit distinct spatial demands as shown in FIG. 15.

3. General Characterization of Triple-decker Building Blocks and Dyad

The triple-decker building blocks and dyads were assessed for homogeneity by thin layer chromatography (TLC) and by analytical SEC. Characterization was generally performed by absorption spectroscopy, LD-MS, $^1H$ NMR spectroscopy, and fast-atom bombardment mass spectrometry (FAB-MS). Many of the triple deckers and all of the S-acetylthiomethyl-derivatized dyads were characterized electrochemically in solution, and all of the latter were also characterized electrochemically in SAMs.

Mass Spectra

LD-MS has proved particularly effective for identifying the desired lanthanide porphyrin/phthalocyanine complexes. The triple-decker monomers each display the molecule ion peak together with characteristic fragmentation peaks upon analysis without a matrix. For the dyads, the best spectra were obtained employing POPOP as a matrix. In addition, a FAB-MS spectrum was obtained for each of Dyad1–4. Samples of TMS/TIPS-Dyad5, Dyad5', and Dyad5 did not ionize.

Absorption Spectra

The UV-Vis spectra of the triple-decker monomers exhibit absorption at 362–364 nm for type a (AcS-TD3, AcS-TD3', TD11, AcS-TD11, AcS-TD11') and at 345–348 nm for type c (TD7, AcS-TD7, AcS-TD7', TD8, TD8', TD9, TD10), which are attributed to the B-band of the phthalocyanine moieties. Absorption in the region at 421–427 nm for type a and at 416–418 nm for type c are assigned to the porphyrin B-band. The remaining absorption in the visible region is attributed to the Q-bands of the macrocycles, in which the lower-energy Q-bands are contributed mainly by the phthalocyanine (Ng and Jiang (1997) *Chem. Soc. Rev.*, 26: 433). The data are in good agreement with those reported for similar heteroleptic triple-decker (phthalocyaninato)-(porphyrinato)Eu(III) (Li et al. (2000) *Org. Chem.*, 65: 7379; Jiang et al. (1998) *Inorg. Chim. Acta*, 268: 49; Jiang et al. (1997) *Inorg. Chim. Acta*, 255: 59; Moussavi et al. (1986) *Inorg. Chem.*, 25: 2107) and Ce(III) complexes (Chabach et al. (1992) *New J. Chem.*, 16: 431; Tran-Thi et al. (1994) *J. Phys. Chem.*, 98: 8279). Interestingly, the different substituents at the aryl groups of the porphyrins within two series (type a triple deckers TD3, AcS-TD3, AcS-TD3', TD11, AcS-TD11, AcS-TD11'; type c triple deckers TD8, TD8', TD9) do not induce a substantial shift on the absorption maxima, an observation noted by Ng for some Eu(III) triple-decker complexes (Jiang et al. (1998) *Inorg. Chim. Acta*, 268: 49). In the case of type a triple deckers, the porphyrin B-band is broadened or split owing to the presence of two different porphyrins. Due to the decrease in ratio of porphyrin/phthalocyanine when going from type a (2:1) to type c (1:2); this band is the most intense in the spectra for type a, whereas the phthalocyanine B-band is dominant for type c (Jiang et al. (1998) *Inorg. Chim. Acta*, 268: 49; Jiang et al. (1997) *Inorg. Chim. Acta*, 255: 59; Chabach et al. (1992) *New J. Chem.*, 16: 431; Tran-Thi et al. (1994) *J. Phys. Chem.*, 98: 8279). Similar features are observed for the triple-decker dyads, and their absorption spectra are essentially the sum of the spectra of the corresponding monomers. The phthalocyanine B-band of Dyad2–5 (comprised of type a and type c) is located at 350–353 nm (between that of type a and type c triple deckers). The porphyrin B-band is broadened or split and shows the highest intensity. In the case of the only type c/type c dyad (Dyad1), the phthalocyanine B-band is the most intense absorption band. Thus, a simple inspection of the UV/Vis spectra allows distinction between type a/type c and type c/type c triple-decker dyads.

$^1$H NMR Spectra

Heteroleptic triple-decker complexes with paramagnetic metal centers such as Ce(III) and Eu(III) give $^1$H NMR spectra wherein the signals are generally broad and spread over a wide region (Ng and Jiang (1997) *Chem. Soc. Rev.*, 26: 433). In addition, the presence of one or more tetra-tert-butylphthalocyanine ligand (comprised of four regioisomers) in each triple decker caused the $^1$H NMR spectra of the triple-decker monomers and dyads to be very complex and difficult to interpret. The relative distribution of the four isomers of each tetra-tert-butylphthalocyanine ligand in the triple deckers is not known. However, the complexity of the $^1$H NMR spectra is consistent with the presence of tetra-tert-butylphthalocyanine isomers in the triple deckers. In particular, the aromatic protons result in broad (eventually overlapping) multiplet signals. Restricted rotation along the C(meso)-C(aryl) bonds in porphyrins of symmetrical type a and type c Eu(III) triple-decker complexes has been attributed as the source of 4 or 5 signals for the meso-phenyl protons (Jiang et al. (1998) *Inorg. Chim. Acta*, 268: 49; Jiang et al. (1997) *Inorg. Chim. Acta*, 255: 59). The triple deckers of type c (TD8, TD8', TD9, TD10) are comprised of two nonequivalent phthalocyanine rings (inner and outer in the sandwich complex) and a porphyrin bearing 3 or 4 nonequivalent meso-aryl rings, which further complicates the spectra. Nevertheless, by comparison with data for similar symmetrical triple deckers (Li et al. (2000) *Org. Chem.*, 65: 7379; Jiang et al. (1998) *Inorg. Chim. Acta*, 268: 49; Jiang et al. (1997) *Inorg. Chim. Acta*, 255: 59; Liu et al. (2000) *Inorg. Chim. Acta*, 310: 140), multiplets at $\delta$=13.6–12.6, 11.26–11.24, 11.0–8.6, 7.4–7.1, 6.8, and 5.4–5.0 ppm can be attributed to the $\alpha$ and $\beta$ protons of the phthalocyanines and to the meso-phenyl protons of the porphyrin moiety. The tert-butyl groups on the phthalocyanine macrocycle together with the $\beta$-pyrrole protons of the porphyrin ligand give rise to a broad multiplet in the range of 3.6–2.5 ppm. Specific assignments can be made for some significant signals. A singlet at $\delta$=0.84 ppm in the spectrum of TD8 is ascribed to the TMS group. This signal is absent in the spectrum of TD8', showing complete deprotection. Instead, a singlet is observed at $\delta$=3.86 ppm due to the free ethyne group. The TIPS group in TD8 or TD8' gives rise to a sharp peak at $\delta$=1.77 or 1.75 ppm, respectively.

Triple deckers of type a (AcS-TD3, AcS-TD3', TD11, AcS-TD11, AcS-TD11') contain two different porphyrins (TTP and a porphyrin bearing 3 or 4 nonequivalent phenyl rings). The signals are generally shifted to higher fields owing to the presence of one Ce instead of Eu in the triple-decker complex (Gross et al. (2001) *Inorg. Chem.*, 40: 4762; Buchler et al. (1986) *J. Am. Chem. Soc.*, 108: 3652). The TMS groups in TD11, AcS-TD11, and AcS-TD3 result in a singlet between $\delta$=−0.05 and −0.08 ppm. After deprotection, a singlet is found at $\delta$=2.56 ppm for the ethyne proton in AcS-TD11' or AcS-TD3'. The S-acetylthiomethyl linker groups in each of AcS-TD3, AcS-TD3', AcS-TD11, and AcS-TD11' give rise to singlets at $\delta$=2.26–2.27 and 3.96–3.98 ppm.

The $^1$H NMR spectra of the triple-decker dyads are even more complex owing to the superimposed (complex) spectra of the corresponding monomers. However, as in the case for the monomers, singlet signals at $\delta$=2.61 and 4.44 ppm for Dyad1 and at $\delta$=2.31–2.32 and 4.01–4.06 ppm for Dyad2–5 are attributable to the S-acetylthiomethyl linker(s) attached to one or both triple-decker moieties.

4. Electrochemical Characteristics of the Dyads in Solution and in SAMs Olution

The solution electrochemical properties of Dyad1–5 were examined and compared with those of the most structurally similar triple-decker benchmark complexes. These benchmarks are as follows: Dyad1, TD4/TD6; Dyad2, TD3/TD6; Dyad3–5, TD3/TD4. The square-wave voltammograms of Dyad1–5 are shown in FIGS. 30–34 (top panels). The potentials for all five dyads are summarized in Table 2. In the table, the potentials are listed in order of increasing value. Accordingly, each successive pair of values for a dyad corresponds to lower potential for each of the two triple deckers in the dyad (i.e., dyad ($E_{0/+1}/E_{+1/+2}$) corresponds to $TD^\alpha(E_{0/+1})/TD^\beta(E_{0/+1})$; dyad($E_{+2/+3}/E_{+3/+4}$) corresponds to $TD^\alpha(E_{+1/+2})TD^\beta(E_{+1/+2})$, etc., where $TD^\alpha$ and $TD^\beta$ denote the two triple deckers in the dyad). Comparison of the data in Tables 1 and 2 shows that the solution redox potentials of the dyads are quite close to those of the benchmark triple deckers. In all cases, the potentials for the analogous states of the dyads and the benchmark triple deckers differ by 0.05 V or less. The largest differences in potential (albeit small) occur for Dyad1 and Dyad2 where one of the meso-pentyl substituents of the porphyrin in the benchmark triple decker is replaced by a diphenylethyne linker. The potential differences are negligible for the other dyads because the diphenylethyne linker and the (S-acetylthiomethyl)-diarylethyne linker(s) have very similar electron-donating properties to that of the aryl group of the benchmark triple deckers.

TABLE 2

Potentials for the oxidation of the dyads in solution[a] and in SAMs[b]

| Dyad | $E_{0/+1}$ | $E_{+1/+2}$ | $E_{+2/+3}$ | $E_{+3/+4}$ | $E_{+4/+5}$ | $E_{+5/+6}$ | $E_{+6/+7}$ | $E_{+7/+8}$ |
|---|---|---|---|---|---|---|---|---|
| Solution | | | | | | | | |
| Dyad1 | ~0.07 | ~0.07 | 0.48 | 0.55 | 0.94 | 1.05 | ~1.28 | ~1.28 |
| Dyad2 | 0.01 | 0.23 | 0.44 | 0.61 | ~0.94 | ~0.94 | ~1.25 | ~1.25 |
| Dyad3 | 0.07 | 0.24 | ~0.58 | ~0.58 | ~0.99 | ~0.99 | ~1.24 | ~1.24 |
| Dyad4 | 0.06 | 0.24 | ~0.58 | ~0.58 | ~0.99 | ~0.99 | ~1.24 | ~1.24 |
| Dyad5 | 0.07 | 0.25 | ~0.60 | ~0.60 | ~1.01 | ~1.01 | ~1.25 | ~1.25 |
| SAM | | | | | | | | |
| Dyad1 | ~0.15 | ~0.15 | 0.52 | 0.61 | 0.98 | 1.08 | ~1.31 | ~1.31 |
| Dyad2 | 0.20 | 0.38 | 0.57 | 0.72 | ~1.05 | ~1.05 | ~1.35 | ~1.35 |
| Dyad3 | 0.26 | 0.46 | ~0.78 | ~0.78 | ~1.14 | ~1.14 | ~1.40 | ~1.40 |
| Dyad4 | 0.16 | 0.35 | ~0.67 | ~0.67 | ~1.04 | ~1.04 | ~1.29 | ~1.29 |
| Dyad5 | 0.05 | 0.20 | ~0.53 | ~0.53 | ~0.91 | ~0.91 | ~1.16 | ~1.16 |

[a]Obtained in CH$_2$Cl$_2$ containing 0.1 M Bu$_4$NPF$_6$. E-values vs. Ag/Ag$^+$; FeCp$_2$/FeCp$_2^+$ = 0.19 V; scan rate = 0.1 Vs$^{-1}$. Values are ±0.03 V.
[b]Obtained in CH$_2$Cl$_2$ containing 1.0 M Bu$_4$NPF$_6$. E-values vs. Ag/Ag$^+$; FeCp$_2$/FeCp$_2^+$ = 0.19 V; scan rate = 100 Vs$^{-1}$.
[c]E-values are listed as approximate because the oxidation waves for the two triple deckers in the dyad overlap.

SAMs

Representative fast-scan (100 V s$^{-1}$) voltammograms of the SAMs of Dyad1–5 are compared with the solution data in FIGS. 30–34. The oxidation potentials for the SAMs of all five dyads are summarized in Table 2. In general, the voltammograms of the SAMs of all five dyads are of excellent quality and are far superior to those obtained for the mixed monolayers of triple-decker monomers that we previously examined (Gryko et al. (2001) *Mater. Chem.*, 11: 1162). These results indicate that the strategy of covalently linking the triple deckers is key to obtaining a viable multistate counter. In addition, all three architectures appear to be robust. Closer inspection of the data for the dyad SAMs reveals a number of other features. These features are discussed in more detail below.

(1) The quality of the voltammograms for the dyad SAMs appears to be dependent on the composition of constituent triple deckers. In particular, the V1 dyads Dyad1 and Dyad2, both of which contain a meso-pentyl-substituted porphyrin in the upper triple decker, give superior voltammetry to Dyad3, which contains a meso-aryl-substituted porphyrin in this unit. This is evidenced by the fact that Dyad3 appears to exhibit a subset of oxidation waves that are shifted to lower potential than the principal peaks (see FIG. 32, bottom panel). For example, additional waves are evident at ~0.93 V and ~0.02 V. These lower potential waves could correspond to a minority domain wherein the dyads are more poorly packed (hence the lower potential, vide infra) than the majority domain. The additional oxidation waves are absent in the SAMs of the horizontal Dyad4 and Dyad5 (although there is a hint of another wave at ~0.82 V for the former dyad). Thus, it is possible that certain dyads are better suited for a horizontal architecture than a vertical one (and vice versa). Additional studies on dyads of like composition in horizontal vs. vertical architectures will be required to fully elucidate this issue.

(2) For each of Dyad1–5, the oxidation potential for a particular wave in the SAM is generally more positive than the corresponding wave in solution by 0.05–0.20 V. This behavior is consistent with our previous studies of porphyrin SAMs (Gryko et al. (2000) *J. Org. Chem.*, 65: 7345; Clausen et al. (2000) *J. Org. Chem.*, 65: 7363; Clausen et al. (2000) *J. Org. Chem.*, 65: 7371; Gryko et al. (2000) *J. Org. Chem.*, 65: 7356; Li et al. (2000) *Org. Chem.*, 65: 7379; Gryko et al. (2001) *Mater. Chem.*, 11: 1162). However, Dyad5 does not follow this trend. For this dyad, the oxidation potentials of the SAM are generally lower than those observed for the solution. We have no clear explanation for this phenomenon. The positive shift in redox potentials observed upon SAM formation has generally been attributed to poorer access of counterions to the redox center due to packing of the molecules on the surface (Creager and Rowe (1994) *J. Electroanal. Chem.*, 370: 203). If so, the absence of a positive potential-shift would suggest relatively poor packing. In this regard, the area/molecule occupied by Dyad5 is much larger than that of any of the other dyads (vide infra). This could be due to the fact that Dyad5 is in an H2 architecture, which renders the molecule more rigid and perhaps compromises packing on the surface.

(3) For each of the V1 dyads Dyad1–3, the potentials of the lower vs. upper triple deckers do not appear to be differentially shifted upon SAM formation. This is evident from the fact that the splittings between the pairs of E-values that correspond to oxidation of each triple decker in the dyad are qualitatively similar in the solution and the SAMs. For example, in the case of Dyad2, the splitting between $E_{0/+1}$ and $E_{+1/+2}$ is 0.22 V in solution and 0.18 V in the SAM; the splitting between $E_{+2/+3}$ and $E_{+3/+4}$ is ~0.17 V in solution and 0.15 V in the SAM (see Table 2). Likewise for Dyad1, the waves for $E_{0/+1}$ and $E_{+1/+2}$ are overlapped in both the solution and the SAM. This behavior shows that for the design of an optimum multistate counter, it is not necessary to consider differential surface effects (at least for the redox potential) on the upper and lower members of vertical dyads.

(4) The surface area measurements indicate that dyads in the vertical architecture generally occupy less surface area than those in the horizontal architectures. In particular, the average area for the three V1 structures (Dyad1–3) is ~760 $\text{Å}^2$/molecule, whereas the areas for the H1 (Dyad4) and H2 (Dyad5) structures are ~1640 $\text{Å}^2$/molecule and 2700 $\text{Å}^2$/molecule, respectively. All of these areas are relatively large compared with those that might be expected for a closest-packed structure. Based on the molecular dimensions, closest packing of the V1 dyads would yield areas of ~300 $\text{Å}^2$/molecule; closest packing of the H1 or H2 dyads would yield areas of ~700 $\text{Å}^2$/molecule (assuming (1) no torsional rotation for the V1 and H1 structures about the —C≡C— bond of the linker and (2) a perpendicular orientation of the macrocycle planes with respect to the surface). The larger areas for the V1 and H1 architectures could be due to torsional rotation. The very large area for the H2 structure could result from the added rigidity of the molecule upon binding to the surface (as noted above); the presence of syn versus anti isomers of this dyad could also contribute. Regardless, the fact that the vertical architecture generally results in more dense packing of the dyads is an important design consideration for a viable multistate counter. On nanoplatforms, more dense packing would afford more facile detection of electrical signals from the molecules in the SAM.

Conclusions

We have described the design of covalently linked dyads of lanthanide porphyrinic triple-decker complexes with interleaving cationic oxidation potentials that could be used in a molecular multistate counter. Five dyads were prepared by Pd-catalyzed coupling (Sonogashira reaction) of appropriately functionalized triple-decker building blocks (type a or type c). The porphyrins in the triple deckers and the triple deckers themselves were prepared by rational synthetic methods. Three of the five dyads were constituted for a vertical architecture (V1), bearing one S-acetylthiomethyl group for attachment to an electroactive gold surface, whereas the other two dyads were designed for a horizontal arrangement with one (H1) or two (H2) S-acetylthiomethyl linkers.

The electrochemical characteristics of the five thiol-derivatized dyads were investigated both in solution and in SAMs. The dyad SAMs generally yield robust, reversible voltammograms with features comparable to those observed in solution (albeit with some shifts in potential). This behavior can be contrasted with that observed for mixtures of non-covalently linked triple-decker complexes. These complexes exhibit poorly resolved redox waves indicative of a highly heterogeneous, poorly packed SAM. The covalent linkage essentially overcomes this problem. The high quality voltammetric characteristics of the dyad SAMs indicate that these constructs are excellent candidates for multistate counters that could be used for storage of information at the molecular level.

Experimental Section

General $^1$H NMR spectra were collected in CDCl$_3$ (300 MHz) unless noted otherwise. Absorption spectra (HP 8451A, Cary 3) were collected in toluene. Porphyrins and triple-decker sandwich complexes were analyzed by LD-MS (Bruker Proflex II) and FAB-MS (JEOL HX 110HF), either in high (HR) or low resolution (LR). High-resolution mass spectrometry was carried out at greater than unit resolution. LD-MS analysis was done without a matrix or with the matrix POPOP (Fenyo et al. (1997) *J. Porphyrins Phthalocyanines*, 1: 93; Srinivasan et al. (1999) *J. Porphyrins Phthalocyanines*, 3: 283).

All operations involving organometallic compounds and Pd-catalyzed couplings were carried out under an inert atmosphere of argon using standard Schlenk techniques. Eu(acac)$_3$·nH$_2$O was obtained from Alfa Aesar. Unless otherwise indicated, all other reagents were obtained from Aldrich Chemical Company, and all solvents were obtained from Fisher Scientific.

Non-commercial Compounds

The following compounds were prepared as described in the literature: dipyrromethanes 1 (Littler et al. (1999) *J. Org. Chem.*, 64: 1391), 2 (Rao et al. (2000) *J. Org. Chem.*, 65: 7323), and 3 (Littler et al. (1999) *J. Org. Chem.*, 64: 1391); S-2-pyridyl-4-methylbenzothioate (4) (Rao et al. (2000) *J. Org. Chem.*, 65: 1084); acid chlorides 6 and 7 (Rao et al. (2000) *J. Org. Chem.*, 65: 7323); diacyldipyrromethane 10 (Gryko and Lindsey (2000) *J. Org. Chem.*, 65: 2249); porphyrins 14 (Rao et al. (2000) *J. Org. Chem.*, 65: 7323) and 15 (Li et al. (2000) *Org. Chem.*, 65: 7379); double-decker complexes (Each europium double decker is assumed to be a radical species) (TTP)Eu(t-Bu$_4$Pc) and (t-Bu$_4$Pc)$_2$Eu (Gross et al. (2001) *Inorg. Chem.*, 40: 4762; Battisti et al. (1992) *Chem. Mater.*, 4: 1323) and thiol-protected linkers 16 and 17 (Gryko et al. (2000) *J. Org. Chem.*, 65: 7345). Triple deckers TD1 (Gryko et al. (2001) *Mater. Chem.*, 11: 1162), TD2 (Gross et al. (2001) *Inorg. Chem.*, 40: 4762), TD3 (Id.), TD4 (Gryko et al. (2001) *Mater. Chem.*, 11: 1162), TD5 (Gross et al. (2001) *Inorg. Chem.*, 40: 4762), and TD6 (Gryko et al (2001) *Mater. Chem.*, 11: 1162) have been prepared previously.

Chromatography

Adsorption column chromatography was performed using flash silica (Baker, 60–200 mesh). Preparative-scale SEC was performed using BioRad Bio-beads SX-1 in THF and eluted with gravity flow (Wagner et al. (1996) *J. Am. Chem. Soc.*, 118: 11166). Analytical-scale SEC was performed with a Hewlett-Packard 1090 HPLC using a 1000 Å column (5 μL, styrene-divinylbenzene copolymer) with THF as eluent (0.8 mL/min) (Id.). Preparative-scale TLC was performed on silica gel plates (Merck, 60 F$_{254}$S, layer thickness 0.5 mm).

1-(4-Methylbenzoyl)-5-(4-methylphenyl)dipyrromethane (5)

Following a standard procedure (Rao et al. (2000) *J. Org. Chem.*, 65: 1084), a solution of EtMgBr (43 mL, 43 mmol, 1.0 M in THF) was slowly added via syringe to a stirred solution of dipyrromethane 1 (4.06 g, 17.2 mmol) in THF (17 mL) under Ar. The mixture was stirred at room temperature for 10 min and then cooled to −78° C. S-2-pyridyl 4-methylbenzothioate (4) (3.94 g, 17.2 mmol) was then added, and the mixture was maintained at −78° C. for 30 min. The cooling bath was removed, and the mixture was maintained at room temperature for 30 min. The reaction was quenched with saturated aqueous NH$_4$Cl. The mixture was poured into ethyl acetate. The organic layer was washed with water, dried (Na$_2$SO$_4$), and concentrated, affording a dark foam. Purification by flash column chromatography [silica, neat CH$_2$Cl$_2$ to CH$_2$Cl$_2$/ethyl acetate (100:3)] afforded a golden amorphous solid (4.56 g, 75%): mp 77–81° C.; $^1$H NMR δ2.48 (s, 3H), 2.58 (s, 3H), 5.67 (s, 1H), 6.14 (m, 1H), 6.24 (m, 1H), 6.30 (m, 1H), 6.83 (m, 1H), 6.96 (m, 1H), 7.20–7.30 (m, 4H), 7.41 (d, J=7.8 Hz, 2H), 7.89 (d, J=7.8 Hz, 2H), 8.35 (brs, 1H), 9.88 (brs, 1H); $^{13}$C NMR δ18.7, 21.3, 21.8, 44.0, 107.8, 108.7, 110.5, 110.6, 117.8, 120.5, 128.4, 129.2, 129.3, 129.7, 130.8, 131.4, 135.9, 137.2, 137.9, 141.7, 142.5, 184.5; FAB-MS obsd (HR) 354.1754, calcd exact mass 354.1732 (C$_{24}$H$_{22}$N$_2$O); Anal. Calcd for C$_{24}$H$_{22}$N$_2$O: C, 81.33; H, 6.26; N, 7.90. Found: C, 80.69; H, 6.34; N, 7.73.

1-{4-[2-(triisopropylsilyl)ethynyl]benzoyl}-9-(4-methylbenzoyl)-5-(4-methylphenyl)-dipyrromethane (8)

Following a standard procedure (Rao et al. (2000) *J. Org. Chem.*, 65: 7323), to a stirred solution of monoacyl dipyrromethane 5 (1.45 g, 4.09 mmol) in dry toluene (16 mL) at room temperature was slowly added EtMgBr (8 mL, 8 mmol, 1.0 M in THF) under Ar, and the mixture was stirred for 5 min. To the resulting mixture was added 6 (1.31 g, 4.08 mmol). After 10 min, the same process was repeated once [8 mL, 8 mmol, 1.0 M in THF of EtMgBr, and 1.31 g, 4.08 mmol of 6]. After stirring for 10 min, the mixture was treated with additional EtMgBr (4 mL, 4 mmol, 1.0 M in THF) followed by 6 (0.64 g, 2.0 mmol). After stirring the contents for 20 min, saturated aqueous NH$_4$Cl (50 mL) and ethyl acetate (120 mL) were added. The organic layer was separated, dried (Na$_2$SO$_4$), and concentrated. Purification by column chromatography [silica, neat CH$_2$Cl$_2$, then CH$_2$Cl$_2$/ethyl acetate (98:2, then 98:3, then 90:10)] followed by slow precipitation from 2-propanol afforded a pink amorphous solid (1.69 g, 65%): mp 142–143° C.; $^1$H NMR δ1.13 (s, 21H), 2.38 (s, 3H), 2.40 (s, 3H), 5.61 (s, 1H), 5.95–5.99 (m, 2H), 6.51-6.56 (m, 2H), 7.20 (d, J=8.1 Hz, 4H), 7.41 (d, J=7.8 Hz, 2H), 7.49 (d, J=8.1 Hz, 2H), 7.68 (d, J=8.4 Hz, 2H), 7.71 (d, J=8.4 Hz, 2H), 11.28 (s, 1H), 11.32 (s, 1H); $^{13}$C NMR δ11.5, 18.9, 21.4, 21.8, 44.8, 93.9, 106.6, 111.3, 111.6, 120.7, 121.1, 127.0, 128.9, 129.6, 129.8, 129.9, 131.1, 131.3, 131.8, 135.7, 137.4, 137.8, 140.9, 141.8, 142.4, 183.6, 184.5; FAB-MS obsd (HR) 638.3262, calcd exact mass 638.3329 (C$_{42}$H$_{46}$N$_2$O$_2$Si); Anal. Calcd for C$_{42}$H$_{46}$N$_2$O$_2$Si: C, 78.95; H, 7.26; N, 4.38. Found: C, 78.74; H, 7.29; N, 4.26.

1-(4-Iobenzoyl)-9-(4-methylbenzoyl)-5-(4-methylphenyl) dipyrromethane (9)

Following the procedure described for 8 (Rao et al. (2000) *J. Org. Chem.*, 65: 7323), monoacyl dipyrromethane 5 (1.77 g, 4.99 mmol) in dry toluene (20 mL) was treated with EtMgBr (25 mL, 25 mmol, 1.0 M in THF) and 4-iodobenzoyl chloride (7) (3.33 g, 12.5 mmol) under Ar at room temperature. Purification by column chromatography [silica, CH$_2$Cl$_2$/ethyl acetate (98:2, then 98:3)] followed by slow precipitation from 2-propanol afforded a pink amorphous solid (1.98 g, 68%): mp 139–141° C.; $^1$H NMR δ2.38 (s, 3H), 2.40 (s, 3H), 5.61 (s, 1H), 5.95–6.00 (m, 2H), 6.52–6.60 (m, 2H), 7.20 (d, J=8.1 Hz, 4H), 7.39 (d, J=8.1 Hz, 2H), 7.48 (d, J=8.4 Hz, 2H), 7.68 (d, J=8.1 Hz, 2H), 7.76 (d, J=8.4 Hz, 2H), 11.22 (s, 1H), 11.25 (s, 1H); $^{13}$C NMR δ14.3, 21.4, 21.8, 22.7, 31.8, 44.9, 99.2, 111.3, 111.6, 120.7, 121.1, 128.2, 128.88, 128.91, 129.8, 130.0, 130.8, 131.26, 131.30, 135.7, 137.36, 137.42, 137.44, 137.8, 141.0, 142.1, 142.4, 183.5, 184.5; FAB-MS obsd (HR) 584.0944, calcd exact mass 584.0961 (C$_{31}$H$_{25}$IN$_2$O$_2$); Anal. Calcd for C$_{31}$H$_{25}$IN$_2$O$_2$; C, 63.71; H, 4.31; N, 4.79. Found: C, 65.24; H, 4.57; N, 4.68.

5-{4-[2-(Triisopropylsilyl)ethynyl]phenyl}-15,20-bis(4-methylphenyl)-10-{4-[2-(trimethylsilyl)ethynyl]phenyl}porphyrin (11)

Following a standard procedure (Rao et al. (2000) *J. Org. Chem.*, 65: 7323), a solution of 8 (420 mg, 0.65 mmol) in a mixture of dry THF/methanol (10:1, 29 mL) under a stream of Ar at room temperature was treated with NaBH$_4$ (497 mg, 13.1 mmol, 20 mol equiv) in small portions (~0.1 g every 2 min) with rapid stirring. The progress of the reaction was monitored by TLC [alumina, CH$_2$Cl$_2$/ethyl acetate (3:2) and silica, CH$_2$Cl$_2$/ethyl acetate (5:1)]. After the reaction was complete (about 45 min), the reaction mixture was poured into a stirred mixture of saturated aqueous NH$_4$Cl (40 mL) and CH$_2$Cl$_2$ (80 mL). The organic phase was washed with water, dried (Na$_2$SO$_4$), and placed in a 500-mL round-bottomed flask. Removal of the solvent under reduced pressure yielded the dicarbinol as a solid (~0.65 mmol). A sample of dipyrromethane 2 (208 mg, 0.65 mmol) was added followed by acetonitrile (265 mL). TFA (613 μL, 7.96 mmol) was then added, and the reaction was monitored by UV/Vis spectroscopy. After 3 min, DDQ (438 mg, 1.93 mmol) was added, and the mixture was stirred at room temperature for 1 h. Then triethylamine (1.11 mL, 7.96 mmol) was added, and the entire reaction mixture was filtered through a pad of alumina (eluted with $CH_2Cl_2$) until the eluent was no longer dark. After removal of the solvent, column chromatography [silica, $CH_2Cl_2$/hexanes (1:1)] afforded a purple solid (121 mg, 20%): $^1H$ NMR δ−2.80 (s, 2H), 0.38 (s, 9H); 1.26 (s, 21H), 2.71 (s, 6H), 7.56 (d, J=7.8 Hz, 4H), 7.85–7.89 (m, 4H), 8.09 (d, J=7.2 Hz, 4H), 8.15 (d, J=7.5 Hz, 4H), 8.78–8.88 (m, 8H); LD-MS obsd 921.3 [$M^+$], 878.0, 848.5, 837.9, 821.4, 807.4, 792.3; FAB-MS obsd (HR) 918.4527, calcd exact mass 918.4513 ($C_{62}H_{62}N_4Si_2$); $\lambda_{abs}$ 423, 517, 552, 594, 649 nm.

5-(4-Iodophenyl)-15,20-bis(4-methylphenyl)-10-{4-[2-(trimethylsilyl)ethynyl]phenyl}porphyrin (12)

Analogous to the preparation of 11 (Rao et al. (2000) *J. Org. Chem.*, 65: 7323), a sample of diacyldipyrromethane 9 (1.35 g, 2.31 mmol) was reduced with $NaBH_4$ (1.75 g, 46.3 mmol) in dry THF/methanol (10:1, 110 mL), affording the dicarbinol as a foam-like solid (~2.31 mmol). The resulting dicarbinol was reacted with dipyrromethane 2 (736 mg, 2.31 mmol). Column chromatography [silica, $CH_2Cl_2$/hexanes (1:1)] afforded a purple solid (420 mg, 21%): $^1H$ NMR δ−2.81 (s, 2H), 0.38 (s, 9H), 2.71 (s, 6H), 7.56 (d, J=7.8 Hz, 4H), 7.87 (d, J=8.1 Hz, 2H), 7.94 (d, J=8.1 Hz, 2H), 8.09 (d, J=6.9 Hz, 6H), 8.16 (d, J=8.1 Hz, 2H), 8.79–8.89 (m, 8H); LD-MS obsd 864.1 [$M^+$], 782.1, 767.2, 739.1 [$M^+$-I]; FAB-MS obsd (HR) 864.2137, calcd exact mass 864.2145 ($C_{51}H_{14}IN_4Si$); $\lambda_{abs}$ 422, 516, 552, 593, 649 nm.

5-(4-Iodophenyl)-10,15,20-tris(4-methylphenyl)porphyrin (13)

Analogous to the preparation of 11 (Rao et al. (2000) *J. Org. Chem.*, 65: 7323), a sample of diacyldipyrromethane 10 (220 mg, 0.47 mmol) was reduced with $NaBH_4$ (351 mg, 9.31 mmol) in dry THF/methanol (10:1, 11 mL), affording the dicarbinol as an orange oil (~0.47 mmol). The resulting dicarbinol was reacted with dipyrromethane 3 (258 mg, 0.47 mmol). Column chromatography [silica, hexanes/$CH_2Cl_2$ (3:2)] afforded a purple solid (77 mg, 21%): $^1H$ NMR δ−2.80 (s, 2H), 2.71 (s, 9H), 7.56 (d, J=7.5 Hz, 6H), 7.95 (d, J=8.1 Hz, 2H), 8.09 (d, J=8.1 Hz, 8H), 8.80–8.97 (m, 8H); LD-MS obsd 782.8 [$M^+$], 656.5 [$M^+$-I]; FAB-MS obsd (HR) 783.2005, calcd exact mass 783.1985 ($C_{47}H_{35}IN_4$); $\lambda_{abs}$ 376, 421, 486, 516, 551, 593, 649 nm.

TD7

Following a standard procedure (Chabach et al. (1996) *Angew Chem. Int. Ed. Engl.*, 35: 898; Gross et al. (2001) *Inorg. Chem.*, 40: 4762), a mixture of $Eu(acac)_3·nH_2O$ (319 mg) and porphyrin 14 (87 mg, 0.10 mmol) in 1,2,4-trichlorobenzene (11 mL) was stirred at 220° C. under a slow stream of Ar for 8 h. After cooling to room temperature, a sample of $(t-Bu_4Pc)_2Eu$ (163 mg, 0.10 mmol) was added, and the mixture was refluxed under Ar for a further 14 h. After removal of the solvent, purification by column chromatography (silica, $CHCl_3$), then SEC (THF) and finally by a silica column ($CHCl_3$) afforded a dark-green solid (195 mg, 74%): $^1H$ NMR δ0.84 (s, 9H), 2.03 (s, 6H), 2.2–4.1 (m, 80H), 4.99–5.22 (m, 4H), 6.81 (m, 2H), 7.13 (m, 1H), 7.35 (m, 1H), 8.4–11.0 (m, 24H), 11.28 (m, 4H), 12.4–13.8 (m, 12H); LD-MS obsd 2640.3 [$M^+$], 2514.1 [$M^+$-I]; FAB-MS obsd (HR) 2640.84; calcd exact mass 2640.84 ($C_{147}H_{135}Eu_2IN_{20}Si$); $\lambda_{abs}$ 346, 418, 526, 622, 728 nm.

TD8

Following a standard procedure ((Chabach et al. (1996) *Angew Chem. Int. Ed. Engl.*, 35: 898; Gross et al. (2001) *Inorg. Chem.*, 40: 4762)), a mixture of $Eu(acac)_3·nH_2O$ (136 mg) and porphyrin 11 (42.0 mg, 45.7 μmol) in 1,2,4-trichlorobenzene (5 mL) was stirred at 220° C. under a slow stream of Ar for 6 h to form the corresponding europium porphyrin half-sandwich complex. After cooling to room temperature, a sample of $(t-Bu_4Pc)_2Eu$ (74.8 mg, 46.0 μmol) was added, and the mixture was again refluxed under Ar for a further 5 h. After removal of the solvent, purification by column chromatography [silica, $CH_2Cl_2$] afforded a dark-green solid, which was further purified by SEC (THF) and finally a silica column ($CH_2Cl_2$) (97 mg, 79%): $^1H$ NMR δ0.84 (s, 9H), 1.38 (s, 3H), 1.77 (s, 21H), 1.98 (s, 3H), 2.5–3.6 (m, 80 H), 5.12–5.36 (m, 4H), 6.81 (m, 2H), 7.22 (m, 2H), 8.6–11.0 (m, 16H), 11.26 (m, 4H), 12.6–13.6 (m, 12H); LD-MS obsd 2693.2 [$M^+$], 2678.5, 2663.9; FAB-MS obsd (LR) 2695.26, calcd exact mass 2695.08 ($C_{158}H_{156}Eu_2N_{20}Si_2$); $\lambda_{abs}$ 347, 419, 527, 621, 729 nm.

TD8'

A sample of TD8 (54.5 mg, 20.2 μmol) in a mixture of $CHCl_3$/THF/methanol (1:5:2, 8 mL) was treated with powdered $K_2CO_3$ (71.8 mg, 0.52 mmol) and stirred under Ar at room temperature for 5 h. The progress of the reaction was monitored by LD-MS. Then the reaction mixture was filtered. The filtrate was washed with 10% aqueous $NaHCO_3$ (100 mL) and water (150 mL). The organic layer was dried ($Na_2SO_4$), concentrated and chromatographed (silica, $CH_2Cl_2$), affording a dark-green solid (47.8 mg, 90%): $^1H$ NMR δ1.36 (s, 3H), 1.75 (s, 21H), 1.90 (s, 3H), 2.5–3.6 (m, 80H), 3.86 (brs, 1H), 5.10–5.28 (m, 4H), 6.79 (brs, 2H), 7.16 (brs, 2H), 8.6–11.0 (m, 16H), 11.23 (m, 4H), 12.4–13.6 (m, 12H); LD-MS obsd 2627.7 [$M^+$], 2613.1, 2518.7, 2461.2; FAB-MS obsd (LR) 2623.20, calcd exact mass 2623.04 ($C_{155}H_{148}Eu_2N_{20}Si$); $\lambda_{abs}$ 347, 418, 527, 621, 729 nm.

TD9

Following a standard procedure (Chabach et al. (1996) *Angew Chem. Int. Ed. Engl.*, 35: 898; Gross et al. (2001) *Inorg. Chem.*, 40: 4762), a mixture of $Eu(acac)_3·nH_2O$ (117 mg) and porphyrin 13 (28.7 mg, 36.7 μmol) in 1,2,4-trichlorobenzene (4 mL) was stirred at 220° C. under a slow stream of Ar for 6 h. After cooling to room temperature, a sample of $(t-Bu_4Pc)_2Eu$ (60.1 mg, 36.7 μmol) was added, and the mixture was again refluxed under Ar for a further 5 h. After removal of the solvent, purification by column chromatography [silica, $CHCl_3$ (containing 0, 1 and 5% ethyl acetate, respectively)] afforded a dark-green solid, which was further purified by SEC (THF) and finally a silica column ($CHCl_3$) (58 mg, 62%): $^1H$ NMR δ1.35 (s, 3H), 1.94 (s, 6H), 2.5–3.6 (m, 80H), 5.00–5.17 (m, 4H), 6.80 (brs, 3H), 7.34 (m, 1H), 8.6–9.3 (m, 4H), 9.40 (br s, 3H), 9.7–11.0 (m, 9H), 11.25 (m, 4H), 12.6–13.5 (m, 12H); LD-MS obsd 2556.1 [$M^+$], 2429.5 [$M^+$-I]; FAB-MS obsd (HR) 2558.75, calcd exact mass 2558.82 ($C_{143}H_{129}Eu_2IN_{20}$); $\lambda_{abs}$ 346, 417, 526, 620, 727 nm.

TD10

Following a standard procedure (Chabach et al. (1996) *Angew Chem. Int. Ed. Engl.*, 35: 898; Gross et al. (2001) *Inorg. Chem.*, 40: 4762), a mixture of $Eu(acac)_3·nH_2O$ (221 mg) and porphyrin 15 (50.0 mg, 69.2 μmol) in 1,2,4-trichlorobenzene (7.6 mL) was stirred at 220° C. under a slow stream of Ar for 5 h. After cooling to room temperature, a sample of $(t-Bu_4Pc)_2Eu$ (113 mg, 69.2 μmol) was added, and the mixture was refluxed under Ar for a further 14 h. After removal of the solvent, the residue was chromatographed (silica, $CHCl_3$). Further purification by SEC (THF), a silica column ($CHCl_3$), and finally again by SEC (THF) afforded 43 mg (25%) of a dark-green solid. A $^1H$ NMR spectrum was recorded, but the complexity due to the mixture of regioisomers prevented a complete interpretation.

LD-MS obsd 2496.7 [M$^+$], 2482.0, 2439.9, 2371.0 [M$^+$-I]; FAB-MS obsd (LR) 2498.71, calcd exact mass 2498.91 ($C_{137}H_{141}Eu_2IN_{20}$); $\lambda_{abs}$ 345, 416, 530, 581, 627, 733 nm.

TD11

The following is a refined version of the standard procedure (Gross et al. (2001) *Inorg. Chem.*, 40: 4762) designed to minimize exposure of the reaction mixture to moisture and air. A Schlenk flask was equipped with a reflux condenser and all essential inlets and outlets at the beginning of the procedure. A solution of CeI[N(SiMe$_3$)$_2$]$_2$ was prepared in situ by reaction of CeI$_3$ (75.0 mg, 0.144 mmol) and LiN(SiMe$_3$)$_2$ (288 μL, 0.288 mmol, 1.0 M in THF) in bis(2-methoxyethyl) ether (1.5 mL). This flask was not opened. A deaerated solution of porphyrin 12 (25.0 mg, 28.9 μmol) in bis(2-methoxyethyl) ether (1 mL) was added by syringe. The mixture was refluxed for 1 h, affording the metalated porphyrin as determined by UV/Vis. Then the double-decker complex (TTP)Eu(t-Bu$_4$Pc) (45.2 mg, 28.9 μmol) was added. The mixture was refluxed for 6 h. After cooling to room temperature, chromatography [silica, toluene/hexanes (1:1), then CH$_2$Cl$_2$] gave three bands (green). The first and second band were combined and concentrated, affording a solid, which was further purified by SEC (THF), affording a brownish-green solid (40 mg, 54%): A $^1$H NMR spectrum was recorded, but the complexity due to the mixture of regioisomers prevented a complete interpretation. LD-MS obsd 2557.5 [M$^+$], 2542.9, 2459.8, 2431.7 [M$^+$-I]; FAB-MS obsd (LR) 2559.86, calcd exact mass 2559.72 ($C_{147}H_{123}CeEuIN_{16}Si$); $\lambda_{abs}$363, 421, 425, 492, 560, 609 nm.

AcS-TD3

A 25 mL Schlenk flask containing samples of TD3 (26.1 mg, 10.2 μmol), 1-[4-(S-acetylthiomethyl)phenyl]acetylene (16) (39.2 mg, 205 μmol), Pd(PPh$_3$)$_2$Cl$_2$ (2.4 mg, 3.4 μmol), and CuI (0.3 mg, 1.6 μmol) was evacuated and purged with Ar three times. Then deaerated THF (2.5 mL) and deaerated DIEA (0.4 mL) were added, and the reaction mixture was stirred under Ar at 35° C. for 7 h. After removal of the solvent, the residue was redissolved in toluene and chromatographed on silica (toluene). Further purification by SEC (THF) and finally a silica column (toluene) afforded an olive-green solid (17 mg, 64%). A $^1$H NMR spectrum was recorded, but the complexity due to the mixture of regioisomers prevented a complete interpretation. LD-MS obsd 2631.5 [M$^+$], 2553.0 [M$^+$-SAc]; FAB-MS obsd (HR) 2621.82, calcd exact mass 2621.85 ($C_{158}H_{132}CeEuN_{16}OSSi$); $\lambda_{abs}$363, 421, 427, 492, 560, 609 nm.

AcS-TD7

A 50 mL Schlenk flask containing samples of TD7 (174 mg, 65.9 μmol), 16 (126 mg, 659 μmol), Pd(PPh$_3$)$_2$Cl$_2$ (14.1 mg, 19.8 μmol), and CuI (1.9 mg, 9.9 μmol) was evacuated and purged with Ar three times. THF (25 mL) and DIEA (3.4 mL) were added, and the reaction mixture was stirred under Ar at 35° C. for 6 h. The progress of the reaction was monitored by LD-MS. After removal of the solvent, the residue was purified by column chromatography [silica, CHCl$_3$ (containing 0, then 2, then 5% ethyl acetate)] to afford a dark-green solid, which was further purified by SEC (toluene) and finally preparative TLC [silica, toluene/diethyl ether (20:1)] (105 mg, 59%): $^1$H NMR δ0.80 (s, 9H), 1.84 (s, 6H), 2.0–3.6 (m, 80H), 2.62 (s, 3H), 4.45 (s, 2H), 5.08–5.21 (m, 4H), 6.78 (brs, 2H), 7.05–7.16 (m, 2H), 7.71 (d, J=8.1 Hz, 2H), 8.08 (d, J=7.5 Hz, 2H), 8.5–11.0 (m, 16H), 11.22 (m, 4H), 12.5–13.7 (m, 12H); LD-MS obsd 2707.0 [M$^+$], 2635.4 [M$^+$-SAc]; FAB-MS obsd (LR) 2702.98, calcd exact mass 2702.97 ($C_{158}H_{144}Eu_2N_{20}OSSi$); $\lambda_{abs}$346, 419, 527, 621, 728 nm.

AcS-TD11

A 25 mL Schlenk flask containing samples of TD11 (15.0 mg, 5.86 μmol), 16 (38.1 mg, 200 μmol), Pd(PPh$_3$)$_2$Cl$_2$ (1.4 mg, 2.0 μmol), and CuI (0.2 mg, 1.1 μmol) was evacuated and purged with Ar three times. Then deaerated THF (1.5 mL) and deaerated TEA (0.3 mL) were added, and the reaction mixture was stirred under Ar at 35° C. for 2 h. After removal of the solvent, the residue was redissolved in CH$_2$Cl$_2$/hexanes (1:2) and chromatographed on silica [CH$_2$Cl$_2$/hexanes (1:2)], affording an olive-green solid (8.8 mg, 57%). A $^1$H NMR spectrum was recorded, but the complexity due to the mixture of regioisomers prevented a complete interpretation. LD-MS obsd 2622.4 [M$^+$], 2546.0 [M$^+$-SAc]; FAB-MS obsd (HR) 2621.82, calcd exact mass 2621.85 ($C_{158}H_{132}CeEuN_{16}OSSi$); $\lambda_{abs}$363, 421, 426, 492, 560, 609, 676 nm.

AcS-TD3'

To a stirred solution of AcS-TD3 (17 mg, 6.5 μmol) in dry THF (2 mL) at 0° C. was added (n-Bu)$_4$NF (7.1 μL, 1.0 M in THF). After stirring for 5 min at 0° C., the reaction was quenched by addition of water (1 mL). The mixture was extracted with CH$_2$Cl$_2$. The organic layer was washed with water, dried (Na$_2$SO$_4$), concentrated, and purified by preparative TLC (silica, toluene), affording an olive-green solid (16 mg, 97%). A $^1$H NMR spectrum was recorded, but the complexity due to the mixture of regioisomers prevented a complete interpretation. LD-MS obsd 2548.9 [M$^+$], 2473.6 [M$^+$-SAc]; FAB-MS obsd (HR) 2549.82, calcd exact mass 2549.81 ($C_{155}H_{124}CeEuN_{16}OS$); $\lambda_{abs}$ 363, 421, 427, 492, 560, 609 nm.

AcS-TD7'

To a stirred solution of AcS-TD7 (90 mg, 33.3 μmol) in THF (5 mL) at 0° C. was added (n-Bu)$_4$NF (37 μL, 1.0 M in THF). After stirring for 5 min, the reaction was quenched by addition of water (3 mL), and the solution was extracted with CHCl$_3$, washed with water, and dried (Na$_2$SO$_4$). After removal of the solvent, purification by preparative TLC [silica, toluene/diethyl ether (30:1)] afforded a dark-green solid (78 mg, 89%): $^1$H NMR δ1.88 (s, 6H), 2.0–3.6 (m, 80H), 2.63 (s, 3H), 3.85 (s, 1H), 4.46 (s, 2H), 5.09–5.21 (m, 4H), 6.79 (brs, 2H), 7.16 (brs, 2H), 7.71 (d, J=7.2 Hz, 2H), 8.09 (d, J=7.5 Hz, 2H), 8.5–11.0 (m, 16H), 11.25 (m, 4H), 12.5–13.7 (m, 12H); LD-MS obsd 2630.8 [M$^+$], 2555.2 [M$^+$-SAc], 1618.1 [(t-Bu$_4$Pc)$_2$Eu$^+$]; FAB-MS obsd (LR) 2631.21, calcd exact mass 2630.94 ($C_{155}H_{136}Eu_2N_{20}OS$); $\lambda_{abs}$ 346, 419, 526, 620, 728 nm.

AcS-TD11'

To a stirred solution of AcS-TD11 (8.0 mg, 3.0 μmol) in dry THF (1 mL) at 0° C. was added (n-Bu)$_4$NF (3.5 μL, 1.0 M in THF). After stirring for 6 min at 0° C., the reaction was quenched by addition of water (1 mL). The mixture was extracted with CH$_2$Cl$_2$. The organic layer was washed with water, dried (Na$_2$SO$_4$), concentrated, and purified by preparative TLC (silica, toluene), affording an olive-green solid (5.1 mg, 66%). A $^1$H NMR spectrum was recorded, but the complexity due to the mixture of regioisomers prevented a complete interpretation. LD-MS obsd 2549.5 [M$^+$], 2475.1 [M$^+$-SAc]; FAB-MS obsd (HR) 2549.77, calcd exact mass 2549.81 ($C_{155}H_{124}CeEuN_{16}OS$); $\lambda_{abs}$ 363, 421, 492, 560, 609, 676 nm.

Dyad1

A 25 mL Schlenk flask containing samples of TD10 (10.0 mg, 4.00 μmol), AcS-TD7' (10.5 mg, 4.12 μmol), Pd$_2$(dba)$_3$ (0.61 mg, 0.67 μmol), and P(o-tol)$_3$ (1.63 mg, 5.36 μmol) was evacuated and purged with Ar three times. Then deaerated toluene (3.5 mL) and deaerated DIEA (0.7 mL) were added, and the reaction mixture was stirred under Ar at 35°

C. The progress of the reaction was monitored by analytical SEC. Because the reaction had stopped, further catalyst [Pd$_2$(dba)$_3$, 0.61 mg (0.67 µmol); P(o-tol)$_3$, 1.22 mg (4.02 µmol)] was added after 22 h and again after 31 h. After a total reaction time of 48 h, the solvent was removed. The residue was redissolved in toluene/diethyl ether (100:1) and loaded onto a silica column packed with the same solvent. Three bands were collected (first band: blue; second band: green). The desired product was collected in a third band (green), employing toluene/diethyl ether (20:1) as the eluent. Further purification by SEC (THF) gave five bands, from which the third band (green) contained the product. Impurities collected from the SEC column were finally removed by a silica column [toluene/diethyl ether (100:1, then 50:1)], affording a dark-green solid (5.0 mg, 25%). A $^1$H NMR spectrum was recorded, but the complexity due to the mixture of regioisomers prevented a complete interpretation. LD-MS obsd (POPOP) 5001.2 [M$^+$], 4985.5, 4972.5, 4957.4, 4938.5, 4924.4 [M$^+$-SAc]; FAB-MS obsd (LR) 5002.01, calcd exact mass 5001.93 (C$_{292}$H$_{276}$Eu4N$_{40}$OS); $\lambda_{abs}$ 350, 421, 427, 493, 530, 625 nm.

Dyad2

A 25 mL Schlenk flask containing samples of TD10 (10.0 mg, 3.91 µmol), AcS-TD3' (10.2 mg, 4.00 µmol), Pd$_2$(dba)$_3$ (0.55 mg, 0.60 µmol), and P(o-tol)$_3$ (1.34 mg, 4.40 µmol) was evacuated and purged with Ar three times. Then deaerated toluene (3.5 mL) and deaerated DIEA (0.7 mL) were added, and the reaction mixture was stirred under Ar at 35° C. The progress of the reaction was monitored by analytical SEC. Because the reaction had stopped, further catalyst [Pd$_2$(dba)$_3$ 0.55 mg (0.60 µmol) and P(o-tol)$_3$ 1.01 mg (3.32 µmol)] was added after 7 h and again after 18 h. After a total reaction time of 24 h, the solvent was removed. The residue was redissolved in toluene/diethyl ether (100:1) and loaded onto a silica column packed with the same solvent. The desired product was collected in the second band (green), employing toluene/diethyl ether (50:1) as the eluent. Further purification by SEC (THF) gave three bands, from which the second band (green) contained the product. Impurities collected from the SEC column were finally removed by a silica column [toluene/diethyl ether (50:1)], affording a dark-green solid (5.0 mg, 25%). A $^1$H NMR spectrum was recorded, but the complexity due to the mixture of regioisomers prevented a complete interpretation. LD-MS obsd (POPOP) 4922.1 [M$^+$], 4876.2, 4848.2 [M$^+$-SAc]; FAB-MS obsd (LR) 4921.77, calcd exact mass 4920.81 (C$_{292}$H$_{264}$CeEu$_3$N$_{36}$OS); $\lambda_{abs}$ 352, 420, 493, 523, 616, 676, 726 nm.

Dyad3

A 25 mL Schlenk flask containing samples of TD9 (6.0 mg, 2.4 µmol), AcS-TD3' (6.0 mg, 2.4 µmol), Pd$_2$(dba)$_3$ (0.34 mg, 0.37 µmol), and P(o-tol)$_3$ (0.84, 2.79 µmol) was evacuated and purged with Ar three times. Then deaerated toluene (2 mL) and deaerated DIEA (0.4 mL) were added, and the reaction mixture was stirred under Ar at 35° C. The progress of the reaction was monitored by analytical SEC. Because the reaction had stopped after 20 h, the same amount of catalyst was added again, and the mixture was stirred for a further 4 h. After removal of the solvent, the residue was redissolved in toluene and loaded onto a silica column packed with the same solvent. Elution with toluene gave two bands (first band: blue; second band: olive-green, containing starting triple decker). The desired product was collected in a third band, employing toluene/ethyl acetate (20:1) as the eluent. Further purification by SEC (THF) gave four bands. The first two bands (green) contained higher molecular weight material. The third band (green) contained the product and a fourth band contained triple-decker starting material. Impurities collected from the SEC column were finally removed by a silica column [toluene, then toluene/diethyl ether (50:1)], affording a green solid (6.0 mg, 51%). A $^1$H NMR spectrum was recorded, but the complexity due to the mixture of regioisomers prevented a complete interpretation. LD-MS obsd (POPOP) 4979.4 [M$^+$], 4965.1, 4902.4 [M$^+$-SAc]; FAB-MS obsd (LR) 4982.13, calcd exact mass 4980.72 (C$_{298}$H$_{252}$CeEu$_3$N$_{36}$OS); $\lambda_{abs}$ 346, 420, 528, 625, 730 nm.

Dyad4

A 25 mL Schlenk flask containing samples of TD9 (5.0 mg, 2.0 µmol), AcS-TD11' (4.0 mg, 1.6 µmol), Pd$_2$(dba)$_3$ (0.42 mg, 0.46 µmol), and P(o-tol)$_3$ (1.17 mg, 3.84 µmol) was evacuated and purged with Ar three times. Then deaerated toluene (1.0 mL) and deaerated TEA (250 µL) were added, and the reaction mixture was stirred at 35° C. The progress of the reaction was monitored by analytical SEC and by LD-MS. Further batches of Pd$_2$(dba)$_3$ (0.42 mg, 0.46 µmol) and P(o-tol)$_3$ (1.17 mg, 3.84 µmol) were added after 2 h and again after 6 h. After a total reaction time of 8 h 30 min, the solvent was removed. The residue was dissolved in CH$_2$Cl$_2$ and loaded onto a silica column packed with the same solvent. Elution with CH$_2$Cl$_2$ gave two bands. The desired product was collected in the second band. Further purification by SEC (THF) and finally a silica column (CH$_2$Cl$_2$) afforded the desired product (3.0 mg, 38%). A $^1$H NMR spectrum was recorded, but the complexity due to the mixture of regioisomers prevented a complete interpretation. LD-MS obsd (POPOP) 4975.8 [M$^+$], 4085.8 [M$^+$-(t-Bu$_4$Pc)Eu]; FAB-MS obsd 4981.76 (LR), calcd exact mass 4980.72 (C$_{298}$H$_{252}$CeEu$_3$N$_{36}$OS); $\lambda_{abs}$ 352, 420, 427, 493, 523, 615, 727 nm.

TMS/TIPS-Dyad5

A 25 mL Schlenk flask containing samples of TD11 (12.1 mg, 4.73 µmol), TD8' (12.2 mg, 4.65 µmol), Pd$_2$(dba)$_3$ (1.0 mg, 1.1 µmol), and P(o-tol)$_3$ (2.8 mg, 9.2 µmol) was evacuated and purged with Ar three times. Then deaerated toluene (2.5 mL) and deaerated TEA (0.6 mL) were added, and the reaction mixture was stirred at 35° C. The progress of the reaction was monitored by analytical SEC and by LD-MS. Further batches of Pd$_2$(dba)$_3$ (1.0 mg, 1.1 µmol) and P(o-tol)$_3$ (2.8 mg, 9.2 µmol) were added after 2 h and again after 3 h 40 min. After a total reaction time of 5 h 30 min, the solvent was removed. The residue was dissolved in toluene and loaded onto a silica column packed with the same solvent. Elution with toluene gave two bands. The desired product was collected in the second band. Further purification by SEC (THF) gave the desired product (14 mg, 59%). A $^1$H NMR spectrum was recorded, but the complexity due to the mixture of regioisomers prevented a complete interpretation. LD-MS obsd (POPOP) 5050.5 [M$^+$], 4165.3 [M$^+$-(t-Bu$_4$Pc)Eu]; calcd exact mass 5054.85 (C$_{302}$H$_{270}$CeEu$_3$N$_{36}$Si$_2$); $\lambda_{abs}$ 353, 421, 492, 616, 729 nm.

Dyad5'

To a solution of TMS/TIPS-Dyad5 (12.0 mg, 2.37 µmol) in THF (1 mL) at room temperature was added (n-Bu)$_4$NF (5.7 µL, 1.0 M in THF). After stirring for 1 h, the reaction was quenched by addition of water, and the mixture was extracted with CH$_2$Cl$_2$, washed with water, and dried (Na$_2$SO$_4$). After removal of the solvent, purification by column chromatography (silica, toluene) afforded a dark-green solid (11 mg, 96%). A $^1$H NMR spectrum was recorded, but the complexity due to the mixture of regioisomers prevented a complete interpretation. LD-MS obsd (POPOP) 4825.8 [M$^+$], calcd exact mass 4826.67 (C$_{290}$H$_{242}$CeEu$_3$N$_{36}$); $\lambda_{abs}$ 353, 421, 493, 616, 729 nm.

Dyad5

A 25 mL Schlenk flask containing samples of Dyad5' (11.0 mg, 2.28 $\mu$mol), 1-(S-acetylthiomethyl)-4-iodobenzene (17) (13.3 mg, 45.5 $\mu$mol), Pd$_2$(dba)$_3$ (1.0 Mg, 1.1 $\mu$mol), and P(o-tol)$_3$ (2.8 mg, 9.2 $\mu$mol) was evacuated and purged with Ar three times. Then deaerated toluene (3 mL) and deaerated TEA (0.6 mL) were added, and the reaction mixture was stirred at 35° C. The progress of the reaction was monitored by analytical SEC and by LD-MS. Further batches of Pd$_2$(dba)$_3$ (1.0 mg, 1.1 $\mu$mol) and P(o-tol)$_3$ (2.8 mg, 9.2 $\mu$mol) were added after 1 h 30 min and again after 4 h. After a total reaction time of 6 h, the solvent was removed. Purification by preparative TLC [silica, toluene/diethyl ether, (40:1)] afforded the desired product (5.0 mg, 42%). A $^1$H NMR spectrum was recorded, but the complexity due to the mixture of regioisomers prevented a complete interpretation. LD-MS obsd (POPOP) 5155.7 [M$^+$], 5080.8 [M$^+$-SAc], 4980.6, 4267.7 [M$^+$-(t-Bu$_4$Pc)Eu]; calcd exact mass 5154.73 (C$_{308}$H$_{258}$CeEu$_3$N$_{36}$O$_2$S$_2$); $\lambda_{abs}$ 348, 421, 493, 525, 617, 729 nm.

Electrochemical Studies

The solution electrochemical studies were performed using techniques and instrumentation previously described (Seth et al. (1996) *J. Am. Chem. Soc.*, 118: 11194). For all triple deckers and dyads, the solvent was dried distilled CH$_2$Cl$_2$ and 0.1 M Bu$_4$NPF$_6$ (Aldrich, recrystallized three times from methanol and dried under vacuum at 110° C.) served as supporting electrolyte. The potentials were measured vs Ag/Ag$^+$; E$_{1/2}$(FeCp$_2$/FeCp$_2$$^+$)=0.19 V. The scan rate was 0.1 Vs$^{-1}$. All CH$_2$Cl$_2$ used in the following procedure also was dried and distilled.

Cyclic voltammograms of the SAMs were recorded with an Ensman Instruments 400 potentiostat. These electrochemical studies utilized a 75 $\mu$m Au microband working electrode that was formed on a borosilicate glass microscope slide (Fisher, Fair Lawn, N.J.) by vapor deposition of 99.99% gold (1 Oz. Canadian Maple Leaf, obtained locally) in a CHA SE-600 4-pocket E-beam evaporator (CHA Industries, Menlo Park, Calif.). The microscope slides are first cleaned by boiling in piranha solution (30% H$_2$O$_{2-10}$% solution, 70% H$_2$SO$_4$) for 20 min, rinsed with deionized water and dried in a vacuum oven at 100° C. A shadow mask is used to allow deposition of 2000 Å of Au (utilizing a 100 Å Cr underlayer to promote adhesion) to form the electrode (four Au microbands per slide, each 75 $\mu$m wide) with a contact pad at the edge of the glass slide.

The electrochemical cell was defined by placing a patterned 2 mm$^2$ thick sheet of polymerized polydimethylsiloxane (PDMS) to frame a ~12 mm circular area over the Au microband electrode. PDMS adheres well to glass surfaces and prevents leakage of solution, thereby defining the area of electrode that will be exposed to electrolyte solution. This defines a ~3000 $\mu$m$^2$ Au microband electrode. The PDMS well was filled with a 2 mg/mL solution of the dyad in CH$_2$Cl$_2$ containing 1 drop of ethanol and sonicated for 10 min. After sonication, the solution along with the well was removed from the slide. The slide was copiously rinsed with CH$_2$Cl$_2$ and dried in a stream of N$_2$. A fresh PDMS well was placed around the working, filled with electrolyte (CH$_2$Cl$_2$ containing 1.0 M Bu$_4$NPF$_6$), and the Ag counter and Pt reference electrodes were inserted into the solution. The potentials were measured vs. Ag/Ag$^+$; E$_{1/2}$(FeCp$_2$/FeCp$_2$$^+$)= 0.19 V. The scan rate was 100 Vs$^{-1}$.

The molecular area of each dyad SAM was determined by integrating the charge under an oxidation wave that corresponded to a one-electron event. The electrochemical surface area was evaluated by measuring the peak current resulting from the oxidation of 1 mM ferrocene and applying the Randle-Sevcik equation (Bard and Faulkner (1980) *Electrochemical Methods: Fundamentals and Applications*, Wiley, N.Y.). In this measurement, the SAM was first stripped from the surface by scanning to high potential; the solution and electrolyte were removed from the cell and the cell was rinsed. A solution containing the ferrocene was then added and a voltammogram recorded.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. An apparatus for storing data, said apparatus comprising:
   a fixed electrode electrically coupled to
   a storage medium having a plurality of different and distinguishable oxidation states wherein data is stored in said oxidation states by the addition or withdrawal of one or more electrons from said storage medium via the electrically coupled electrode;
   said storage medium comprising a storage molecule having a plurality of different and distinguishable oxidation states wherein said storage molecule comprises a first triple-decker sandwich coordination compound covalently linked to a second triple-decker sandwich coordination compound wherein the first compound and the second compound are different triple-decker sandwich coordination compounds;
   wherein said storage molecule comprises a triple-decker sandwich coordination compound having a formula selected from the group consisting of Por$^1$M$^1$Por$^2$M$^2$Por$^3$, Por$^1$M$^1$Pc$^1$M$^2$Por$^2$, Pc$^1$M$^1$Pc$^2$M$^2$Por$^1$, Pc$^1$M$^1$Pc$^2$M$^2$Pc$^3$, Pc$^{N1}$M$^1$Por$^1$M$^2$Por$^2$, and Pc$^1$M$^1$Por$^1$M$^2$Pc$^2$ wherein:
   M$^1$, and M$^2$ are the same or different and each is a metal;
   Por$^1$, Por$^2$, and Por$^3$ are the same or different and each is a porphyrinato species; and
   Pc$^1$, Pc$^2$, and Pc$^3$ are the same or different and each is a phthalocyaninato species.

2. The apparatus of claim 1, wherein M$^1$ and M$^2$, when present, are independently selected from metals of the lanthanide series.

3. The apparatus of claim 1, wherein said storage molecule has a vertical architecture.

4. The apparatus of claim 1, wherein said storage molecule has a horizontal architecture.

5. The apparatus of claim 4, wherein said storage molecule is covalently coupled to said electrode by at least two linkers.

6. The apparatus of claim 1, wherein said storage molecule comprises a triple-decker sandwich coordination compound having the formula:

wherein:

Por$^1$ and Por$^2$ are the same or different and are each a porphyrinato species;

Ln$^1$ and Ln$^2$ are the same or different and each is a lanthanide;

Pc¹ is a phthalocyaninato species; and said storage molecule has at least 8 different and distinguishable non-zero oxidation states.

7. The apparatus of claim 1, wherein said storage molecule comprises a triple-decker sandwich coordination compound having the formula:

Pc¹Ln¹Por¹Ln²Pc² wherein:

Por¹ is a porphyrinato species;

Ln¹ and Ln² are the same or different and each is a lanthanide;

Pc¹ and Pc² are the same or different and each is a phthalocyaninato species; and said storage molecule has at least 8 different and distinguishable non-zero oxidation states.

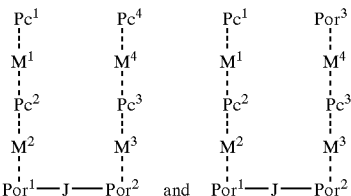

wherein $M^1$, $M^2$, $M^3$, and $M^4$ are metals independently selected from the lanthanide series or the actinide series;

$Por^1$, $Por^2$, $Por^3$ are the same or different and each is a porphyrinato species;

$Pc^1$, $Pc^2$, $Pc^3$, and $Pc^4$ are the same or different and are each phthalocyaninato species; and J is a covalent bond or a linker.

11. The apparatus of claim 10, wherein said storage molecule has a formula:

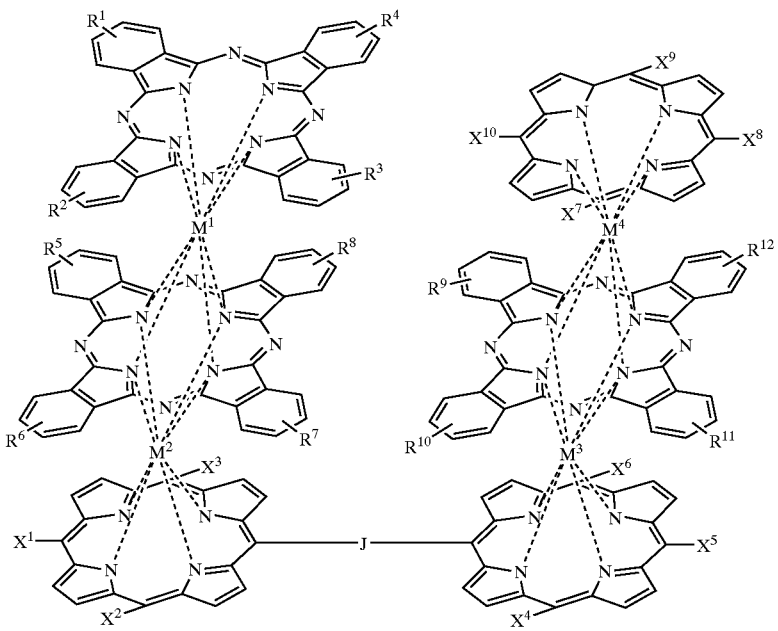

8. The apparatus of claim 1, wherein said storage molecule comprises a triple-decker sandwich coordination compound having the formula:

Pc¹Ln¹Pc²Ln²Por¹ wherein:

Por¹ is porphyrinato species;

Ln¹ and Ln² are the same or different and each is a lanthanide;

Pc¹ and Pc² are the same or different and each is a phthalocyaninato species; and said storage molecule has at least 8 different and distinguishable non-zero oxidation states.

9. The apparatus of any one of claims 1, 7, 8, wherein Ln is selected from the group consisting of Eu, and Ce.

10. The apparatus of claim 1, wherein said storage molecule has a formula selected from the group consisting of:

wherein: $R^1$, $R^2$, $R^3$, $R^4$, $R^5$, $R^6$, $R^7$, $R^8$, $R^9$, $R^{10}$, $R^{11}$, and $R^{12}$ are independently selected from the group consisting of a covalent bond, a linker, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl;

$X^1$, $X^2$, $X^3$, $X^4$, $X^5$, $X^6$, $X^7$, $X^8$, $X^9$, and $X^{10}$ are independently selected from the group consisting of a covalent bond, a linker, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl;

at least one R or X is a covalent bond or a linker;

J is a covalent bond or a linker; and $M^1$, $M^2$, $M^3$, and $M^4$ are independently selected metals from the lanthanide series.

12. The apparatus of claim 11, wherein $R^1$, $R^2$, $R^3$, $R^4$, $R^5$, $R^6$, $R^7$, $R^8$, $R^9$, $R^{10}$, $R^{11}$, and $R^{12}$ are independently selected from the group consisting of a linker, methyl, t-butyl, butoxy, fluoro, and H.

13. The apparatus of claim 11, wherein $X^1$, $X^2$, $X^3$, $X^4$, $X^5$, $X^6$, $X^7$, $X^8$, $X^9$, and $X^{10}$ are independently selected from the group consisting of a linker, 4-methylphenyl, 4-t-butylphenyl, 4-trifluoromethylphenyl, pentyl, and H.

14. The apparatus of claim 11, wherein $M^1$, $M^2$, and $M^4$ are the same.

15. The apparatus of claim 11, wherein $M^1$, $M^2$, and $M^4$ are Eu, and $M^3$ is Ce.

16. The apparatus of claim 11, wherein $R^1$, $R^2$, $R^3$, $R^4$, $R^5$, $R^6$, $R^7$, $R^8$, $R^9$, $R^{10}$, $R^{11}$, and $R^{12}$ are the same.

17. The apparatus of claim 11, wherein $X^5$ is a linker.

18. The apparatus of claim 11, wherein $X^3$ and $X^4$ are linkers.

19. The apparatus of claim 11, wherein $X^2$ and $X^4$ are linkers.

20. The apparatus of claim 11, wherein $X^1$, $X^2$, and $X^3$ are the same, and $X^5$ is a linker.

21. The apparatus of any one of claims 17 through 20, wherein said linker is selected from the goup consisting of 4-carboxyphenyl, 2-(4-carboxyphenyl)ethynyl, 4-(2-(4-carboxyphenyl)ethynyl)phenyl, 4-carboxymethylphenyl, 4-(2-(4-carboxymethylphenyl)ethynyl)phenyl, 4-hydroxyphenyl, 2-(4-hydroxyphenyl)ethynyl, 4-(2-(4-hydroxyphenyl)ethynyl)phenyl, 4-hydroxymethylphenyl, 4-(2-(4-hydroxymethylphenyl)ethynyl)phenyl, 4-mercaptophenyl, 2-(4-mercaptophenyl)ethynyl, 4-(2-(4-mercaptophenyl)ethynyl)phenyl, 4-mercaptomethylphenyl, 4-(2-(4-mercaptomethylphenyl)ethynyl)phenyl, 4-selenylphenyl, 2-(4-selenylphenyl)ethynyl, 4-selenylmethylphenyl, 4-(2-(4-selenylphenyl)ethynyl)phenyl, 4-tellurylphenyl, 2-(4-tellurylphenyl)ethynyl, 4-(2-(4-tellurylphenyl)ethynyl)phenyl, 4-tellurylmethylphenyl, and 4-(2-(4-tellurylmethylphenyl)ethynyl)phenyl.

22. The apparatus of claim 11, wherein J is a linker selected from the group consisting of 4,4'-diphenylethyne, 4,4'-diphenylbutadiyne, 4,4'-biphenyl, 1,4-phenylene, 4,4'-stilbene, 1,4-bicyclooctane, 4,4'-azobenzene, 4,4'-benzylideneaniline, and 4,4"-terphenyl.

23. The apparatus of claim 11, wherein said storage molecule has the formula of a dyad selected from the group consisting of dyad2, dyad3, dyad4, and dyad5.

24. The apparatus of claim 10, wherein said storage molecule has a formula:

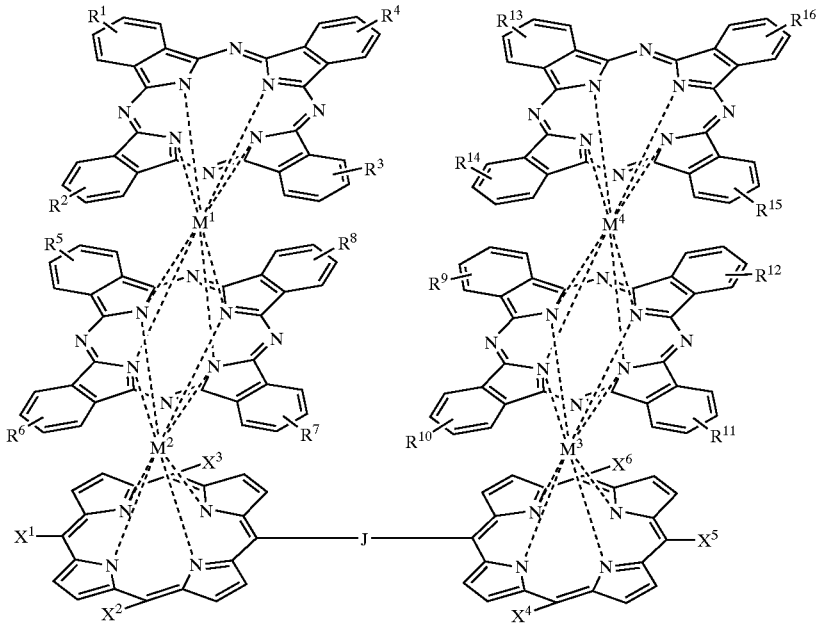

wherein:
$R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ are selected from the group consisting of a covalent bond, a linker, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, a and carbamoyl;

$X^1$, $X^2$, $X^3$, $X^4$, $X^5$, and $X^6$ are independently selected from the group consisting of a covalent bond, a linker, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl;

at least one R or X is a covalent bond or a linker;

J is a covalent bond or a linker; and $M^1$, $M^2$, $M^3$, and $M^4$ are independently selected metals from the lanthanide series.

25. The apparatus of claim 24, wherein $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ are independently selected from the group consisting of a linker, methyl, t-butyl, butoxy, fluoro, and H.

26. The apparatus of claim 24, wherein $X^1$, $X^2$, $X^3$, $X^4$, $X^5$, and $X^6$ are independently selected from the group consisting of a linker, 4-methylphenyl, 4-t-butylphenyl, 4-trifluoromethylphenyl, pentyl, and H.

27. The apparatus of claim 24, wherein $M^1$, $M^2$, and $M^4$ are the same.

28. The apparatus of claim 24, wherein $M^1$, $M^2$, and $M^4$ are Eu, and $M^3$ Ce.

29. The apparatus of claim 24, wherein $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ are the same.

30. The apparatus of claim 24, wherein $X^5$ a linker.

31. The apparatus of claim 24, wherein $X^3$ and $X^4$ are linkers.

32. The apparatus of claim 24, wherein $X^3$ and $X^4$ are linkers.

33. The apparatus of claim 24, wherein $X^1$, $X^2$, and $X^3$ are the same, and $X^5$ is a linker.

34. The apparatus of any one of claims 30 through 33, wherein said linker is selected from the goup consisting of 4-carboxyphenyl, 2-(4-carboxyphenyl)ethynyl, 4-(2-(4-carboxyphenyl)ethynyl)phenyl, 4-carboxymethylphenyl, 4-(2-(4-carboxymethylphenyl)ethynyl)phenyl, 4-hydroxyphenyl, 2-(4-hydroxyphenyl)ethynyl, 4-(2-(4-hydroxyphenyl)ethynyl)phenyl, 4-hydroxymethylphenyl, 4-(2-(4-hydroxymethylphenyl)ethynyl)phenyl, 4-mercaptophenyl, 2-(4-mercaptophenyl)ethynyl, 4-(2-(4-mercaptophenyl)ethynyl)phenyl, 4-mercaptomethylphenyl, 4-(2-(4-mercaptomethylphenyl)ethynyl)phenyl, 4-selenylphenyl, 2-(4-selenylphenyl)ethynyl, 4-selenylmethylphenyl, 4-selenylmethylphenyl, 4-(2-(4-selenylphenyl)ethynyl)phenyl, 4-tellurylphenyl, 2-(4-tellurylphenyl)ethynyl, 4-(2-(4-tellurylphenyl)ethynyl)phenyl, 4-tellurylmethylphenyl, and 4-(2-(4-tellurylmethylphenyl)ethynyl)phenyl.

35. The apparatus of claim 24, wherein J is a linker selected from the group consisting of 4,4'-diphenylethyne, 4,4'-diphenylbutadiyne, 4,4'-biphenyl, 1,4-phenylene, 4,4'-stilbene, 1,4-bicyclooctane, 4,4'-azobenzene, 4,4'-benzylideneaniline, and 4,4"-terphenyl.

36. The apparatus of claim 24, wherein said storage molecule has the formula of dyad1.

37. The apparatus of claim 1, wherein said storage medium has a memory storage density of at least about 10 gigabits per cm$^2$ in a sheet-like device.

38. The apparatus of claim 1, wherein said storage medium is covalently linked to said electrode.

39. The apparatus of claim 1, wherein said storage molecule is covalently linked to said electrode by a thiol linker.

40. The apparatus of claim 1, wherein said storage molecule is covalently linked to said electrode by a linker wherein the coupling to the electrode has the form:

E—L— where E is the electrode and L, before attachment to the electrode is a linker selected from the group consisting of 4-carboxyphenyl, 2-(4-carboxyphenyl)ethynyl, 4-(2-(4-carboxyphenyl)ethynyl)phenyl, 4-carboxymethylphenyl, 4-(2-(4-carboxymethylphenyl)ethynyl)phenyl, 4-hydroxyphenyl, 2-(4-hydroxyphenyl)ethynyl, 4-(2-(4-hydroxyphenyl)ethynyl)phenyl, 4-hydroxymethylphenyl, 4-(2-(4-hydroxymethylphenyl)ethynyl)phenyl, 4-mercaptophenyl, 2-(4-mercaptophenyl)ethynyl, 4-(2-(4-mercaptophenyl)ethynyl)phenyl, 4-mercaptomethylphenyl, 4-(2-(4-mercaptomethylphenyl)ethynyl)phenyl, 4-selenylphenyl, 2-(4-selenylphenyl)ethynyl, 4-selenylmethylphenyl, 4-(2-(4-selenylphenyl)ethynyl)phenyl, 4-tellurylphenyl, 2-(4-tellurylphenyl)ethynyl, 4-(2-(4-tellurylphenyl)ethynyl)phenyl, 4-tellurylmethylphenyl, and 4-(2-(4-tellurylmethylphenyl)ethynyl)phenyl.

41. The apparatus of claim 1, wherein said storage molecule is juxtaposed in the proximity of said electrode such that electrons can pass from said storage molecule to said electrode.

42. The apparatus of claim 1, wherein said storage medium is juxtaposed to a dielectric material embedded with counterions.

43. The apparatus of claim 1, wherein said storage medium and said electrode are fully encapsulated in an integrated circuit.

44. The apparatus of claim 1, wherein said storage medium is electronically coupled to a second electrode that is a reference electrode.

45. The apparatus of claim 1, wherein said storage medium is present on a single plane in said device.

46. The apparatus of claim 1, wherein said storage medium is present at a multiplicity of storage locations.

47. The apparatus of claim 1, wherein said apparatus comprises multiple planes and said storage locations are present on multiple planes of said apparatus.

48. The apparatus of claim 47, wherein said storage locations range from about 1024 to about 4096 different locations.

49. The apparatus of claim 47, wherein each location is addressed by a single electrode.

50. The apparatus of claim 47, wherein each location is addressed by at least two electrodes.

51. The apparatus of claim 1, wherein said electrode is connected to a voltage source.

52. The apparatus of claim 51, wherein said voltage source is the output of an integrated circuit.

53. The apparatus of claim 1, wherein said electrode is connected to a device to read the oxidation state of said storage medium.

54. The apparatus of claim 53, wherein said device is selected from the group consisting of a voltammetric device, an amperometric device, and a potentiometric device.

55. The apparatus of claim 54, wherein said device is a sinusoidal voltammeter.

56. The apparatus of claim 53, wherein said device provides a Fourier transform of the output signal from said electrode.

57. The apparatus of claim 53, wherein said device refreshes the oxidation state of said storage medium after reading said oxidation state.

58. The apparatus of claim 1, wherein said different and distinguishable oxidation states of said storage medium can be set by a voltage difference no greater than about 2 volts.

59. A method of storing data, said method comprising:

(i) providing an apparatus according to claim 1; and (ii) applying a voltage to said electrode at sufficient current to set an oxidation state of said storage medium.

60. The method of claim 59, wherein said voltage ranges up to about 2 volts.

61. The method of claim 59, wherein said voltage is the output of an integrated circuit.

62. The method of claim 59, further comprising detecting the oxidation state of said storage medium and thereby reading out the data stored therein.

63. The method of claim 62, wherein said detecting the oxidation state of the storage medium further comprises refreshing the oxidation state of the storage medium.

64. The method of claim 62, wherein said detecting comprises analyzing a readout signal in the time domain.

65. The method of claim 62, wherein said detecting comprises analyzing a readout signal in the frequency domain.

66. The method of claim 62, wherein said detecting comprises performing a Fourier transform on said readout signal.

67. The method of claim 62, wherein said detecting utilizes a voltammetric method.

68. A porphyrin half-sandwich complex comprising a cis-A2BC porphyrin complexed with a metal.

69. In a computer system, a memory device, said memory device comprising the apparatus of claim 1.

70. A computer system comprising a central processing unit, a display, a selector device, and a memory device, said memory device comprising the apparatus of claim 1.

71. A method of making a triple-decker sandwich, said method comprising:
providing a metal-porphyrin half-sandwich complex comprising a cis-A$_2$BC type porphyrin complexed with a metal or an ABCD type porphyrin complexed with a metal; and
reacting said half-sandwich complex with a double-decker sandwich complex to form a triple-decker sandwich.

72. The method of claim 71, wherein said porphyrin is a cis-A2BC type porphyrin.

73. The method of claim 71, wherein said porphyrin has the formula:

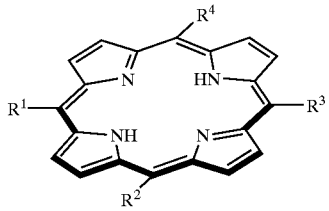

wherein R$^1$, R$^2$, R$^3$, and R$^4$ are independently selected from the group consisting of p-tolyl, n-pentyl, 4-bromophenyl, 4-iodophenyl, trimetbylsilylethynyl, bromo, iodo, 1,3,2-dioxaborolan-2-yl, 4-(1,3,2-dioxaborolan-2-yl)phenyl, 4-(2-trimethylsilylethynyl)phenyl, 4-formylphenyl, 4-aminophenyl, and 4-iodobicyclo[2.2.2]octan-1-yl.

74. The method of claim 71 wherein said double decker sandwich complex is selected from the group consisting of Por-M-Pc and Pc-M-Pc.

75. An information storage medium, said storage medium comprising a storage molecule having at least eight different and distinguishable non-zero oxidation states wherein said storage molecule has a formula selected from the group consisting of:

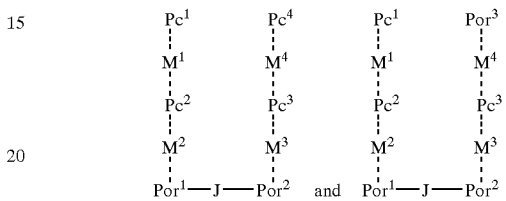

wherein

M$^1$, M$^2$, M$^3$, and M$^4$ are metals independently selected from the lanthanide series or the actinide series;

Por$^1$, Por$^2$, Por$^3$, and Por$^4$ are are the same or different and each is a porphyrinato species;

Pc$^1$, Pc$^2$, Pc$^3$, and Pc$^4$ are the same or different and are each phthalocyaninatol; and J is a covalent bond or a linker.

76. The storage medium of claim 75, wherein said storage molecule has a formula:

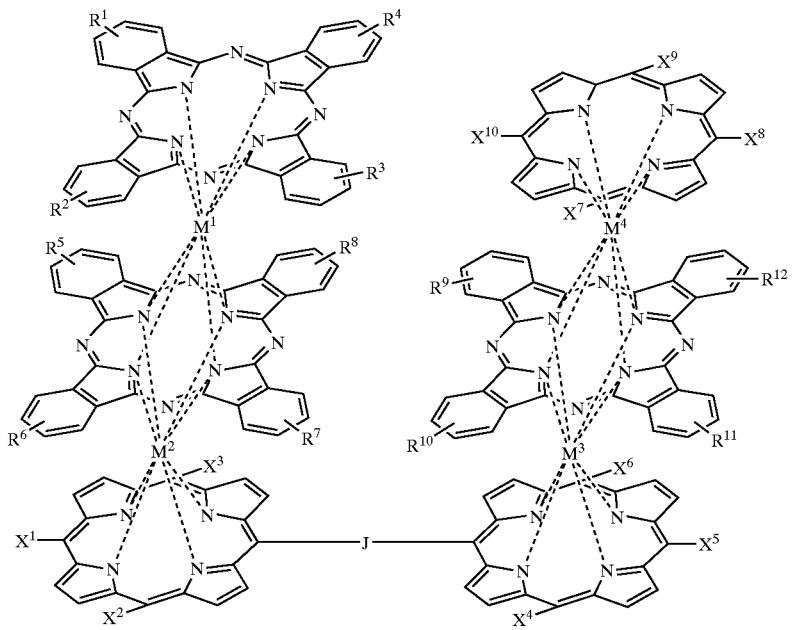

wherein:
R$^1$, R$^2$, R$^3$, R$^4$, R$^5$, R$^6$, R$^7$, R$^8$, R$^9$, R$^{10}$, R$^{11}$, and R$^{12}$ are independently selected from the group consisting of a covalent bond, a linker, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl;

X$^1$, X$^2$, X$^3$, X$^4$, X$^5$, X$^6$, X$^7$, X$^8$, X$^9$, and X$^{10}$ are independently selected from the group consisting of a covalent bond, a linker, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl;

at least one R or X is a covalent bond or a linker;

J is a covalent bond or a linker, and

M$^1$, M$^2$, M$^3$, and M$^4$ are independently selected metals from the lanthanide series.

77. The storage medium of claim 76, wherein R1, R2, R3, R4, R5, R6, R7, R8, R9, R10, R11, and R12 are independently selected from the group consisting of a linker, methyl, t-butyl, butoxy, fluoro, and H.

78. The storage medium of claim 76, wherein X$^1$, X$^2$, X$^3$, X$^4$, X$^5$, X$^6$, X$^7$, X$^8$, X$^9$, and X$^{10}$ are independently selected from the group consisting of a linker, 4-methylphenyl, 4-t-butylphenyl, 4-trifluoromethylphenyl, pentyl, and H.

79. The storage medium of claim 76, wherein M$^1$, M$^2$, and M$^4$ are the same.

80. The storage medium of claim 76, wherein M$^1$, M$^2$, and M$^4$ are Eu, and M$^3$ is Ce.

81. The storage medium of claim 76, wherein R$^1$, R$^2$, R$^3$, R$^4$, R$^5$, R$^6$, R$^7$, R$^8$, R$^9$, R$^{10}$, R$^{11}$, and R$^{12}$ are the same.

82. The storage medium of claim 76, wherein X$^5$ a linker.

83. The storage medium of claim 76, wherein X$^3$ and X$^4$ are linkers.

84. The storage medium of claim 76, wherein X$^2$ and X$^4$ are linkers.

85. The storage medium of claim 76, wherein X$^1$, X$^2$, and X$^3$ are the same, and X$^5$ is a linker.

86. The storage medium of claim 76, wherein J is a linker selected from the group consisting of 4,4'-diphenylethyne, 4,4'-diphenylbutadiyne, 4,4'-biphenyl, 1,4-phenylene, 4,4'-stilbene, 1,4-bicyclooctane, 4,4'-azobenzene, 4,4'-benzylideneaniline, and 4,4"-terphenyl.

87. The storage medium of claim 76, wherein said storage molecule has the formula of a dyad selected from the group consisting of dyad2, dyad3, dyad4, and dyad5.

88. The storage medium of claim 76, wherein said storage molecule has a formula:

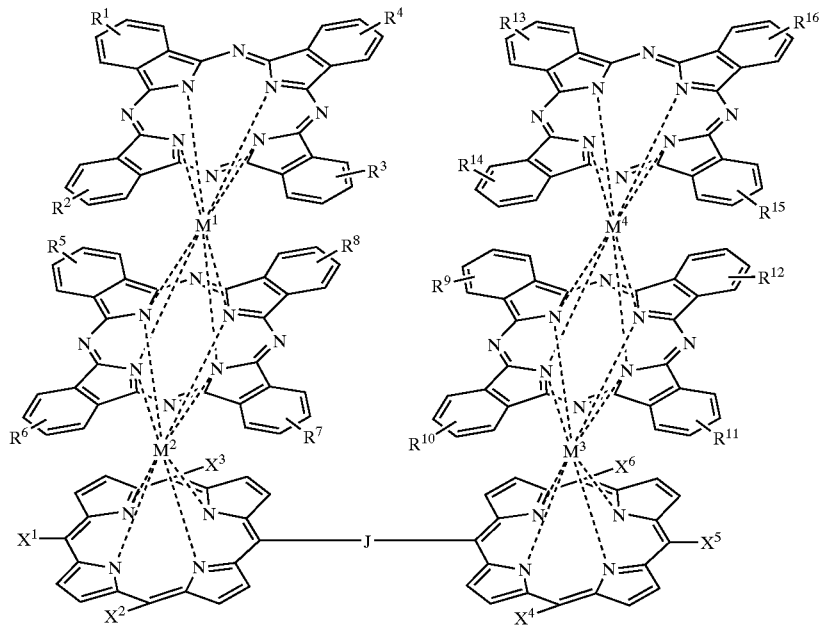

wherein:
R$^1$, R$^2$, R$^3$, R$^4$, R$^5$, R$^6$, R$^7$, R$^8$, R$^9$, R$^{10}$, R$^{11}$, R$^{12}$, R$^{13}$, R$^{14}$, R$^{15}$, and R$^{16}$ are selected from the group consisting of a covalent bond, a linker, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, a and carbamoyl;

X$^1$, X$^2$, X$^3$, X$^4$, X$^5$, and X$^6$ are independently selected from the group consisting of a covalent bond, a linker, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl;

at least one R or X is a covalent bond or a linker;

J is a covalent bond or a linker; and

M$^1$, M$^2$, M$^3$, and M$^4$ are independently selected metals from the lanthanide series.

89. The storage medium of claim 88, wherein R$^1$, R$^2$, R$^3$, R$^4$, R$^5$, R$^6$, R$^7$, R$^8$, R$^9$, R$^{10}$, R$^{11}$, R$^{12}$, R$^{13}$, R$^{14}$, R$^{15}$, and R$^{16}$ are independently selected from the group consisting of a linker, methyl, t-butyl, butoxy, fluoro, and H.

90. The storage medium of claim 88, wherein X$^1$, X$^2$, X$^3$, X$^4$, X$^5$, and X$^6$ are independently selected from the group consisting of a linker, 4-methylphenyl, 4-t-butylphenyl, 4-trifluoromethylphenyl, pentyl, and H.

91. The storage medium of claim 88, wherein M$^1$, M$^2$, and M$^4$ are the same.

92. The storage medium of claim 88, wherein $M^1$, $M^2$, and $M^4$ are Eu, and $M^3$ is Ce.

93. The storage medium of claim 88, wherein $R^1$, $R^2$, $R^3$, $R^4$, $R^5$, $R^6$, $R^7$, $R^8$, $R^9$, $R^{10}$, $R^{11}$, $R^{12}$ $R^{13}$, $R^{14}$, $R^{15}$, and $R^{16}$ are the same.

94. The storage medium of claim 88, wherein $X^5$ is a linker.

95. The storage medium of claim 88, wherein $X^3$ and $X^4$ are linkers.

96. The storage medium of claim 88, wherein $X^2$ and $X^4$ are linkers.

97. The storage medium of claim 88, wherein $X^1$, $X^2$, and $X^3$ are the same, and $X^5$ is a linker.

98. The storage medium of claim 88, wherein J is a linker selected from the group consisting of 4,4'-diphenylethyne, 4,4'-diphenylbutadiyne, 4,4'-biphenyl, 1,4-phenylene, 4,4'-stilbene, 1,4-bicyclooctane, 4,4'-azobenzene, 4,4'-benzylideneaniline, and 4,4"-terphenyl.

99. The storage medium of claim 88, wherein said storage molecule has the formula of dyad1.

\* \* \* \* \*